US008295499B2

(12) United States Patent
Shirakawa et al.

(10) Patent No.: US 8,295,499 B2
(45) Date of Patent: Oct. 23, 2012

(54) AUDIO INFORMATION PROCESSING AND ATTACK DETECTION APPARATUS AND METHOD

(75) Inventors: Miyuki Shirakawa, Fukuoka (JP); Masanao Suzuki, Kawasaki (JP); Yoshiteru Tsuchinaga, Fukuoka (JP)

(73) Assignee: Fujitsu Limited, Kawasaki (JP)

(*) Notice: Subject to any disclaimer, the term of this patent is extended or adjusted under 35 U.S.C. 154(b) by 222 days.

(21) Appl. No.: 12/823,616

(22) Filed: Jun. 25, 2010

(65) Prior Publication Data

US 2010/0329470 A1 Dec. 30, 2010

(30) Foreign Application Priority Data

Jun. 29, 2009 (JP) ................................ 2009-153241

(51) Int. Cl.

*H04R 29/00* (2006.01)
*H04B 15/00* (2006.01)
*H03G 7/00* (2006.01)
*G06F 17/00* (2006.01)
*G10L 19/00* (2006.01)

(52) U.S. Cl. ......... 381/56; 381/94.5; 381/106; 381/107; 700/94; 704/500; 704/501

(58) Field of Classification Search .................... 381/56, 381/107, 71.12, 94.5, 106; 704/500, 501; 700/94

See application file for complete search history.

(56) References Cited

U.S. PATENT DOCUMENTS

2008/0154589 A1* 6/2008 Tsuchinaga et al. .......... 704/230

FOREIGN PATENT DOCUMENTS

JP 2000-259197 9/2000
JP 2006-126372 5/2006

* cited by examiner

*Primary Examiner* — Xu Mei
*Assistant Examiner* — Douglas Suthers
(74) *Attorney, Agent, or Firm* — Staas & Halsey LLP

(57) ABSTRACT

An audio information processing apparatus and method include dividing an audio signal, determining a time period having a power change ratio of an audio signal larger than a first threshold value as an attack candidate, searching the time period of the attack candidate and a time period immediately before the time period of the attack candidate for an attack starting point, correcting a power of an audio signal included in the time period, and determining whether a power change ratio of the audio signal included in the time period is larger than a second threshold value for attack detection which is larger than the first threshold value.

13 Claims, 29 Drawing Sheets

AUDIO INFORMATION PROCESSING AND ATTACK DETECTION APPARATUS AND METHOD

CROSS-REFERENCE TO RELATED APPLICATIONS

This application is based upon and claims the benefit of priority of the prior Japanese Patent Application No. 2009-153241, filed on Jun. 29, 2009, the entire contents of which are incorporated herein by reference.

FIELD

Various embodiments described herein relate to an information processing apparatus which detects an attack included in an audio signal.

BACKGROUND

Generally, in order to reduce an amount of information of an audio signal converted into a digital signal, an encoding processing is performed on the audio signal. Examples of an audio encoding method include MPEG-2 AAC (Moving Picture Experts Group-2/4 Advanced Audio Coding), MPEG-4 AAC, MPEG-2 HE-AAC (High Efficiency-AAC), MPEG-4 HE-AAC, MPEG2 HE-AAC-version2, MPEG Surround, and MPEG-4 BSAC (Bit Sliced Arithmetic Coding).

In the audio encoding method such as the MPEG-2 AAC, an audio signal in a time domain is converted into an audio signal in a frequency domain, the audio signal in the frequency domain is quantized, and the quantized audio signal is encoded whereby a bit stream is generated. An error (quantization error) caused by the quantization of the audio signal in the frequency domain causes noise when the audio signal is decoded and reproduced resulting in deterioration of audio quality.

Especially, when the audio signal is abruptly changed due to a generation of large sound, for example, a quantization error generated in a portion in which the abrupt change occurs affects entire blocks which have been subjected to the quantization resulting in a generation of noise.

Human beings have a hearing characteristic in which it is difficult to catch sound immediately before and immediately after large sound is generated. This hearing characteristic is referred to as a "masking effect". Although a period of time in which sound is not caught after large sound is generated varies among different individuals, it is approximately 100 milliseconds. On the other hand, a period of time in which the masking effect remains before the large sound is generated is small, e.g., approximately five to six milliseconds. Therefore, noise generated before the large sound is generated is likely to be detected since the period of time in which the masking effect remains is small. A phenomenon in which noise is generated before large sound is generated is referred to as a "pre-echo".

In general, in the MPEG-2 AAC, encoding and decoding are performed with a conversion block length of 1024 samples. For example, in a case of a sampling frequency of 48 kHz, a time length of a conversion block is approximately 21 milliseconds obtained in accordance with the following expression: 1/48000×1024. That is, the time length is smaller than the period of time in which the masking effect remains after large sound is generated, i.e., approximately 100 milliseconds. Since influence of the quantization error caused by an abrupt change of the audio signal is trapped in the conversion block, when the encoding is performed using the block length of 1024 samples, the noise caused by the quantization error is not detected by human beings due to the masking effect, which is tolerated.

However, since the period of time in which the masking effect remains before the large sound is generated is small, i.e., approximately five to six milliseconds, when the encoding is performed with the conversion block length of 1024 samples, the period of time in which noise caused by the quantization error is generated before the large sound is generated may be larger than the period of time in which the masking effect remains. If the period of time in which noise caused by the quantization error is generated before the large sound is generated is larger than the period of time in which the masking effect remains, the human beings detect the pre-echo.

In the audio encoding method, a generation of the pre-echo is prevented by detecting an abrupt change of an input signal and making the conversion block length smaller.

For example, in the MPEG-2 AAC, when an abrupt change of an audio signal caused by large sound is not included in a frame, encoding is performed with a conversion block length of 1024 samples. A block having a conversion block length of 1024 samples is referred to as a "long block". Furthermore, when an abrupt change of an audio signal caused by large sound is included in a frame, encoding is performed with a conversion block length of 128 samples. A block having a conversion block length of 128 samples is referred to as a "short block".

When the audio signal is encoded in a unit of a short block, the influence of the quantization error caused by the abrupt change is trapped in the short block. In the case of a sampling frequency of 48 kHz, a time length of the short block is approximately 2.7 milliseconds obtained in accordance with the following expression: 1/48000×128. The time length of the short block is smaller than the period of time in which the masking effect remains before the audio signal is abruptly changed, i.e., approximately five to six milliseconds. Therefore, when the frame includes the abrupt change of the audio signal, the influence of the quantization error can be trapped within the period of time in which the masking effect remains by performing the encoding in a unit of a short block. Accordingly, noise detected by the human beings is negligible, and consequently, the pre-echo is not generated.

Such a quantization performed in a unit of a short block when the audio signal is abruptly changed is employed, in addition to the MPEG-2 AAC, in the MPEG-4 AAC, the MPEG-2 HE-AAC, the MPEG-4 HE-AAC, the MPEG2 HE-AAC-version2, the MPEG Surround, and the MPEG-4 BSAC.

Furthermore, in the audio encoding method in which the block length is changed as described above, a plurality of consecutive short blocks included in a frame are grouped so that the group is used as a unit of encoding. When the plurality of short blocks are grouped, auxiliary information on audio signals is shared. Accordingly, when compared with a case where audio signals included in short blocks are encoded for individual short blocks, an amount of the auxiliary information included in one frame is reduced.

When an abrupt change of an audio signal is detected in an audio frame, short blocks are grouped using the abrupt change as a reference. The abrupt change of an audio signal is referred to as an "attack" hereinafter.

SUMMARY

According to an aspect of the invention, an audio information processing apparatus includes, a dividing unit configured to divide an audio signal in a unit time into audio signals in a predetermined number of time periods, a determining unit configured to determine, among the time periods, a time period having a power change ratio of an audio signal larger than a first threshold value as an attack candidate, a searching unit configured to search the time period of the attack candidate and a time period immediately before the time period of the attack candidate for an attack starting point, a correcting unit configured to correct a power of an audio signal included in the time period including the attack starting point resulting from the search using a power of an audio signal included in a time period immediately after the time period including the attack starting point, and a determining unit configured to determine whether a power change ratio of the audio signal included in the time period which includes the attack starting point and in which the power of the audio signal is corrected by the correcting unit is larger than a second threshold value for attack detection which is larger than the first threshold value.

An object and advantages of the invention will be realized and attained by means of the elements and combinations particularly pointed out in the claims.

It is to be understood that both the foregoing general description and the following detailed description are exemplary and explanatory and are not restrictive of the invention, as claimed. Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
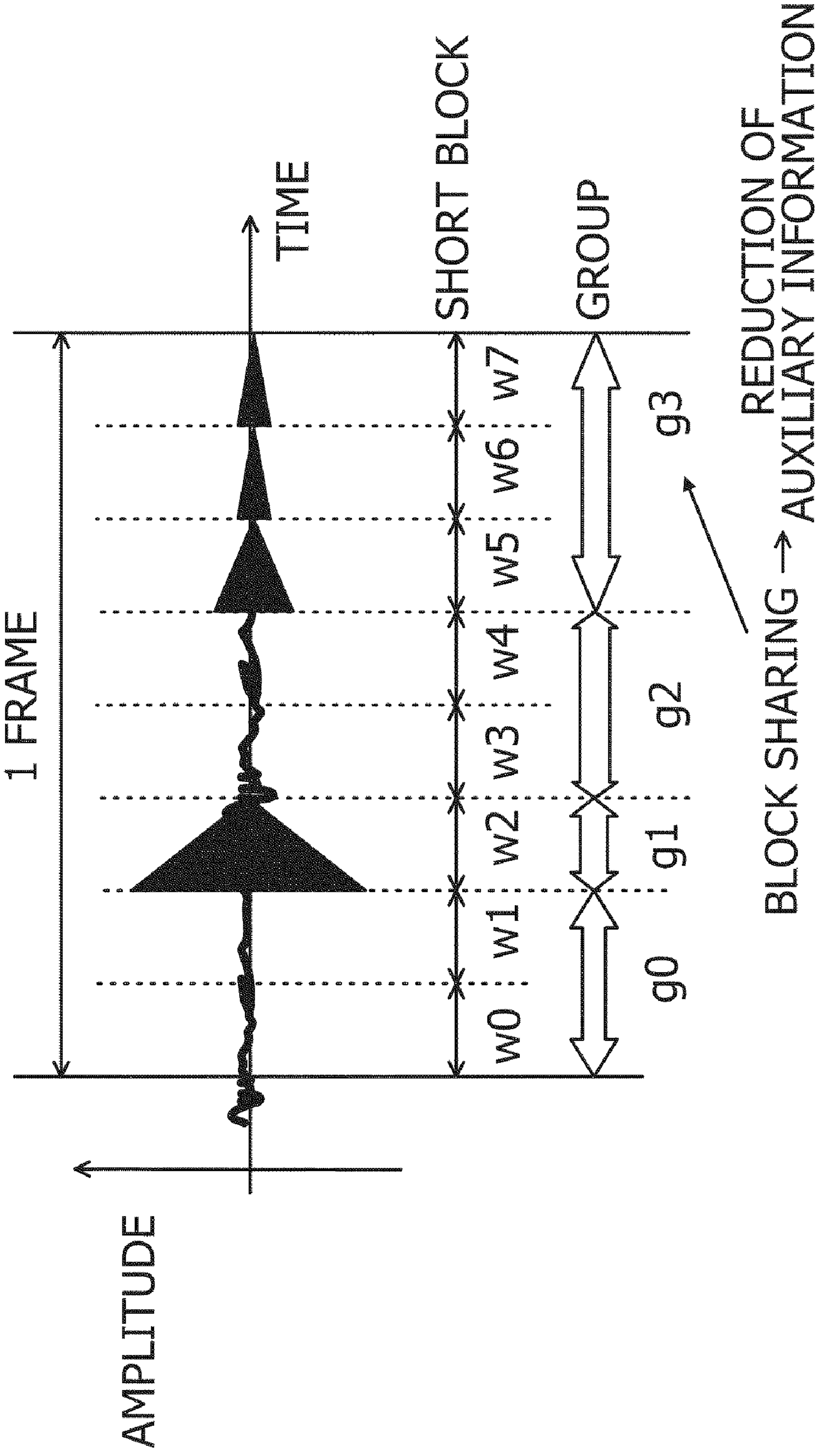
FIG. 1 is a diagram illustrating an example of a grouping of short blocks.

Reference will now be made in detail to the embodiments, examples of which are illustrated in the accompanying drawings, wherein like reference numerals refer to the like elements throughout. The embodiments are described below to explain the present invention by referring to the figures.

Embodiments of the present invention will be described hereinafter with reference to the accompanying drawings. Configurations of the embodiments below are merely examples, and the present invention is not limited to these configurations of the embodiments.

In descriptions of embodiments below, the MPEG-2 AAC is used as an example of an audio-signal encoding method. Note that an audio-signal encoding method for dividing one frame such as a short block employed in AAC into a plurality of sub-blocks and grouping the plurality of sub-blocks as a plurality of types of blocks having different sizes may be employed as the audio encoding method described in the embodiments. However, no limitation is intended by the encoding method described herein which is provided as an example.

FIG. 1 is a diagram illustrating an example of a grouping of short blocks. In FIG. 1, a waveform of an audio signal converted through PCM (Pulse Code Modulation) is schematically shown. In the example shown in FIG. 1, a frame includes eight short blocks w0 to w7.

In the example shown in FIG. 1, the consecutive short blocks w0 and w1 are grouped as a group g0. The short block w2 constitutes a group g1. The consecutive short blocks w3 and w4 are grouped as a group g2. The consecutive short blocks w5 to w7 are grouped as a group g3. Frequency spectra of audio signals included in the generated groups g0, g1, g2, and g3 are individually quantized.

As described above, in the grouping, one or more consecutive short blocks included in one frame is grouped. Since auxiliary information is shared by the short blocks included in the same group by the grouping of the short blocks, an amount of auxiliary information in the entire frame is reduced. Furthermore, when encoding is performed for individual groups, a period of time required for the encoding and load are reduced and excellent efficiency is attained when compared with a case where the encoding is performed for individual short blocks.

In the example shown in FIG. 1, amplitude of the audio signal included in the short block w2 is abruptly changed. Such an abrupt change of amplitude of an audio signal is caused by sudden large sound. The abrupt change of an audio signal is referred to as an "attack". That is, the short block w2 includes an attack.

When an attack is included in an audio frame, first, the attack is detected, and then, a grouping boundary is set between a short block including the attack and a short block immediately before the short block including the attack. However, when the attack is included in a plurality of consecutive short blocks and especially when a starting point of a change of an audio signal is included in a portion near a block boundary between two short blocks, it is likely that the attack is not detected.

Figure 2:
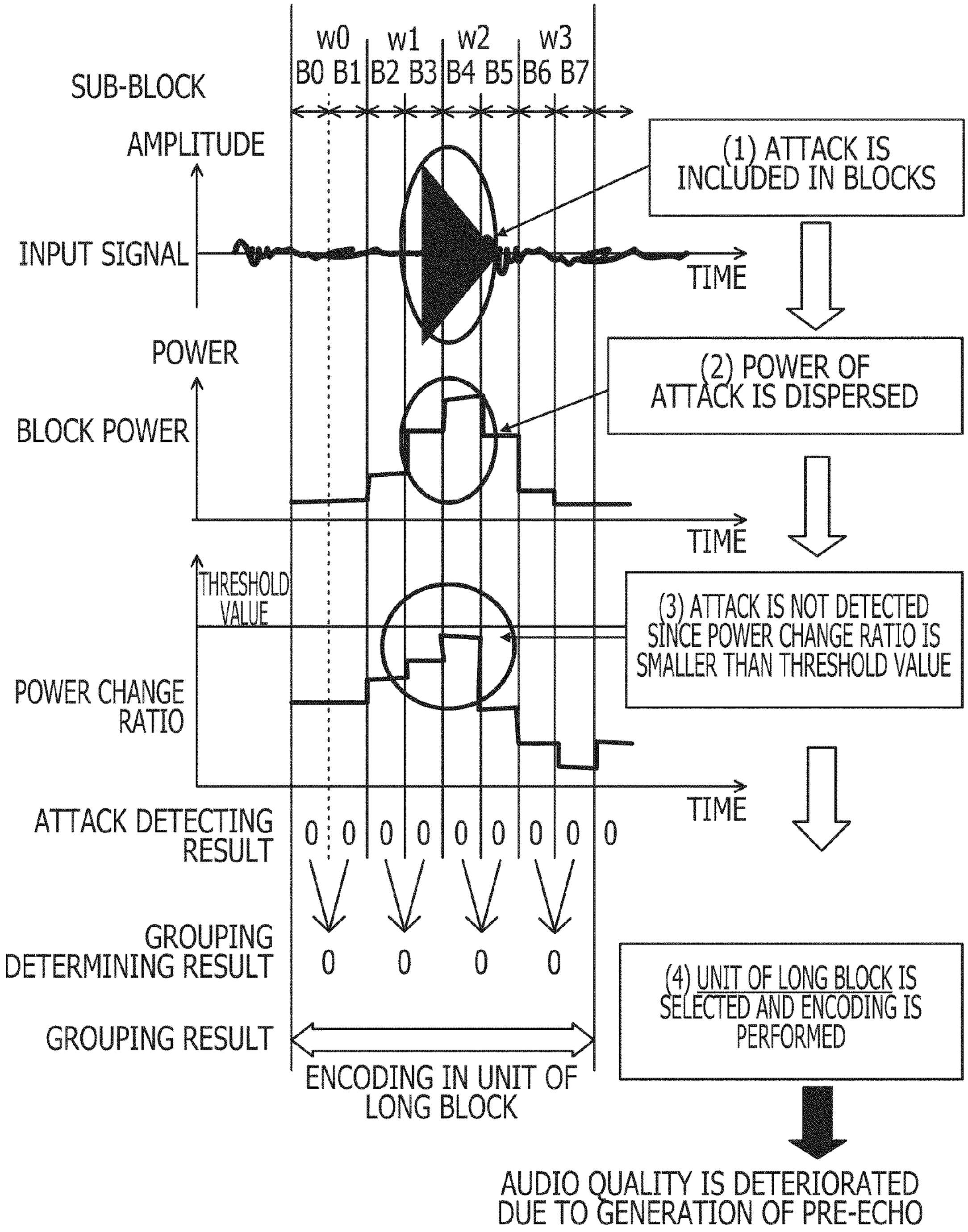
FIG. 2 is a diagram illustrating an example of a grouping when an attack is included in a plurality of consecutive short blocks.

FIG. 2 is a diagram illustrating an example of a grouping when an attack is included in a plurality of consecutive short blocks. In the example shown in FIG. 2, for simplicity of description, one frame is divided into four short blocks. Furthermore, the frame is divided into sub-blocks B0 to B7 having time lengths smaller than those of the short blocks. The sub-blocks are units of an attack detecting process. In the example shown in FIG. 2, the frame includes short blocks w0 to w3, and each of the short blocks w0 to w3 includes two sub-blocks. The short block w0 includes sub-blocks B0 and B1. The short block w1 includes sub-blocks B2 and B3. The short block w2 includes sub-blocks B4 and B5. The short block w3 includes sub-blocks B6 and B7.

In the example shown in FIG. 2, an attack of an input audio signal is included in the consecutive sub-blocks B3 to B5. In the example shown in FIG. 2, a starting point of an abrupt change of the audio signal, that is, an attack starting point is positioned near a block boundary between the sub-blocks B3 and B4. In the example shown in FIG. 2, a grouping of the short blocks is performed in accordance with a procedure described below, for example.

(1) In the input audio signal of the example shown in FIG. 2, the attack starting point is included in the sub-block B3, and the attack is included in the consecutive sub-blocks B3 to B5. That is, the attack is included in the consecutive short blocks w1 and w2.

(2) In the example shown in FIG. 2, when a grouping of the short blocks is to be performed, first, powers of audio signals included in the sub-blocks B0 to B7 are obtained. In the example shown in FIG. 2, since the attack is included in the consecutive sub-blocks B3 to B5, a power of the attack disperses to the sub-blocks B3 to B5.

(3) In the example shown in FIG. 2, after the powers are obtained for individual sub-blocks, power change ratios are obtained by comparing the currently-obtained powers of the sub-blocks with previously-obtained powers of the sub-blocks. In a case where one of the sub-blocks includes a power change ratio larger than a threshold value for attack detection, it is determined that the sub-block includes an attack. A result of the attack detection performed on a sub-block which does not include any attack represents "0". A result of the attack detection performed on a sub-block which includes an attack represents "1".

In the example shown in FIG. 2, the obtained power change ratios of the input audio signals, that is, the power change ratios of the sub-blocks B3 to B5, do not reach the threshold value for the attack detection since the power of the attack is dispersed to the sub-block B3 to B5. Therefore, any attack is not detected, and results of attack detections performed on the sub-block B0 to B7 represent "0".

(4) Results of grouping determination performed on the short blocks are obtained as logic sums of the results of the attack detection performed on the sub-blocks included in the short blocks. A starting point of a short block having a result of the grouping determination of "1" corresponds to a boundary between groups. However, in the example shown in FIG. 2, the attack detection results of all the sub-blocks represent "0", and the grouping determining results of all the short blocks represent "0". Then, a long block is selected as a unit of a grouping.

As shown in the example of FIG. 2, when an audio signal including an attack is encoded in a unit of a long block having a long time length, a period of time before an attack is generated in a frame becomes larger than a period of time in which a masking effect remains. Accordingly, a pre-echo is generated. In the example shown in FIG. 2, since the attack is not appropriately detected, the pre-echo may occur.

An audio encoding apparatus according to an embodiment encodes an audio signal using the MPEG-2 AAC. The audio encoding apparatus performs a detection of an attack and a grouping in accordance with a result of the detection of an attack, before performing encoding in a unit of a group. The audio encoding apparatus first detects a candidate sub-block which is likely to include an attack before the detection of an attack in order to enhance an accuracy of the detection of an attack and appropriately perform the grouping. The audio encoding apparatus corrects a power of the detected candidate sub-block and obtains a power change ratio in accordance with the corrected power before detecting an attack. The audio encoding apparatus determines a boundary between groups in accordance with a result of the detection of an attack. Time lengths of the sub-blocks may be arbitrarily set. In an embodiment, the sub-blocks have time lengths the same as those of the short blocks.

Figure 3:
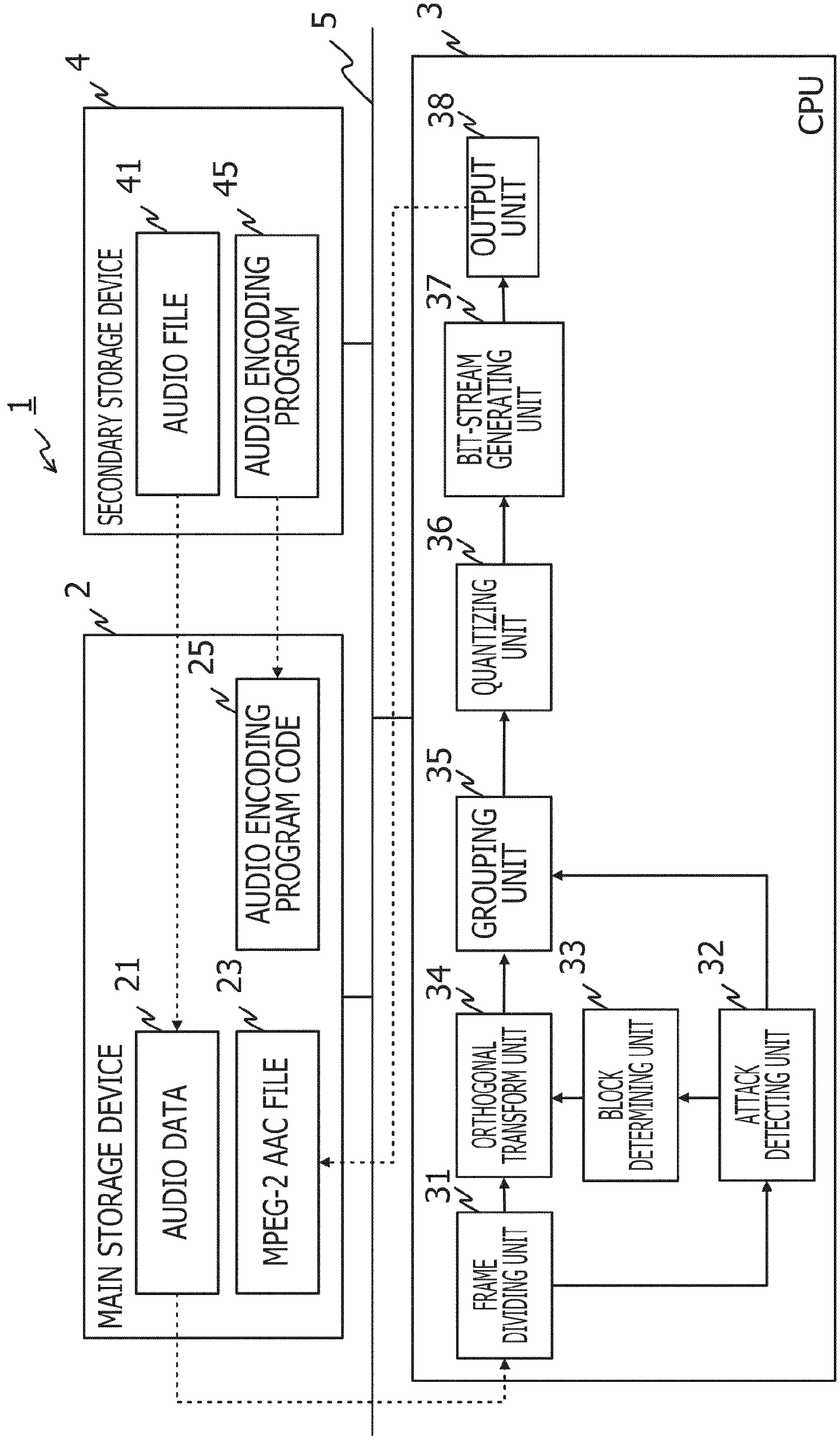
FIG. 3 is a diagram illustrating a configuration example of an audio encoding apparatus.

FIG. 3 is a diagram illustrating a configuration example of an audio encoding apparatus according to an embodiment. An audio encoding apparatus 1 includes a main storage device 2, a CPU 3, and a secondary storage device 4. As shown in FIG. 3, the main storage device 2, the CPU 3 and the secondary storage device 4 may be connected to each other via a bus 5.

The secondary storage device 4 stores an audio file 41 and an audio encoding program 45. The audio file 41 is generated by performing analog-to-digital conversion on an audio signal through PCM (Pulse Code Modulation), for example. Hereinafter, the term "audio signal" represents an audio signal in a PCM format which has been converted into a digital signal. The audio encoding program 45 causes the audio encoding apparatus 1 to execute a process of encoding the audio file 41 by the MPEG-2 AAC.

The main storage device 2 stores an audio encoding program code 25 of the audio encoding program 45 which is loaded from the secondary storage device 4 by the CPU 3. The main storage device 2 further stores audio data 21. The audio data 21 corresponds to the audio file 41 which has been read from the secondary storage device 4 and stored in a working area of the main storage device 2. Alternatively, the audio data 21 may correspond to an audio signal which has been collected using a microphone (not shown), converted into a digital signal using an analog/digital convertor (not shown), and temporarily stored in the working area of the main storage device 2.

The CPU 3 loads the audio encoding program 45 stored in the secondary storage device 4 into the main storage device 2. Furthermore, the CPU 3 reads the audio file 41 to be processed from the secondary storage device 4 and stores the audio file 41 in the working area of the main storage device 2 as the audio data 21 when executing the audio coding program code 25 loaded into the main storage device 2.

The CPU 3 appropriately reads the audio coding program code 25 loaded into the main storage device 2, encodes the audio data 21 stored in the working area of the main storage device 2, and generates an MPEG-2 AAC file 23. The generated MPEG-2 AAC file 23 is stored in the main storage device 2 under control of the CPU 3.

The CPU 3 functions as a frame dividing unit 31, an attack detecting unit 32, a block determining unit 33, an orthogonal transform unit 34, a grouping unit 35, a quantizing unit 36, a bit-stream generating unit 37, and an output unit 38 by reading and executing the audio coding program code 25.

The frame dividing unit 31 reads the audio data 21 stored in the main storage device 2 and divides the audio data 21 in a unit of a frame. The frame dividing unit 31 outputs audio signals obtained by dividing an audio signal in a unit of a frame to the attack detecting unit 32 and the orthogonal transform unit 34.

The attack detecting unit 32 obtains audio signals for one frame process obtained by dividing an audio signal in a unit of a frame as input signals. The attack detecting unit 32 detects an attack included in the frame. The attack detecting unit 32 outputs an attack detecting result to the block determining unit 33.

Furthermore, the attack detecting unit 32 detects a grouping of short blocks included in the frame in accordance with the result of the detection of an attack. The attack detecting unit 32 outputs a grouping determining result to the grouping unit 35. A process executed by the attack detecting unit 32 will be described in detail hereinafter.

The block determining unit 33 obtains the attack detecting result from the attack detecting unit 32 as an input. In accordance with the attack detecting result, the block determining unit 33 determines whether orthogonal transform is to be performed in a unit of a short block or a unit of a long block. When an attack is included in the frame, the block determining unit 33 determines that the orthogonal transform is to be performed in a unit of a short block. When an attack is not included in the frame, the block determining unit 33 determines that the orthogonal transform is to be performed in a unit of a long block. The block determining unit 33 outputs the determined block unit used for the orthogonal transform to the orthogonal transform unit 34.

The orthogonal transform unit 34 obtains audio signals for one frame process from the frame dividing unit 31 and the block unit used for the orthogonal transform from the block determining unit 33 as inputs. The orthogonal transform unit 34 performs orthogonal transform on the audio signals for one frame process in accordance with the block unit supplied from the block determining unit 33. In the MPEG-2 AAC, MDCT (Modified Discrete Cosine Transform) is employed as the orthogonal transform. By performing the orthogonal transform, the audio signals are converted into frequency spectra. When the block unit used for the orthogonal transform supplied from the block determining unit 33 corresponds to a long block, the orthogonal transform unit 34 executes orthogonal transform on the audio signals in a unit of a long block. When the block unit used for the orthogonal transform supplied from the block determining unit 33 corresponds to a short block, the orthogonal transform unit 34 executes orthogonal transform on the audio signals in a unit of a short block. The orthogonal transform unit 34 outputs the frame including the audio signals converted into the frequency spectra to the grouping unit 35.

The grouping unit 35 obtains a grouping determining result from the attack detecting unit 32 and the audio signals for one frame process which have been converted into the frequency spectra from the orthogonal transform unit 34 as inputs. The grouping unit 35 performs a grouping on short blocks included in the audio signals for one frame process in accordance with the grouping determining result. The grouping unit 35 outputs the frame obtained after the grouping to the quantizing unit 36.

The quantizing unit 36 obtains the audio signals for one frame which has been subjected to the grouping as inputs. The quantizing unit 36 quantizes the frequency spectra for individual groups included in the frame. The quantizing unit 36 outputs the audio signals for one frame which have been quantized to the bit-stream generating unit 37.

The bit-stream generating unit 37 obtains the audio signals for one frame which have been quantized from the quantizing unit 36 as inputs. The bit-stream generating unit 37 encodes the quantized audio signals for one frame so as to generate a bit stream constituted by "0" and "1". The bit-stream generating unit 37 performs encoding using Huffuman coding. The bit-stream generating unit 37 outputs the generated bit stream to the output unit 38.

The output unit 38 obtains the bit stream from the bit-stream generating unit 37. The output unit 38 outputs the bit stream to be stored in the main storage device 2 as the MPEG-2 AAC file 23.

The attack detecting unit 32 included in the audio encoding apparatus 1 of an embodiment detects an attack included in a frame and determines a grouping boundary. The attack detecting unit 32 divides the frame into sub-blocks having predetermined time lengths, obtains power change ratios of audio signals included in the individual sub-blocks, and detects, among the sub-blocks, a sub-block including an audio signal having a power change ratio larger than a threshold value for attack detection. In this way, the attack detecting unit 32 detects an attack. When an attack is detected, the attack detecting unit 32 determines a starting point of a short block including the sub-block including the attack as a grouping boundary.

Figure 4:
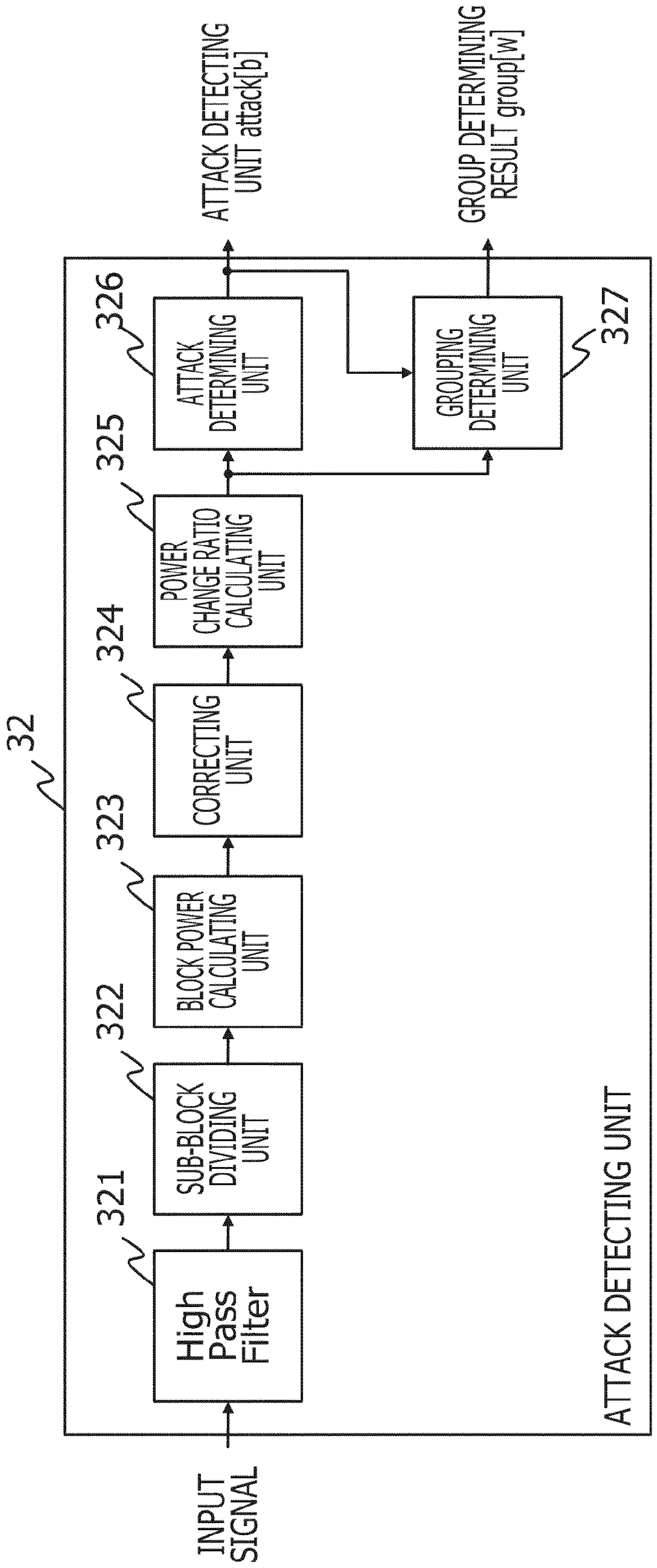
FIG. 4 is a diagram illustrating a configuration example of an attack detecting unit.

FIG. 4 is a diagram illustrating a configuration example of the attack detecting unit 32. The attack detecting unit 32 includes a high pass filter 321, a sub-block dividing unit 322, a block power calculating unit 323, a correcting unit 324, a power change ratio calculating unit 325, an attack determining unit 326, and a grouping determining unit 327.

The high pass filter 321 obtains an input audio signal for one frame process from the frame dividing unit 31 as an input. The high pass filter 321 removes unnecessary low-frequency signals included in the audio signal so as to allow only high-frequency signals to pass. The high pass filter 321 outputs the audio signal for one frame process to the sub-block dividing unit 322.

The sub-block dividing unit 322 obtains the audio signal for one frame process which has passed through the high pass filter 321 as an input. The sub-block dividing unit 322 divides the frame into a predetermined number of sub-blocks having the same sizes. Each of the sub-blocks has a block length of N samples (where "N" is a natural number except for 0). For example, in a case where the audio signal is a PCM signal sampled with a sample frequency of 48 kHz, one frame has a block length of 1024 samples. When the frame is divided into eight sub-blocks, each of the sub-blocks has a block length of 128 samples (N=128). Note that a block length of a long block in the sample frequency 48 kHz corresponds to 1024 samples which is the same as the block length of one frame. A block length of a short block corresponds to 128 samples, and one frame includes eight short blocks. A sub-block may have a block length and a time length the same as those of the short block or smaller than those of the short block. In an embodiment, the block length of the sub-block is the same as that of the short block. The sub-block dividing unit 322 outputs audio signals obtained by dividing the supplied audio signal in a unit of a sub-block to the block power calculating unit 323.

The block power calculating unit 323 obtains the audio signals divided in a unit of a sub-block as inputs. The block power calculating unit 323 calculates powers of the audio signals for individual sub-blocks. For example, the block power calculating unit 323 obtains, for each sub-block, a square sum of values of electric powers caused by amplitudes of samples which are included in each of the sub-blocks and which have passed through the high pass filter 321 as a power of each of the sub-blocks.

$$pow[b] = \sum_i sample_i^2 \qquad \text{Expression 1}$$

b: a position of a sub-block pow[b]: a power of an audio signal included in a sub block i: a position of a sample included in a sub-block $sample_i$: a value of a sample (an electric power caused by amplitude)

The block power calculating unit 323 outputs the powers, which have been calculated, of the audio signals included in the individual sub-blocks included in the frame to the correcting unit 324.

The correcting unit 324 obtains the powers of the audio signals of the individual sub-blocks from the block power calculating unit 323 as inputs. The correcting unit 324 obtains power change ratios in accordance with the powers of the audio signals of the sub-blocks and detects a sub-block which is likely to include an attack on the basis of the power change ratios. The sub-block which is likely to include an attack is referred to as an "attack candidate sub-block" hereinafter. When an attack candidate sub-block is detected, the correcting unit 324 determines whether an attack starting point is included in one of the attack candidate sub-block and a sub-block immediately before the attack candidate sub-block. When the determination is affirmative, the correcting unit 324 corrects a power of an audio signal included in the sub-block having the attack starting point. The correcting unit 324 outputs the powers of the audio signals for one frame including the corrected power of the audio signal of the sub-block to the power change ratio calculating unit 325. Operation of the correcting unit 324 will be described in detail hereinafter.

The power change ratio calculating unit 325 obtains the powers of the audio signal of the sub-blocks for one frame including the corrected power of the audio signal of the sub-block. The power change ratio calculating unit 325 calculates power change ratios of the individual sub-blocks in accordance with the powers of the audio signals of the sub-blocks included in the frame. The power change ratio calculating unit 325 outputs the calculated power change ratios of the sub-blocks to the attack determining unit 326 and the grouping determining unit 327.

The attack determining unit 326 obtains the power change ratios of the sub-blocks as inputs. The attack determining unit 326 compares the power change ratios of the sub-blocks with a threshold value 1 of the attack detection so as to detect a sub-block having a power change ratio larger than the threshold value 1 as a sub-block including an attack. The attack determining unit 326 outputs the sub-block including an attack as a result of the attack detection to the grouping determining unit 327 and the block determining unit 33.

The grouping determining unit 327 obtains the power change ratios of the sub-blocks and the result of the attack detection as inputs. The grouping determining unit 327 determines a grouping boundary in the frame in accordance with the power change ratios of the sub-blocks and the result of the attack detection. The grouping determining unit 327 outputs the grouping boundary included in the frame as a result of the group determination to the grouping unit 35. Operation of the grouping determining unit 327 will be described in detail hereinafter.

Figure 5:
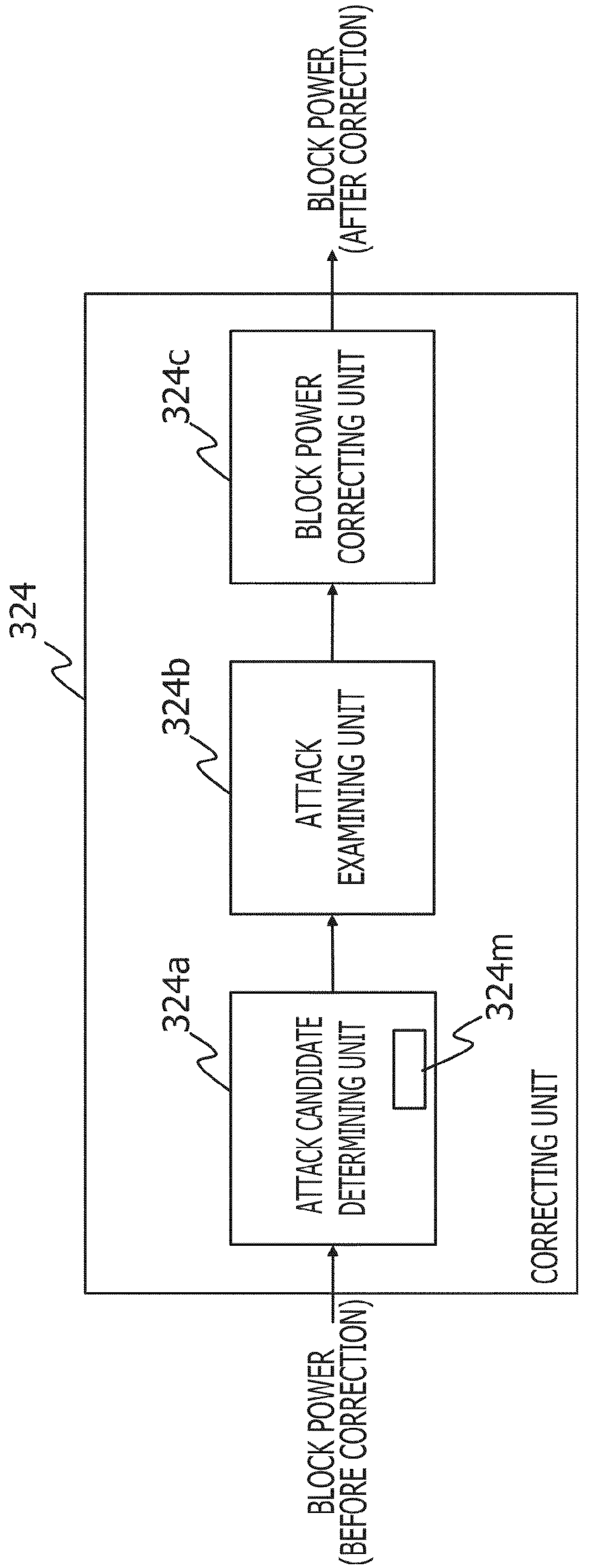
FIG. 5 is a diagram illustrating a configuration example of a correcting unit.

FIG. 5 is a diagram illustrating a configuration example of the correcting unit 324 included in the attack detecting unit 32. The correcting unit 324 includes an attack candidate determining unit 324*a*, an attack examining unit 324*b*, and a block power correcting unit 324*c*.

The attack candidate determining unit 324*a* obtains powers of audio signals of sub-blocks included in one frame as inputs. The attack candidate determining unit 324*a* detects a sub-block which is likely to include an attack in accordance with the powers of the audio signals of the sub-blocks. The attack candidate determining unit 324*a* outputs a result of the attack candidate detection including information on the attack candidate sub-block and the frame which has been divided in a unit of a sub-block to the attack examining unit 324*b*.

Figure 6:
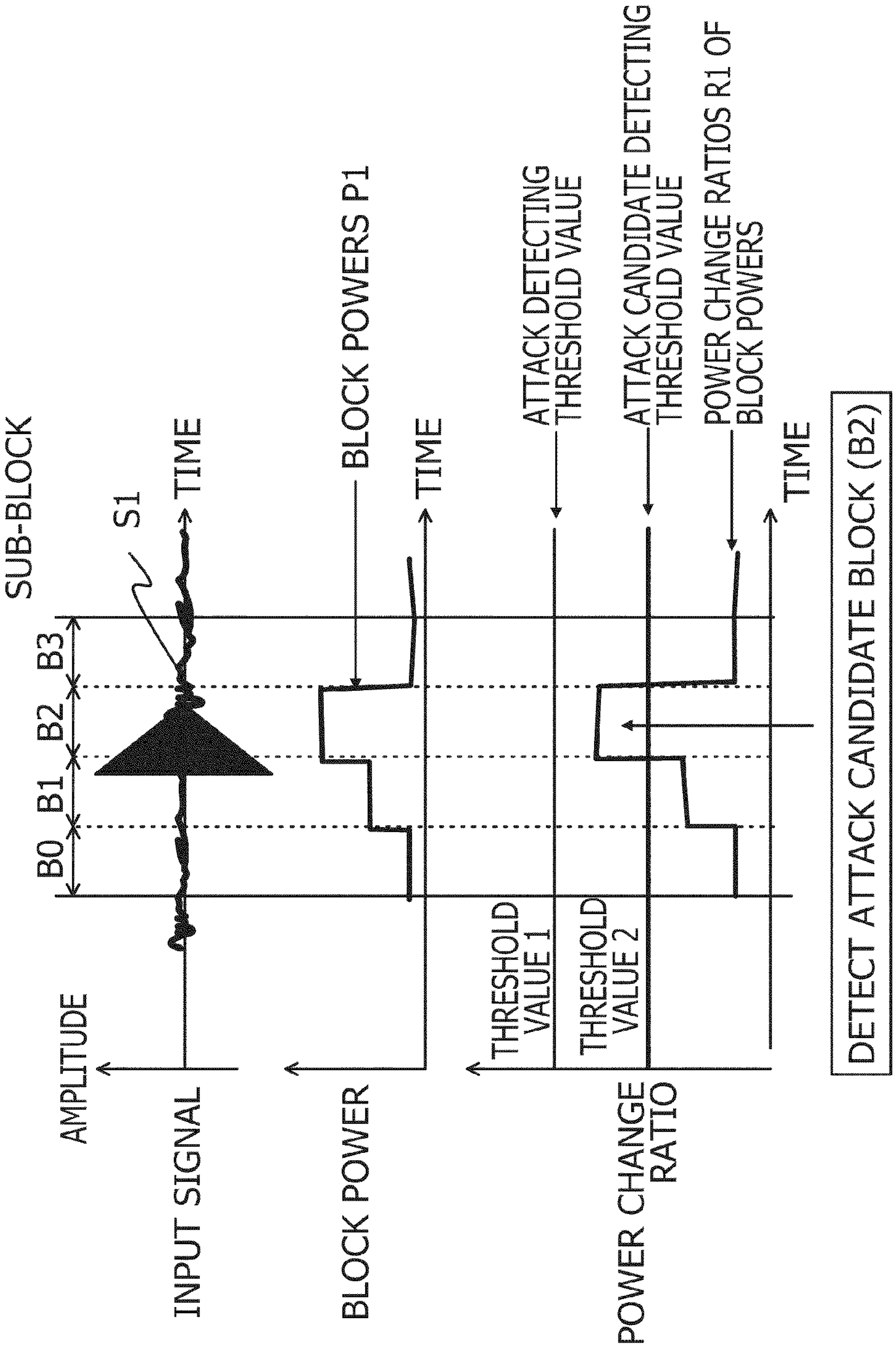
FIG. 6 is a diagram illustrating an example of an attack-candidate detecting process.

FIG. 6 is a diagram illustrating an example of an attack-candidate detecting process executed by the attack candidate determining unit 324*a*. In the example in FIG. 6, among sub-blocks B0 to B7 included in the frame, the sub-blocks B0 to B3 are extracted and shown. In the example shown in FIG. 6, an attack is included in the consecutive sub-blocks B1 and B2 and an attack starting point is positioned near a block boundary between the sub-blocks B1 and B2. In the example shown in FIG. 6, a waveform S1 of an input audio signal and powers P1 of the sub-blocks of the input audio signal are shown.

The attack candidate determining unit 324*a* obtains power change ratios of the sub-blocks in accordance with the powers of the audio signals of the sub-blocks supplied from the block power calculating unit 323. The attack candidate determining unit 324*a* first obtains averages avepow[b] of powers of audio signals previously obtained before obtaining the power change ratios of sub-blocks b. The attack candidate determining unit 324*a* includes a memory 324*m* which stores the averages avepow[b] of the powers of the audio signals previously obtained for individual sub-blocks. The averages avepow[b] of the powers of the previous audio signals of the sub-blocks b are obtained in accordance with weighted averages, for example, as below.

$$avepow[b] = \alpha \times avepow[b-1] + (1-\alpha) \times pow[b-1] \qquad \text{Expression 2}$$

avepow[b−1]: an average of powers of previous audio signals of a sub-block immediately before a sub-block of interest α: a weight coefficient (=0.7)

pow[b]: a power of an audio signal included in a sub-block

Here, "α" represents a weight coefficient used to avoid influence of an abrupt change of an electric power of an audio signal in a sub-block b−1 immediately before a sub-block b. Note that when an average of electric powers of previous audio signals of a sub-block at a beginning of the frame is to be obtained, an average value of electric powers of previous audio signals in a sub-block at the end of a frame immediately before a frame of interest which has been stored in the memory 342*m* may be used.

Next, the attack candidate determining unit 324*a* obtains power change ratios powRatio_tmp[b] using ratios of the averages avepow[b] of the electric powers of the previous audio signals of the sub-blocks b to the powers pow[b] of the sub-blocks b in accordance with Equation (3) below.

$$\text{powRatio\_tmp}[b] = \frac{pow[b]}{avepow[b]} \qquad \text{Expression 3}$$

powRatio_tmp[b]: a power change ratio of a sub-block b
pow[b]: a power of an audio signal included in a sub-block b
avepow[b]: an average of electric powers of previous audio signals of a sub-block b The attack candidate determining unit 324*a* obtains the power change ratios of all the sub-blocks included in the frame. In the example shown in FIG. 6, power change ratios of the sub-blocks B0 to B3 included in the frame are denoted by power change ratios R1.

The attack candidate determining unit 324*a* compares the power change ratios of the sub-blocks with the threshold value 1 for attack detection and with a threshold value 2 for attack candidate detection.

The threshold value 1 is an attack detecting threshold value used to determine whether an attack is included in a sub-block. When a power change ratio of a sub-block is larger than the threshold value 1, the attack candidate determining unit 324*a* determines that the sub-block includes an attack. A value in a range from 10 to 25 (no unit of quantity for ratios), for example, is set as the threshold value 1.

The threshold value 2 serves as an attack candidate detecting threshold value which is not used to determine a detection of an attack in a sub-block but is used to determine whether it is highly possible that the sub-block includes an attack. The threshold value 2 is smaller than the threshold value 1. When a power change ratio of a sub-block is equal to or larger than the threshold value 2 and equal to or smaller than the threshold value 1, it is not determined that an attack is included in the sub-block but it is determined that it is highly possible that the sub-block includes an attack. That is, when a power change ratio of a sub-block is equal to or larger than the threshold value 2 and equal to or smaller than the threshold value 1, the attack candidate determining unit 324*a* detects the sub-block as an attack candidate sub-block. When a value in a range from 10 to 25 is set to the threshold value 1, a value in a range from 1.5 to 8, for example, is set to the threshold value 2.

In the example shown in FIG. 6, any one of the sub-blocks B0 to B3 does not exceed the threshold value 1. In the example shown in FIG. 6, since a power change ratio of the sub-block B2 is larger than the threshold value 2 and smaller than the threshold value 1, the attack candidate determining unit 324*a* detects the sub-block B2 as an attack candidate.

Figure 7:
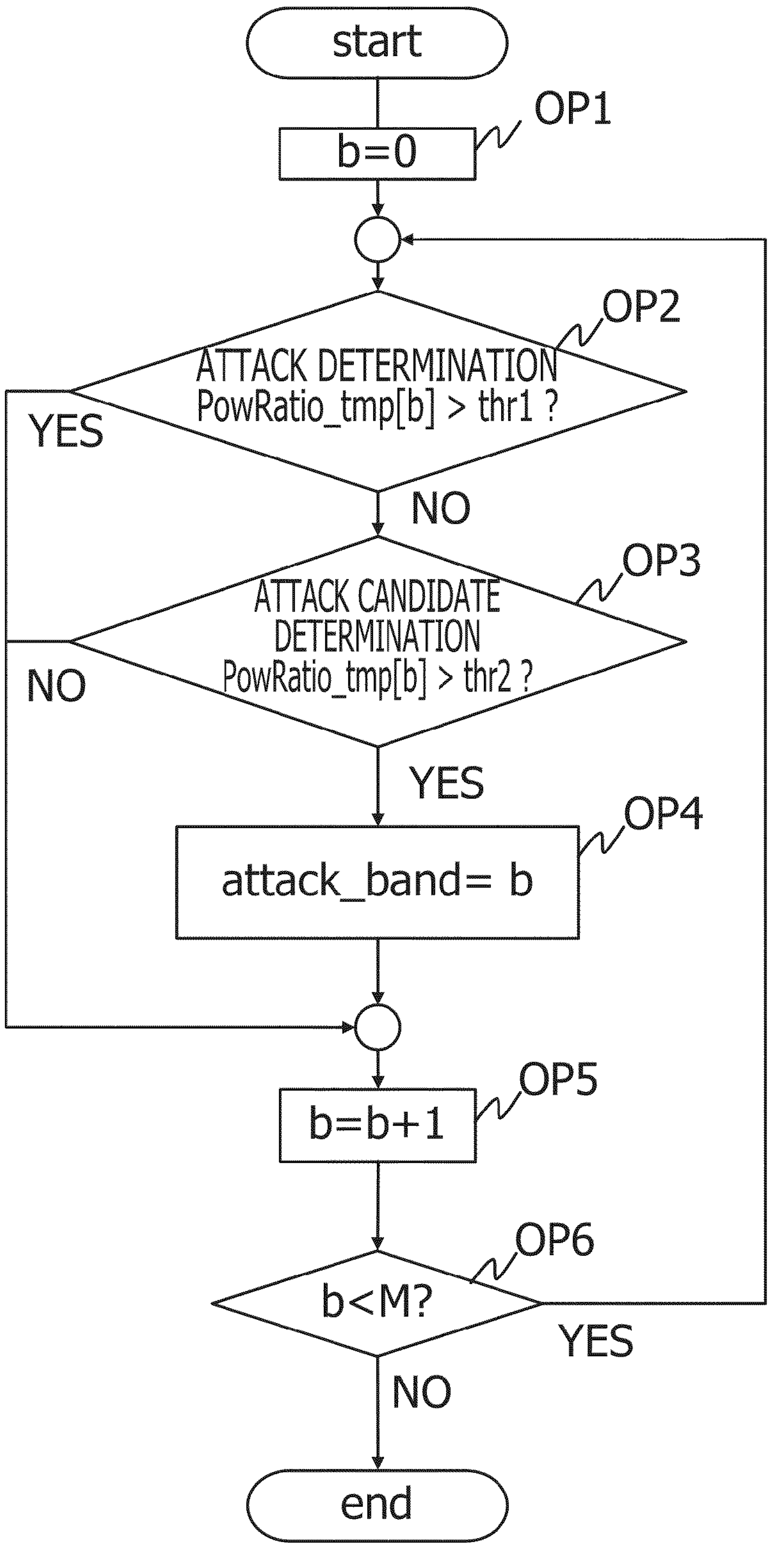
FIG. 7 is a flowchart illustrating the example of the attack-candidate detecting process.

FIG. 7 is a flowchart illustrating the example of the attack-candidate detecting process executed by the attack candidate determining unit 324*a*.

When obtaining the powers of the audio signals of the sub-blocks included in the frame as inputs, the attack candidate determining unit 324*a* starts the attack candidate detecting process.

The attack candidate determining unit 324*a* sets a variable b to 0 (b=0) which represents positions of the sub-blocks included in the frame in operation OP1. For example, when the variable b is 0, the sub-block B0 is specified. As shown in the example in FIG. 6, when one frame is divided into eight sub-blocks, a range of the variable b is equal to or larger than 0 and equal to or smaller than 7.

The attack candidate determining unit 324*a* obtains a power change ratio of a sub-block b in accordance with Equation 2 and Equation 3, for example. The attack candidate determining unit 324*a* determines whether a power change ratio (powRatio_tmp[b]) of the sub-block b is larger than the threshold value 1 (thr1). That is, the attack candidate determining unit 324*a* determines whether the sub-block b includes an attack in operation OP2.

When the determination is affirmative in operation OP2, it is determined that the sub-block b includes an attack. Note that the attack candidate determining unit 324*a* is not used to detect a sub-block including an attack but used to detect an attack candidate sub-block. Therefore, even when a sub-block including an attack is detected, any particular process is not performed. Thereafter, the process proceeds to operation OP5.

When the determination is negative in operation OP2, the attack candidate determining unit 324*a* determines whether the power change ratio of the sub-block b is larger than the threshold value 2 (thr2) in operation OP3. That is, the attack candidate determining unit 324*a* determines whether the sub-block b is an attack candidate.

When the determination is affirmative in operation OP3, the sub-block b is an attack candidate sub-block. The attack candidate determining unit 324*a* records that the sub-block b is an attack candidate sub-block in operation OP4. When the sub-block B2 is detected as an attack candidate in the example shown in FIG. 6, the attack candidate determining unit 324*a* records "attack_band=B2". Furthermore, "attack_band=−1" represents that any attack candidate sub-block is not detected. Thereafter, the process proceeds to operation OP5.

When the determination is negative in operation OP3, the sub-block b does not include any attack and is not an attack candidate. Thereafter, the process proceeds to operation OP5.

In operation OP5, the attack candidate determining unit 324*a* adds 1 to the variable b so that the next sub-block is to be processed. For example, when the variable b has been "0", the attack candidate determining unit 324*a* adds 1 to 0 so as to obtain 1 (b=0+1=1).

The attack candidate determining unit 324*a* determines whether the variable b is smaller than the number of sub-blocks M included in the frame in operation OP6. That is, the attack candidate determining unit 324*a* determines whether at least one sub-block, among the sub-blocks included in the frame, which has not been subjected to the attack candidate detecting process remains. In the example shown in FIG. 6, since the frame is divided into eight sub blocks, i.e., the sub-blocks B0 to B7, the attack candidate determining unit 324*a* determines whether the variable b is smaller than 8.

When the determination is affirmative in operation OP6, at least one sub-block has not been subjected to the attack candidate detecting process. Then, the attack candidate determining unit 324*a* performs the processes in operation OP2 to operation OP4 again.

When the determination is negative in operation OP6, the attack candidate detecting process has been performed on all the sub-blocks included in the frame. The attack candidate determining unit 324*a* outputs an attack candidate detecting result attack_band to the attack examining unit 324*b*, and the attack candidate detecting process is terminated.

In the example shown in FIG. 6, since the attack candidate determining unit 324*a* detects the sub-block B2 as an attack candidate, the attack candidate determining unit 324*a* outputs "attack_band=B2" as a result of the attack candidate detecting process to the attack examining unit 324*b*. On the other hand, when any attack candidate is not detected, the attack candidate determining unit 324*a* outputs "attack_band=−1" as a result of the attack candidate detecting process to the attack examining unit 324*b*.

It is not necessarily the case that the attack candidate sub-block detected through the attack candidate detecting process includes an attack starting point. The attack candidate sub-block may include an attack starting point. Alternatively, the attack candidate sub-block may not include an attack starting point but a sub-block immediately before the attack candidate may include an attack starting point.

Referring back to FIG. 5, the attack examining unit 324*b* obtains the attack candidate detecting result attack_band from the attack candidate determining unit 324*a* as an input. The attack examining unit 324*b* performs an attack specifying process of specifying a sub-block including the attack starting point. The attack examining unit 324*b* outputs an attack specifying result attack_band representing a sub-block including an attack as a result of the attack specifying process to the block power correcting unit 324*c*.

Figure 8:
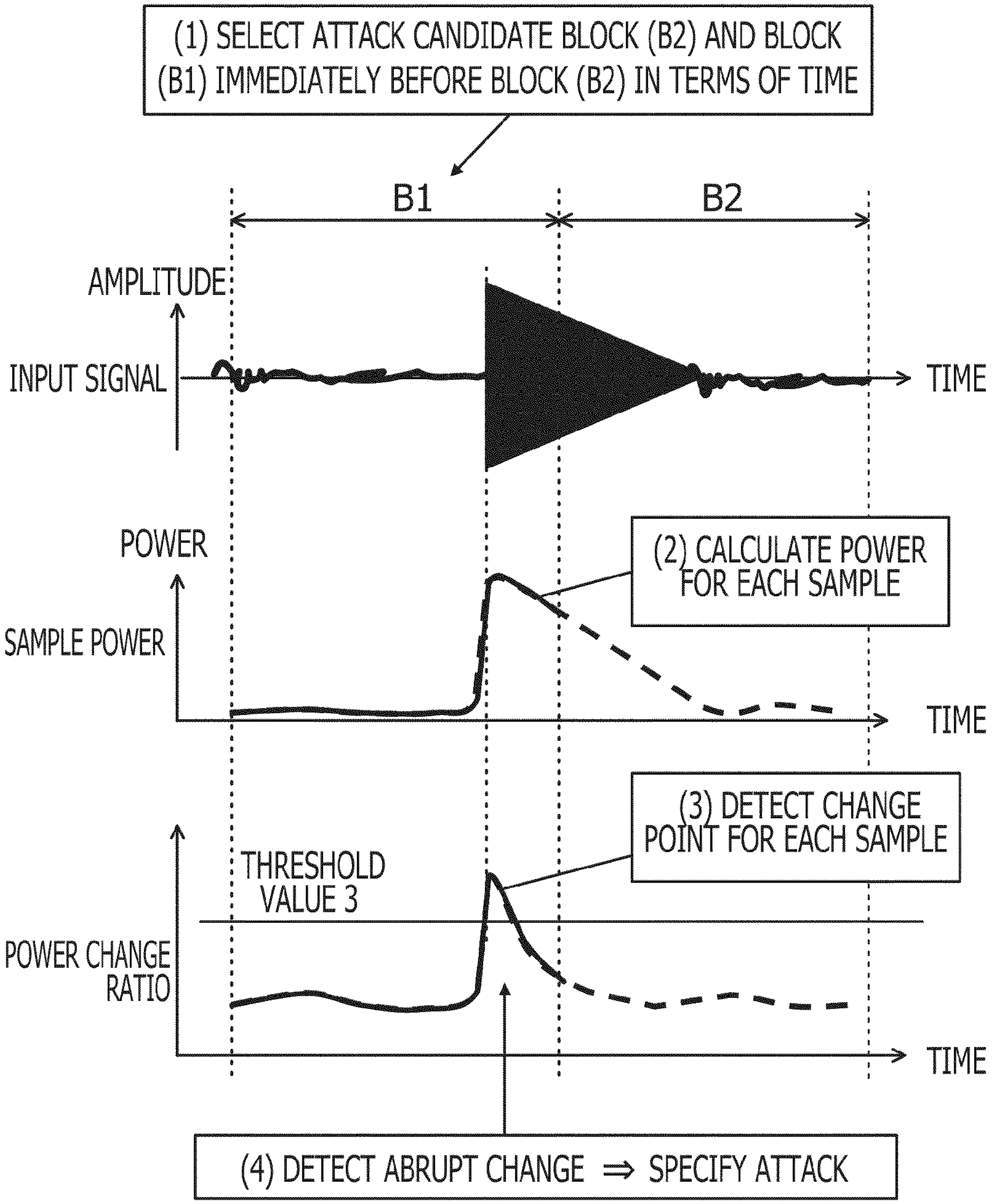
FIG. 8 is a diagram illustrating an example of an attack specifying process.

FIG. 8 is a diagram illustrating an example of the attack specifying process performed by the attack examining unit 324*b*. In the example shown in FIG. 8, the sub-blocks B1 and B2 of the input audio signal in the example of FIG. 6 are extracted and shown.

The example shown in FIG. 8 shows the attack specifying process executed by the attack examining unit 324*b* when "attack_band=B2" is input as the attack candidate detecting result.

(1) The attack examining unit 324*b* determines whether an attack starting point is included in the attack candidate sub-block or the sub-block immediately before the attack candidate sub-block in terms of time, since the attack starting point may be included in the attack candidate sub-block or may be included in the sub-block immediately before the attack candidate. The attack examining unit 324*b* first selects the sub-block immediately before the attack candidate sub-block in terms of time. In the example shown in FIG. 8, since the attack candidate detecting result is "attack_band=B2", the sub-block B2 is the attack candidate. Therefore, in the example shown in FIG. 8, the attack examining unit 324*b* first selects, as a sub-block to be examined, the sub-block B1 immediately before the sub-block B2 in terms of time which is the attack candidate.

(2) The attack examining unit 324*b* calculates powers of audio signals for individual samples in order to determine whether the selected sub-block includes an attack starting point in detail. In a case of FIG. 8, the attack examining unit 324*b* calculates the powers of the audio signals for individual samples included in the sub-block B1.

(3) The attack examining unit 324*b* calculates power change ratios of the samples in accordance with the powers of the audio signals of the samples included in the selected sub-block. Note that the calculation of the power change ratios of the samples included in the sub-block is performed by replacing the sub-blocks in Expressions 2 and 3 by the samples, for example. In the example shown in FIG. 8, the attack examining unit 324*b* calculates the power change ratios of the samples in accordance with the powers of the samples included in the sub-block B1.

(4) The attack examining unit 324*b* determines whether at least one of the power change ratios of the audio signals of the samples is larger than a threshold value 3 (starting point specifying threshold value) used to specify an attack starting point. When the determination is affirmative, the attack examining unit 324*b* determines that the selected sub-block includes an attack starting point. In the example shown in FIG. 8, since a sample having a power change ratio of an audio signal larger than the threshold value 3 is included in the sub-block B1, the attack examining unit 324*b* determines that the sub-block B1 includes an attack starting point. As the threshold value 3, a value in a range the same as the range of the attack detecting threshold value 1 is used. For example, when the attack detecting threshold value 1 is included in a range from 10 to 25, the starting point specifying threshold value 3 is included in a range from 10 to 25.

When any sample does not have a power change ratio of an audio signal larger than the threshold value 3, the attack examining unit 324*b* next selects the attack candidate sub-block and performs the processes in (2) to (4) described above on the attack candidate sub-block.

Note that when the attack candidate detecting result supplied from the attack candidate determining unit 324*a* is "attack_band=−1" or "attack_band=0", the attack examining unit 324*b* does not perform the attack specifying process (from the process (1) to the process (4)). Note that when an attack candidate sub-block is not detected, the attack candidate detecting result represents "attack_band=−1". When a beginning sub-block in the frame is detected as an attack candidate, the attack candidate detecting result represents "attack_band=0". When the beginning sub-block included in the frame is detected as an attack candidate, a frame which is immediately before a frame of interest or the beginning sub-block included in the frame of interest is expected to have an attack starting point. Even when an attack starting point is included in the frame immediately before the frame of interest, or even when an attack starting point is included in the beginning sub-block of the frame of interest, a boundary positioned between the beginning sub-block included in the frame of interest and the sub-block immediately before the beginning sub-block (the frame immediately before the frame of interest) serves as a grouping boundary. Therefore, when the beginning sub-block of the frame of interest is detected as an attack candidate, the attack examining unit 324*b* does not perform the attack specifying process. Accordingly, when the attack candidate detecting result supplied from the attack candidate determining unit 324*a* corresponds to "attack_band=−1" or "attack_band=0", the attack examining unit 324*b* does not perform the attack specifying process.

Figure 9:
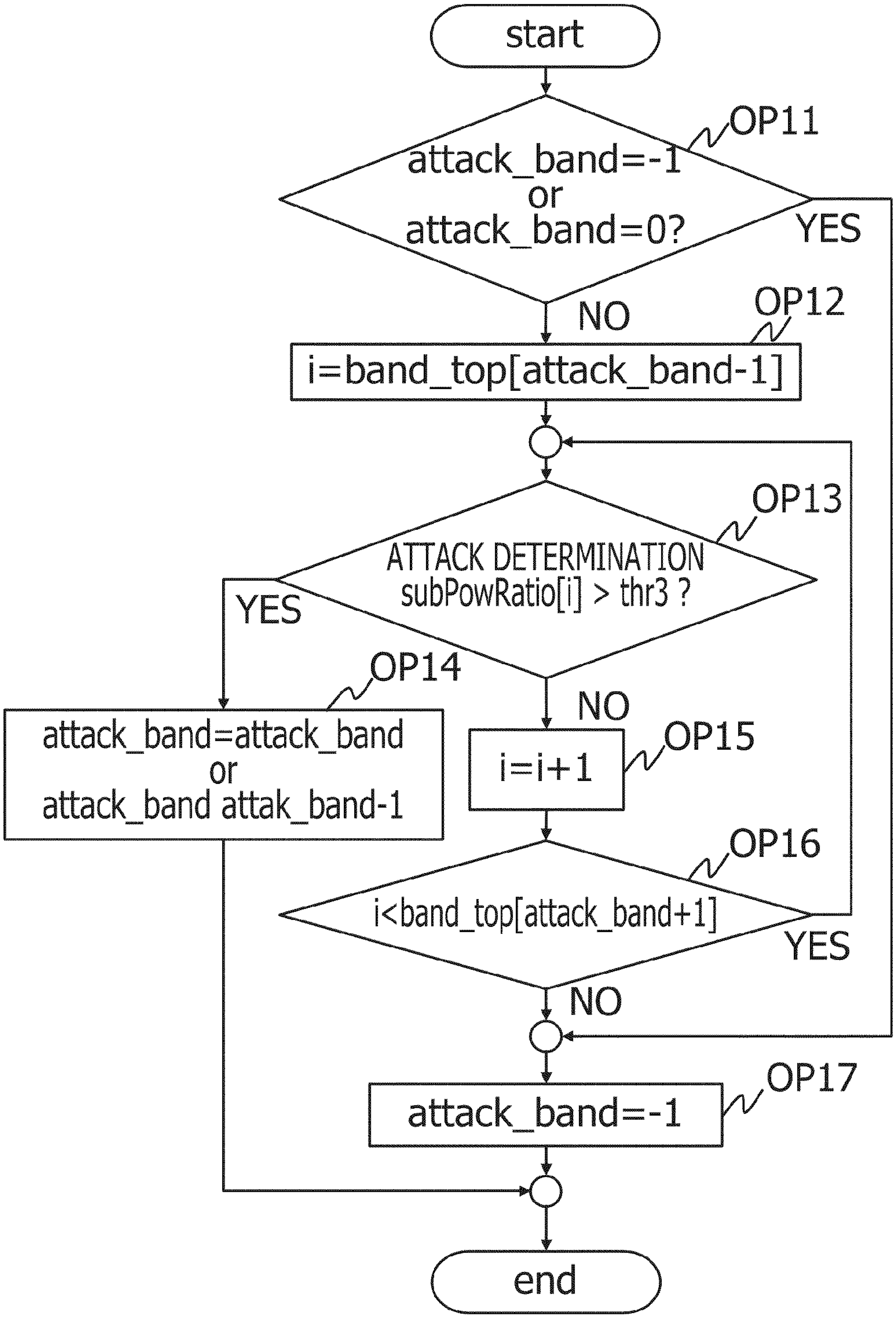
FIG. 9 is a flowchart illustrating an attack specifying process.

FIG. 9 is a flowchart illustrating the attack specifying process performed by the attack examining unit 324*b*. When the attack candidate detecting result (attack_band) is supplied from the attack candidate determining unit 324*a*, the attack examining unit 324*b* performs the attack specifying process.

The attack examining unit 324*b* determines whether the attack candidate detecting result represents one of "attack_band=−1" and "attack_band=0" in operation OP11. When the attack candidate detecting result represents "attack_ band=−1", a sub-block serving as an attack candidate is not detected. Note that even when the attack candidate detecting result represents "attack_band=−1", it is possible that a sub-block including an attack is detected. When the attack candidate detecting result represents "attack_band=0", a beginning sub-block included in the frame is an attack candidate. As described above, when an attack candidate sub-block is not detected, or when the beginning sub-block included in the frame corresponds to an attack candidate, the attack specifying process is not performed. Therefore, when the determination is affirmative in operation OP11, the attack examining unit 324*b* sets an attack candidate detecting result attack_band to −1 in operation OP17, and the attack specifying process is terminated. When the variable attack_band representing the attack specifying result is −1, a sub block to be subjected to correction of a power of an audio signal does not exist.

When the determination is negative in operation OP11, it is highly possible that an attack starting point is included in the attack candidate sub-block or a sub-block immediately before the attack candidate. First, the attack examining unit 324*b* sets an initial value of a variable i representing a position of a sample to a position of a beginning sample included in the sub-block immediately before the attack candidate in order to detect the attack starting point starting from the sub-block immediately before the attack candidate in operation OP12. In FIG. 9, "attack_band" represents the attack candidate sub-block, "attack_band−1" represents the sub-block immediately before the attack candidate sub-block, and "band_top [b]" (b is a natural number including 0 representing a position of a sub-block) represents a position of the beginning sample of the sub-block b. Note that sequential numbers starting from 0 is assigned to the samples included in the frame. For example, assuming that the frame includes 1024 samples, numbers 0 to 1023 are assigned to the samples. Accordingly, a range of the variable i representing a position of a sample included in the frame corresponds to a range from 0 to a number obtained by subtracting 1 from the number of samples included in the frame.

In the case of the example shown in FIG. 8, the attack examining unit 324*b*, for example, selects the sub-block B1 as the sub-block immediately before the attack candidate sub-block B2 and sets a position of a beginning sample of the sub-block B1 as the variable i.

Then, the attack examining unit 324*b* obtains a power change ratio subPowRatio[i] of a sample i using Expressions 2 and 3, for example. The attack examining unit 324*b* determines whether the power change ratio subPowRtio[i] of the sample i is larger than the threshold value 3 (thr3) in operation OP13. That is, the attack examining unit 324*b* determines whether an attack starting point is included in the sample i.

When the determination is affirmative in operation OP13, the attack examining unit 324*b* determines that the attack starting point is included in the sample i. In operation OP14, the attack examining unit 324*b* determines that the attack starting point is included in the sub-block having the sample i, and sets an attack specifying result attack_band. When the sample i having the power change ratio larger than the threshold value 3 is included in the attack candidate sub-block, the attack examining unit 324*b* sets the attack specifying result attack_band to attack_band. When the sample i having the power change ratio larger than the threshold value 3 is included in the sub-block immediately before the attack candidate, the attack examining unit 324*b* sets the attack specifying result attack_band to attack_band−1. Thereafter, the attack examining unit 324*b* outputs the attack specifying result attack_band to the block power correcting unit 324*c*, and the attack specifying process is terminated.

In the example shown in FIG. 8, since the sub-block B1 immediately before the attack candidate has the power change ratio of the sample larger than the threshold value 3, the attack examining unit 324*b* determines that an attack is included in the sub-block B1, and "attack_band=attack_band−1=2−1=1" is recorded. Thereafter, the attack examining unit 324*b* outputs an attack specifying result attack_band of 1 to the block power correcting unit 324*c*, and the attack specifying process is terminated.

When the determination is negative in operation OP13, the attack examining unit 324*b* adds 1 to the variable i representing a position of a sample in operation OP15 so that the next sample is to be processed.

In operation OP16, the attack examining unit 324*b* determines whether a position of a sample represented by the variable i to which 1 is added in operation OP15 corresponds to a position of a sample included in the attack candidate sub-block or the sub-block immediately before the attack candidate sub-block. The attack examining unit 324*b* determines a position of a sample represented by the variable i using Expression 4 below.

$$i<\text{band\_top}[\text{attack\_band}+1] \qquad \text{Expression 4}$$

i: a sample position band_top[attack_band+1]: a position of a beginning sample included in a sub-block immediately after an attack candidate Using Expression 4, a determination as to whether the variable i representing a sample position is smaller than a value of a beginning sample of a sub-block immediately after the attack candidate is made. When the variable i satisfies Expression 4, the attack specifying process has been performed on samples included in the attack candidate sub-block or the sub-block immediately before the attack candidate sub-block.

When the determination is affirmative in operation OP16, the attack examining unit 324*b* performs the processes in operations OP13 to OP16 again.

When the determination is negative in operation OP16, a determination as to whether an attack starting point is included has been performed on all the samples included the attack candidate sub-block and in the sub-block immediately before the attack candidate and it is determined that a sample including an attack starting point has not been detected. Since an attack is not detected in the attack candidate sub-block and the sub-block immediately before the attack candidate, the attack examining unit 324*b* next records "attack_band=−1" in operation OP17. The attack examining unit 324*b* outputs an attack specifying result attack_band of −1 representing that an attack is not detected to the block power correcting unit 324*c*, and the attack specifying process is terminated.

In the attack specifying process shown in FIG. 9, the attack examining unit 324*b* first performs a detection of an attack starting point on the sub-block immediately before the attack candidate sub-block. When an attack starting point is not detected in the sub-block immediately before the attack candidate sub-block, the attack examining unit 324*b* performs a detection of an attack starting point on the attack candidate sub-block. However, a detection of an attack starting point performed by the attack examining unit 324*b* is not limited to the detection performed starting from the sub-block immediately before the attack candidate, and the detection may be performed starting from the attack candidate sub-block.

Next, the block power correcting unit 324*c* obtains the attack specifying result attack_band from the attack examining unit 324*b* as an input. The block power correcting unit 324*c* corrects a power of an audio signal of the sub-block including the attack starting point specified by the attack examining unit 324*b* in accordance with the attack specifying result attack_band. The block power correcting unit 324*c* outputs the audio signals included in the frame including the audio signal of the sub-block which has the attack starting point and in which the power thereof has been corrected to the power change ratio calculating unit 325.

Figure 10:
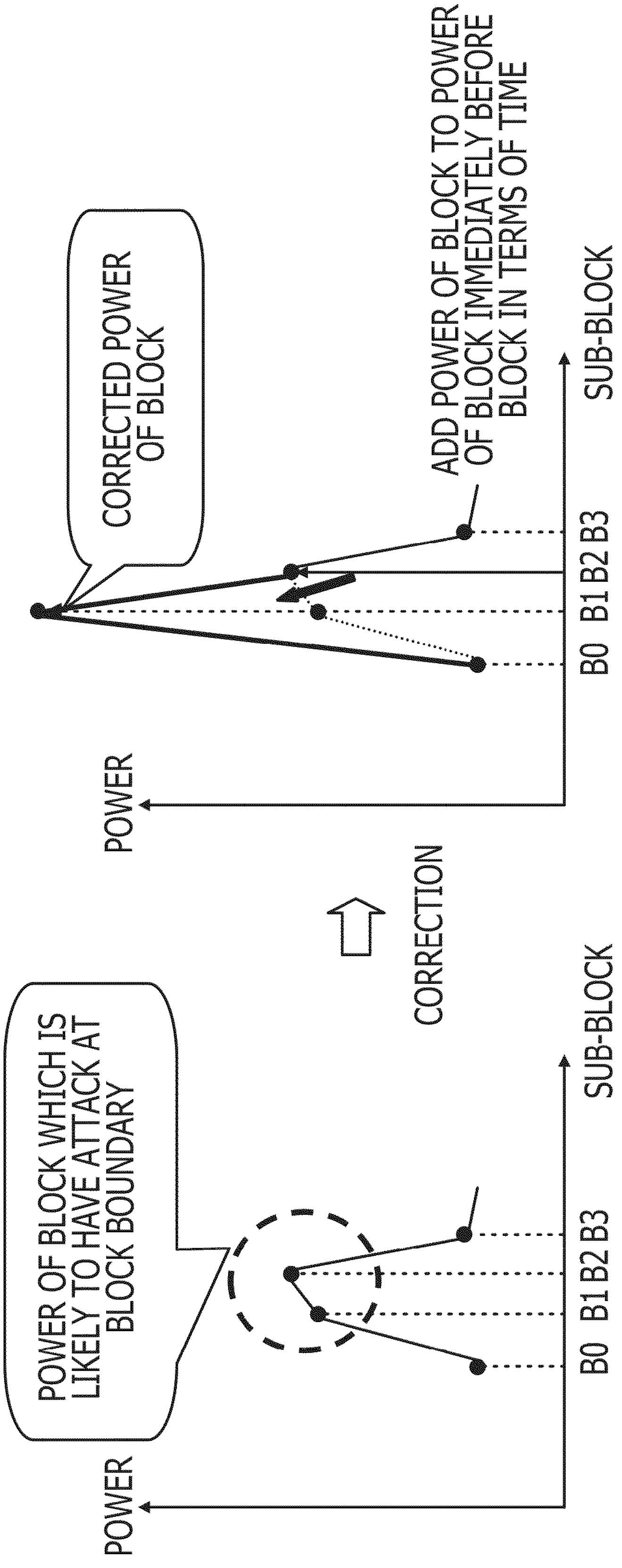
FIG. 10 is a diagram illustrating an example of a power correcting process.

FIG. 10 is a diagram illustrating an example of a power correcting process performed by the block power correcting unit 324*c*. In the example shown in FIG. 10, the powers of the sub-blocks shown in FIG. 6 are plotted for individual sub-blocks. Therefore, in the example shown in FIG. 10, although the attack starting point is included in the sub-block B1, the power of the audio signal of the sub-block B2 is larger than that of the sub-block B1. Since the attack determining unit 326 (shown in FIG. 4) determines that the sub-block B1 includes an attack, the block power correcting unit 324*c* corrects the power of the audio signal of the sub-block B1. That is, the block power correcting unit 324*c* corrects the power of the sub-block B1 so that the power change ratio of the audio signal of the sub-block B1 exceeds the attack detecting threshold value 1.

In the example shown in FIG. 10, the block power correcting unit 324*c* performs the correction such that the power of the audio signal of the sub-block B2 is added to the power of the audio signal of the sub-block B1 which has been specified in accordance with the attack specifying result attack_band of B1. The power of the sub-block B1 which has been corrected is similar to a power obtained in a case where an attack is included only in the sub-block B1.

By adding the audio signal of the sub-block B2 to the sub-block B1, the power of the audio signal of the sub-block B1 becomes larger than the attack detecting threshold value 1. Accordingly, the attack determining unit 326 determines that the sub-block B1 includes an attack.

The block power correcting unit 324*c* outputs the audio signals of the frame including the audio signal of the sub-block B1 in which the power is corrected to the power change ratio calculating unit 325.

Figure 11:
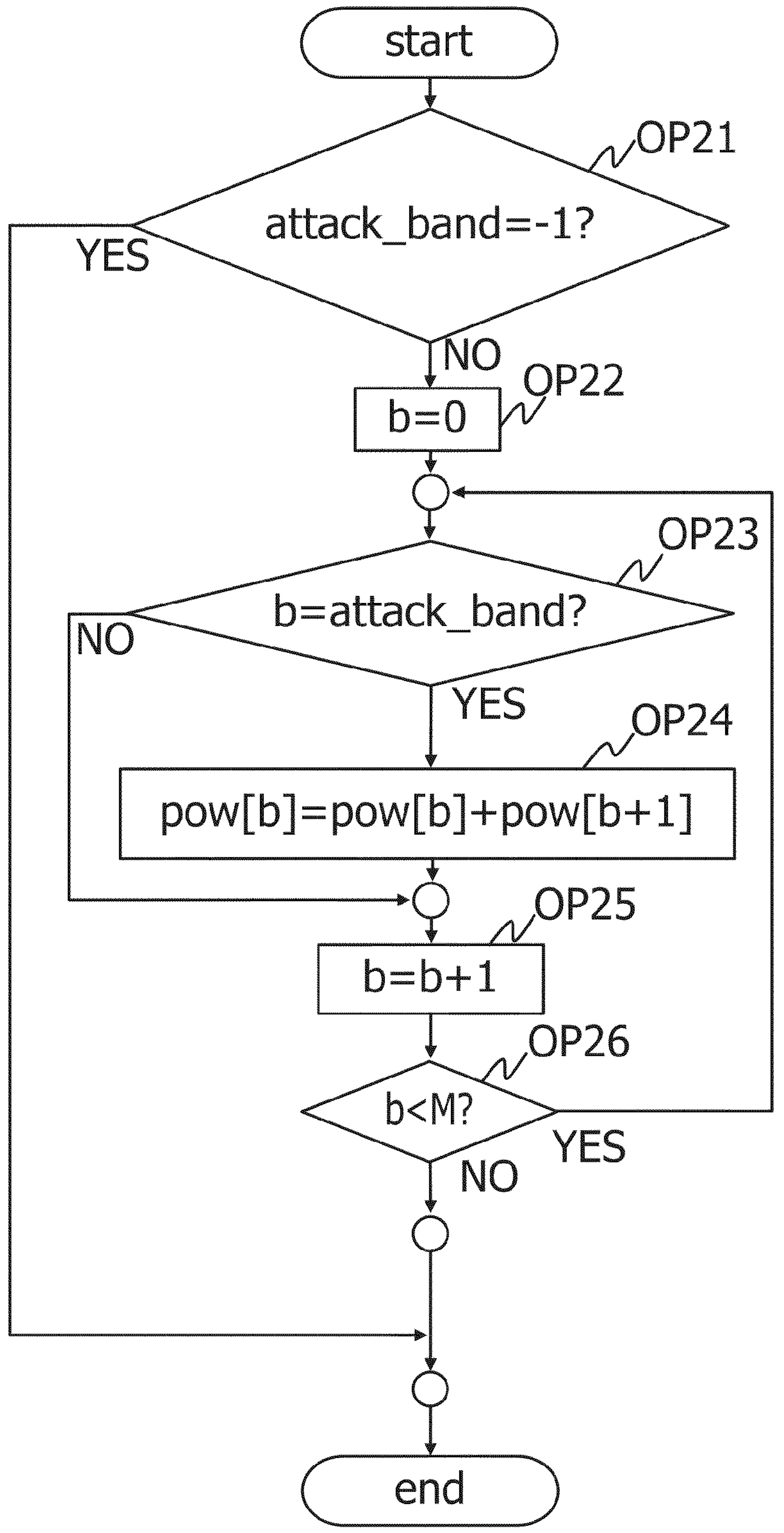
FIG. 11 is a flowchart illustrating another example of a power correcting process.

FIG. 11 is a flowchart illustrating the example of the power correcting process performed by the block power correcting unit 324*c*.

When receiving the attack specifying result attack_band supplied from the attack examining unit 324*b*, the block power correcting unit 324*c* starts the power correcting process.

In operation OP21, the block power correcting unit 324*c* determines whether the attack specifying result attack_band corresponds to −1 so as to determine whether a power of an audio signal of a sub-block is to be corrected. When the determination is affirmative in operation OP21, it is determined that the attack candidate has not been detected or an attack starting point is not detected in the attack candidate and the sub-block immediately before the attack candidate. Therefore, the block power correcting unit 324*c* does not correct the powers of the audio signals of the sub-blocks, and the power correcting process is terminated.

When the determination is negative in operation OP21, the block power correcting unit 324*c* sets the variable b representing a position of a sub-block 0 to as an initial value before a correction of a power of an audio signal of a sub-block is performed in operation OP22.

Next, the block power correcting unit 324*c* determines whether the variable b is equal to the attack specifying result attack_band in operation OP23. That is, the block power correcting unit 324*c* determines whether a sub-block b of interest includes an attack.

When the determination is affirmative in operation OP23, the attack examining unit 324*b* determines that the sub-block b of interest includes an attack. The block power correcting unit 324*c* performs a correction of an audio signal of the sub-block b including an attack. The block power correcting unit 324*c* adds a power of an audio signal of a sub-block immediately after the sub-block b of interest to a power of an audio signal of the sub-block b including an attack whereby a correction of the power of the audio signal of the sub-block b including an attack is performed in operation OP24. Note that "pow[b]" shown in the process in operation OP24 of FIG. 11 represents the power of the audio signal of the sub-block b of interest.

When the determination is negative in operation OP23, the sub-block b of interest does not include an attack. Therefore, the block power correcting unit 324*c* does not perform the correction of the power of the audio signal of the sub-block b. The block power correcting unit 324*c* proceeds to operation OP25.

Next, the block power correcting unit 324*c* adds 1 to the variable b representing a position of a sub-block in operation OP25. Then, in operation OP26, the block power correcting unit 324*c* determines whether the variable b obtained by adding 1 in operation OP25 is smaller than the number of sub-blocks M included in the frame. When the determination is affirmative in operation OP26, at least one sub-block has not been subjected to the power correcting process. Therefore, the block power correcting unit 324*c* returns to operation OP23. When the determination is negative in operation OP26, all the sub-blocks included in the frame have been subjected to the power correcting process. Therefore, the block power correcting unit 324*c* terminates the power correcting process.

The block power correcting unit 324*c* outputs the powers of the audio signals of the sub-blocks included in the frame which have been subjected to the power correcting process to the power change ratio calculating unit 325.

The power change ratio calculating unit 325 obtains the powers of the audio signals of the sub-blocks included in the frame which have been subjected to the power correcting process from the block power correcting unit 324*c* as inputs. The power change ratio calculating unit 325 calculates power change ratios of the sub-blocks using the powers of the audio signals of the sub-blocks included in the frame in accordance with Expressions 2 and 3, for example. The power change ratio calculating unit 325 outputs the calculated power change ratios of the sub-blocks to the attack determining unit 326 and the grouping determining unit 327.

The attack determining unit 326 obtains the power change ratios of the sub-blocks supplied from the power change ratio calculating unit 325 as inputs. The attack determining unit 326 compares the attack detecting threshold value 1 (shown in FIG. 6) with each of the power change ratios of the sub-blocks. When each of the power change ratios of the sub-blocks is larger than the threshold value 1, the attack determining unit 326 determines that an attack detecting result of the sub-block of interest corresponds to "attack[b]=1". When each of the power change ratios of the sub-blocks is equal to or smaller than the threshold value 1, the attack determining unit 326 determines that the attack detecting result of the sub-block of interest corresponds to "attack[b]=0". A value 0 or 1 is assigned to the attack detecting result attack[b]. When the attack detecting result attack[b] is 0, any attack is included in the sub-block b. When the attack detecting result attack[b] is 1, an attack is included in the sub-block b. The attack determining unit 326 outputs attack detecting results attack [b] of the sub-blocks to the grouping determining unit 327 and the block determining unit 33 (shown in FIG. 3).

In accordance with the attack detecting results, the block determining unit 33 determines whether orthogonal transform is to be performed in a unit of a short block or a unit of a long block. When at least one of the sub-blocks corresponds to the attack detecting result attack[b] of 1, That is, when an attack is detected in the frame, the block determining unit 33 determines that the orthogonal transform is performed in a unit of a short block. When the attack detecting results of all the sub-blocks correspond to the attack detecting results attack[b] of 0, the block determining unit 33 determines that the orthogonal transform is performed in a unit of a long block. The block determining unit 33 outputs a block determining result which is a result of the determination as to whether the orthogonal transform is performed in a unit of a short block or a long block to the orthogonal transform unit 34.

The orthogonal transform unit 34 obtains the input audio signals for one frame process supplied from the frame dividing unit 31 and the block determining result supplied from the block determining unit 33 as inputs. When the block determination result represents a unit of a short block, the orthogonal transform unit 34 performs the orthogonal transform on the audio signals included in the frame in a unit of a short block. When the block determination result represents a unit of a long block, the orthogonal transform unit 34 performs the orthogonal transform on the audio signals included in the frame in a unit of a long block. The orthogonal transform unit 34 outputs the audio signals included in the frame which have been subjected to the orthogonal transform to the grouping unit 35.

The grouping determining unit 327 obtains the attack detecting results attack[b] of the sub-blocks and the power change ratios of the sub-blocks as inputs. The grouping determining unit 327 determines a grouping using a grouping determining threshold value 4. The grouping determining threshold value 4 is equal to or larger than the attack detecting threshold value 1. For example, when the attack detecting threshold value 1 is included in a range from 10 to 25, the grouping determining threshold value 4 is set in a range from 70 to 170.

Figure 12:
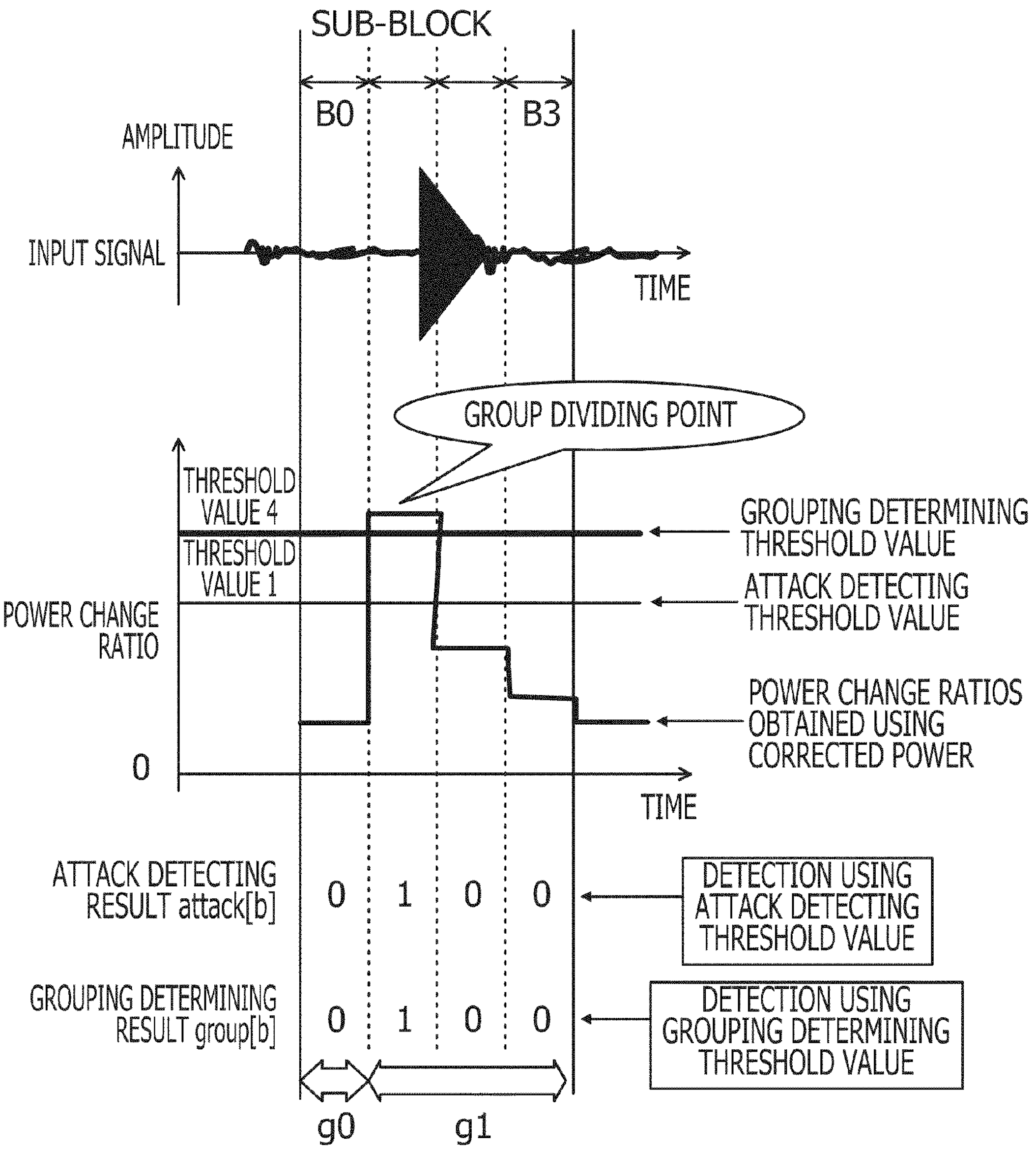
FIG. 12 is a diagram illustrating an example of a grouping determining process.

FIG. 12 is a diagram illustrating an example of a grouping determining process performed by the grouping determining unit 327. A waveform of input audio signals shown in FIG. 12 is the same as that of the input audio signals shown in FIG. 6. In the example shown in FIG. 12, the attack detecting results attack[b] of the sub-blocks and grouping determining results group[b] are shown below a graph of the power change ratios of the input audio signals.

The grouping determining unit 327 compares each of the power change ratios of the sub-blocks with the grouping determining threshold value 4. The grouping determining unit 327 sets a grouping determining result group[b] of a sub-block having a power change ratio larger than the grouping determining threshold value 4 to 1. The grouping determining unit 327 sets a grouping determining result group[b] of a sub-block having a power change ratio equal to or smaller than the grouping determining threshold value 4 to 0. The grouping determining unit 327 obtains grouping determining results group[b] of all the sub-blocks included in the frame. A value 0 or 1 is assigned to each of the grouping determining results group[b].

The grouping unit 35 which obtains the grouping determining results group[b] of the sub-blocks supplied from the grouping determining unit 327 sets a grouping boundary between, among the sub-blocks, a sub-block having a grouping determining result group[b] of 0 and a sub-block having a grouping determining result group[b] of 1 which are consecutive two sub-blocks arranged in this order.

In the example shown in FIG. 12, since a grouping determining result group[B0] of the sub-block B0 is 0 and a grouping determining result group[B1] of the sub-block B1 is 1, a boundary between the sub-blocks B0 and B1 is selected as a grouping boundary. The grouping unit 35 classifies the sub-block B0 to a group g0 and the sub-blocks B1 to B3 to a group g1. That is, in an embodiment, since each of the sub-blocks has a time length equal to a short block, the group g0 includes a short block w0 and the group g1 includes short blocks w1 to w3.

Figure 13:
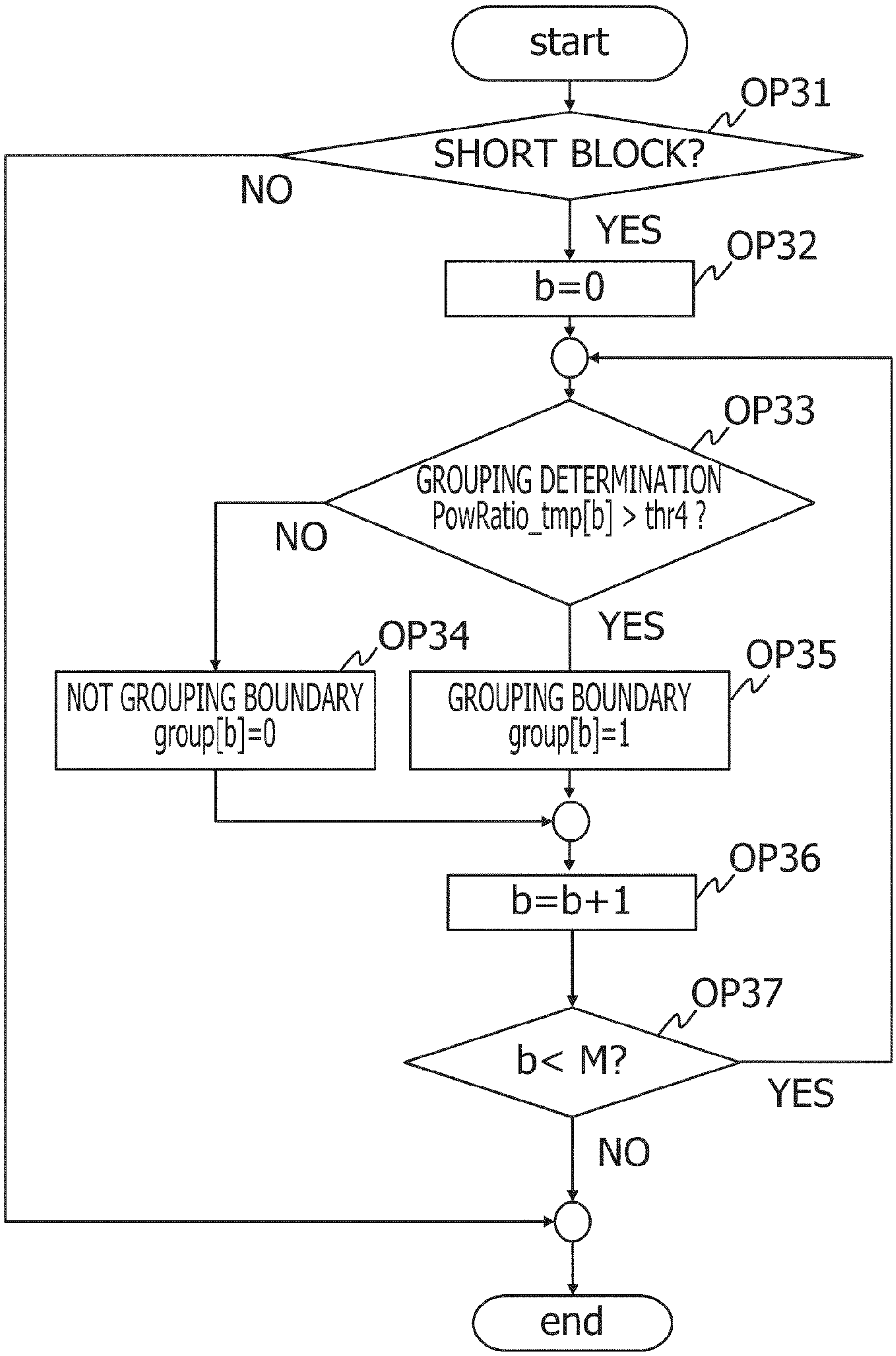
FIG. 13 is a flowchart illustrating another example of a grouping determining process.

FIG. 13 is a flowchart illustrating the example of the grouping determining process shown in FIG. 12 performed by the grouping determining unit 327. When obtaining the attack detecting results attack[b] of the sub-blocks and the power change ratios of the sub-blocks as inputs, the grouping determining unit 327 starts the grouping determining process.

The grouping determining unit 327 determines whether a grouping is to be performed in a unit of a short block or a unit of a long block in operation OP31. The grouping determining unit 327 determines whether the frame includes an attack, that is, whether at least one of the sub-blocks corresponds to an attack detecting result attack[b] of 1. When the determination is affirmative in operation OP31, the grouping determining unit 327 determines that a grouping is performed in a unit of a short block.

When the determination is negative in operation OP31, the grouping determining unit 327 determines that a grouping is performed in a unit of a long block, that is, a grouping is not performed. Therefore, the grouping determining unit 327 terminates the grouping determining process.

Next, the grouping determining unit 327 sets an initial value of the variable b representing a position of a sub-block to 0 in operation OP32.

The grouping determining unit 327 obtains a power change ratio PowRatio[b] of the sub-blocks b in accordance with Expressions 2 and 3, for example. The grouping determining unit 327 determines whether the power change ratio PowRatio[b] of the sub-block b is larger than the grouping determining threshold value 4 in operation OP33. When the determination is negative in operation OP33, the grouping determining unit 327 determines that the sub-block does not correspond to a grouping boundary in operation OP34. The grouping determining unit 327 sets a grouping determining result of the sub-block b to 0 in operation OP34. Thereafter, the process proceeds to operation OP36.

When the determination is affirmative in operation OP33, the grouping determining unit 327 determines that the sub-block b corresponds to a grouping boundary in operation OP35. The grouping determining unit 327 sets the grouping determining result group[b] of the sub-block b to 1 in operation OP35. Thereafter, the process proceeds to operation OP36.

The grouping determining unit 327 adds 1 to the variable b representing a position of a sub-block in operation OP36. Then, the grouping determining unit 327 determines whether the variable b is smaller than the number of sub-blocks M included in the frame in operation OP37. That is, the grouping determining unit 327 determines whether grouping determining results of all the sub-blocks included in the frame have been obtained.

When the determination is affirmative in operation OP37, a grouping determining result of at least one of the sub-blocks has not been obtained. The grouping determining unit 327 repeatedly performs the processes OP33 to 37 until grouping determining results of remaining sub-blocks are obtained.

When the determination is negative in operation OP37, grouping determining results of all the sub-blocks included in the frame have been obtained. The grouping determining unit 327 outputs the grouping determining results group[b] of all the sub-blocks included in the frame to the grouping unit 35, and the grouping determining process is terminated.

Figure 14:
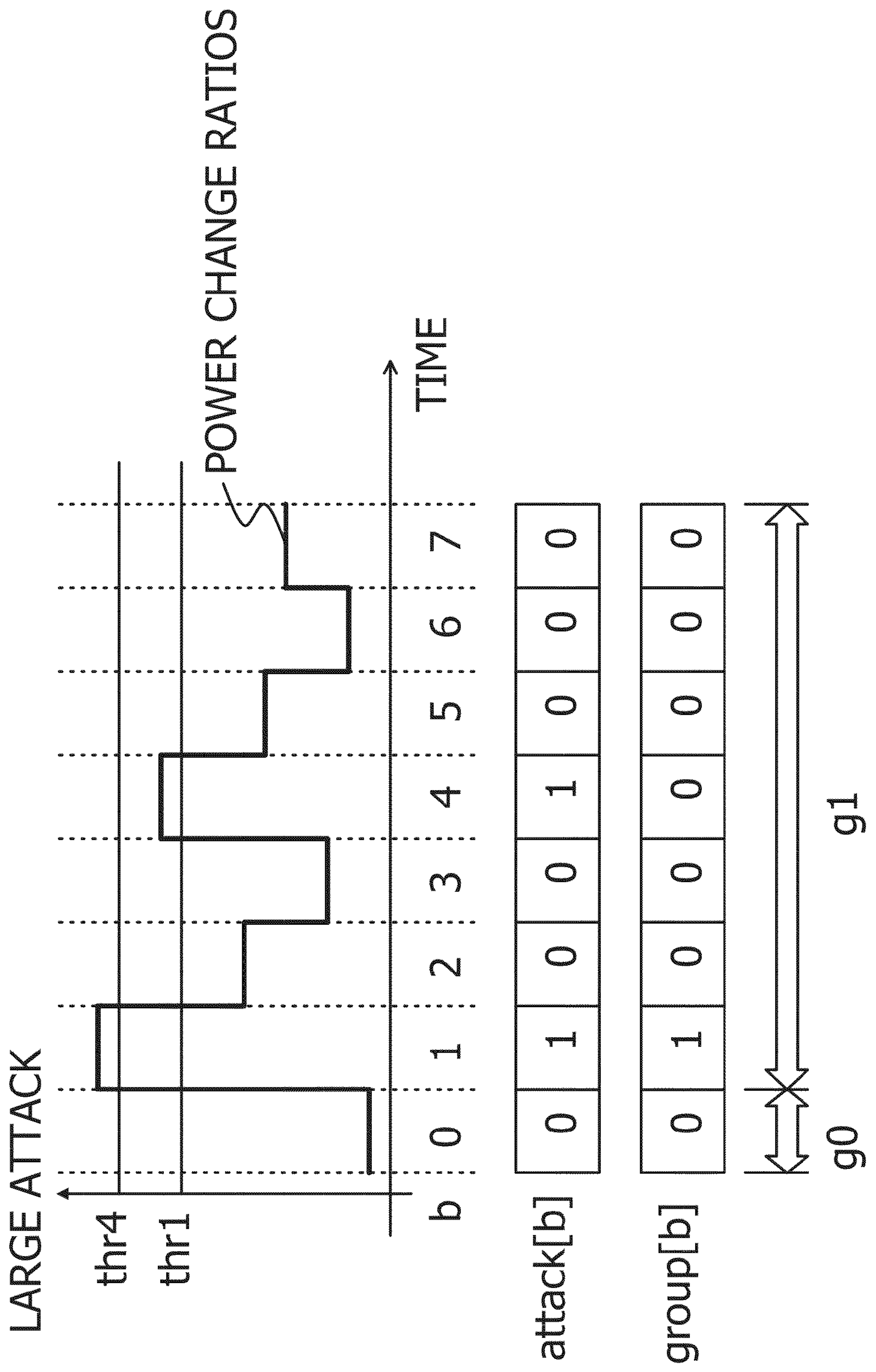
FIG. 14 is a diagram illustrating a result of a grouping determining process.

FIG. 14 is a diagram illustrating a result of the grouping determining process performed by the grouping determining unit 327. In the example shown in FIG. 14, a frame is divided into eight blocks including sub-blocks B0 to B7 (short blocks w0 to w7). In the example shown in FIG. 14, the frame includes two attacks and the attacks are included in the sub-blocks B1 and B4. Furthermore, in the example shown in FIG. 14, the grouping determining threshold value 4 is larger than the attack detecting threshold value 1.

In the example shown in FIG. 14, the sub-blocks B1 and B4 include power change ratios larger than the attack detecting threshold value 1. The power change ratio of an audio signal of the sub-block B1 is larger than the grouping determining threshold value 4. On the other hand, the power change of an audio signal of the sub-block B4 is not larger than the grouping determining threshold value 4. Therefore, as a result of the grouping determining process described with reference to FIGS. 12 and 13, a grouping determining result group[B1] of the sub-block B1 is 1, and a grouping determining result group[B4] of the sub-block B4 is 0. That is, although a boundary between the sub-blocks B0 and B1 is selected as a grouping boundary, a boundary between the sub-blocks B3 and B4 is not selected as a grouping boundary.

Therefore, in the example shown in FIG. 14, the grouping unit 35 performs a grouping such that a group g0 includes the sub-block B0 and a group g1 includes sub-blocks B1 to B7.

Accordingly, in a case where two or more attacks are included in one frame, when the grouping determining threshold value 4 which is larger than the attack detecting threshold value 1 is used, one of the attacks having a higher power than the others can be preferentially used for a grouping. As a power of an attack is higher, human beings who listen sound can recognize a deterioration of audio quality. Therefore, when a grouping is performed preferentially using an attack having a higher power, subjective audio quality can be improved. Furthermore, in a case where two or more attacks are included in one frame, when a grouping is performed preferentially (on sub-blocks having power change ratios larger than the threshold value 4) using one of the attacks which has a higher power, the number of groups is reduced and efficiency of encoding is improved when compared with a case where a grouping is performed on each of the attacks.

The grouping unit 35 obtains the audio signals for one frame process which have been subjected to the orthogonal transform and which have been supplied from the orthogonal transform unit 34 and the grouping determining results of the sub-blocks supplied from the attack detecting unit 32 (grouping determining unit 327) as grouping determining results of the sub-blocks. The grouping unit 35 determines a boundary between a sub-block corresponding to a grouping determining result group[b] of 0 and a sub-block corresponding to a grouping determining result group[b] of 1 which are consecutive sub-blocks arranged in this order as a grouping boundary, and a grouping is performed. The grouping unit 35 performs a grouping on the audio signals for one frame process which have been subjected to the orthogonal transform and outputs results of the grouping to the quantizing unit 36.

The quantizing unit 36 obtains the audio signals for one frame process which have been subjected to the grouping as inputs and performs quantization for individual groups. The audio signals for one frame process which have been quantized are supplied to the bit-stream generating unit 37 which encodes the supplied audio signals so as to obtain a bit stream. The audio signals for one frame process which have been encoded are supplied through the output unit 38 to the main storage device 2 and stored as part of the MPEG-2 AAC file.

The audio encoding apparatus 1 according to an embodiment detects an attack candidate sub-block which is likely to include an attack when an audio file is converted into an MPEG-2 AAC file. The audio encoding apparatus 1 examines the detected attack candidate sub-block in detail on a sample-by-sample basis so as to determine whether an attack starting point is included in one of the attack candidate sub-block and a sub-block immediately before the attack candidate sub-block. Furthermore, the audio encoding apparatus 1 corrects a power of an audio signal of the attack candidate sub-block or the sub-block immediately before the attack candidate sub-block which includes the attack starting point. The audio encoding apparatus 1 calculates a power change ratio in accordance with the power of the audio signal of the corrected sub-block, and determines whether an attack is included in one of the attack candidate sub-block and the sub-block immediately before the attack candidate sub-block. Accordingly, since the power of the audio signal of the attack candidate sub-block or the sub-block immediately before the attack candidate sub-block which includes the attack starting point is corrected, an accuracy of the attack detection is improved. Since the accuracy of the attack detection is improved, an appropriate grouping is performed. Since the appropriate grouping is performed, a generation of a pre-echo caused by a quantization error can be suppressed and audio quality when encoded audio data is reproduced is improved.

Furthermore, the grouping determining unit 327 included in the audio encoding apparatus 1 may use the grouping determining threshold value 4 which is larger (more strict) than the attack detecting threshold value 1 in the grouping determining process. When the grouping determining threshold value 4 which is larger than the attack detecting threshold value 1 is used, even if two or more attacks are included in one frame, a grouping is performed preferentially using one of the attacks which has a higher power (a sub-block having a power change ratio larger than the threshold value 4). Since a grouping is performed preferentially using one of the attacks which has a higher power, the number of groups can be reduced and efficiency of encoding is improved.

Figure 15:
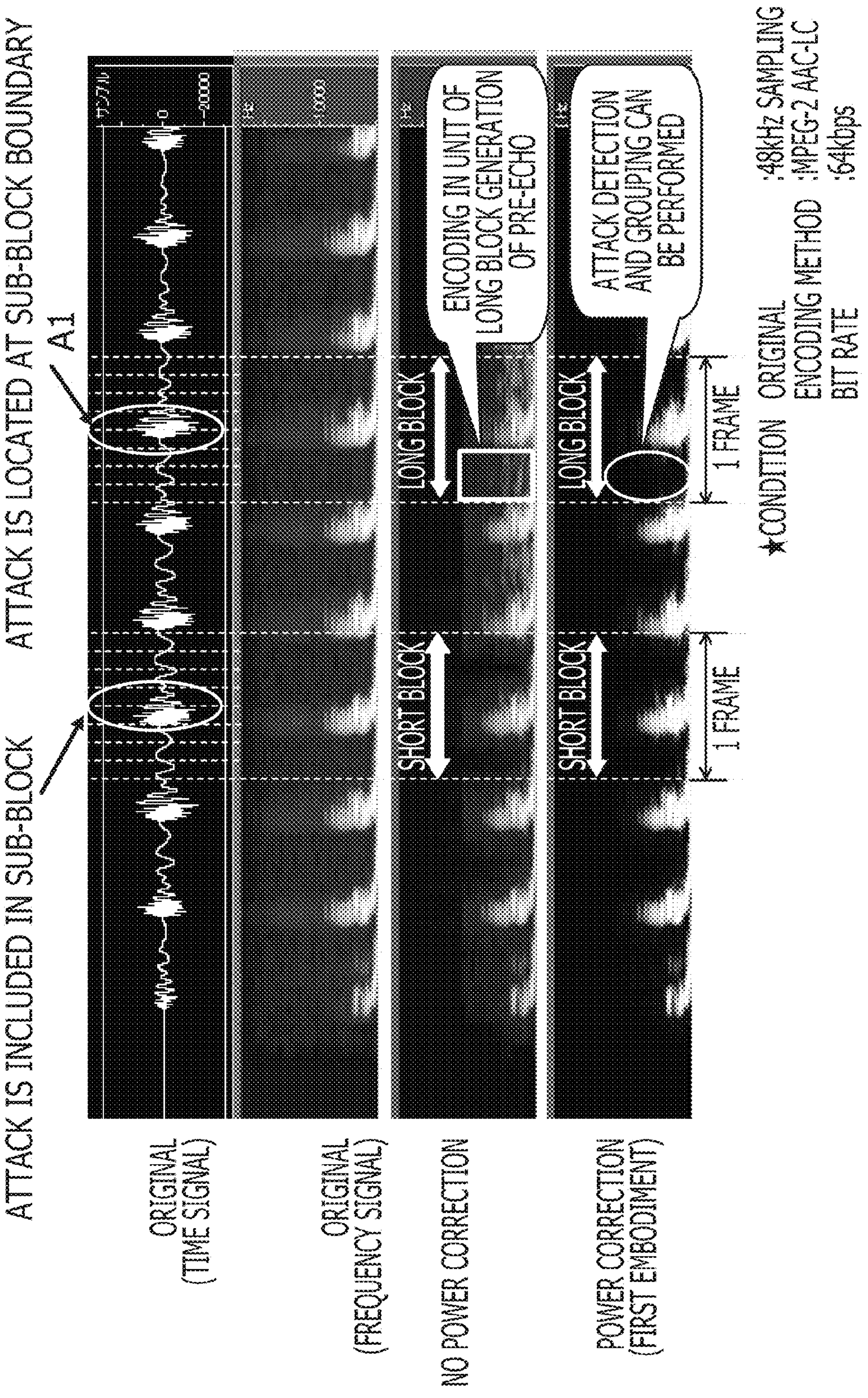
FIG. 15 is a diagram illustrating an example of a result of an execution of audio encoding performed by an audio encoding apparatus.

FIG. 15 is a diagram illustrating an example of a result of an execution of audio encoding performed by the audio encoding apparatus 1. In FIG. 15, a waveform of a time signal of an audio signal (original) and a waveform of a frequency signal of the audio signal (original) are shown. Furthermore, FIG. 15 includes a waveform of a frequency signal of a reproduced audio signal of the original which has been encoded in accordance of the MPEG-2 AAC-LC (Low Complexity) using an apparatus which does not perform a correction of a power of an audio signal of an attack candidate sub-block or a sub-block immediately before the attack candidate. FIG. 15 further includes a frequency signal of a reproduced audio signal of the original which has been encoded in accordance with the MPEG-2 AAC-LC using the audio encoding apparatus 1 according to an embodiment. These waveforms of the audio signals are shown in the same time axis. In FIG. 15, the original corresponds to an audio signal which has been subjected to sampling in 48 kHz. Moreover, in FIG. 15, encoding is performed using the MPEG-2 AAC-LC and a bit rate of 64 kbps, for example, as an encoding method.

In FIG. 15, in the waveform of the original, an attack A1 denoted by a circle is positioned at a block boundary. When the waveform of the audio signal encoded without performing a correction of a power of an audio signal of a sub-block is focused on, a waveform caused by a pre-echo is generated before the attack A1. It is considered that the pre-echo is generated since the audio encoding apparatus 1 did not detect the attack A1 positioned at the block boundary and encoding was performed in a unit of a long block.

On the other hand, when the waveform of the audio signal encoded using the audio encoding apparatus 1 according to an embodiment is focused on, any waveform is not detected before the attack A1 and a pre-echo is not generated. That is, since the audio encoding apparatus 1 of an embodiment detects the attack A1 and encoding is performed after performing a grouping on the basis of a short block, a generation of a pre-echo is prevented.

As described above, according to the audio encoding apparatus 1 of an embodiment, deterioration of audio quality can be suppressed when an audio signal is encoded, and accordingly, audio quality obtained when the encoded audio signal is improved.

In an embodiment, the audio encoding apparatus 1 using the MPEG-2 AAC is described. However, an encoding technique to be employed in the audio encoding apparatus 1 is not limited to the MPEG-2 AAC. Examples of the encoding technique to be employed in the audio encoding apparatus 1 include the MPEG-4 AAC, the MPEG-2 HE-AAC, the MPEG-4 HE-AAC, the MPEG-4 HE-AAC v2, the MPEG Surround, and the MPEG-4 BSAC.

Figure 16:
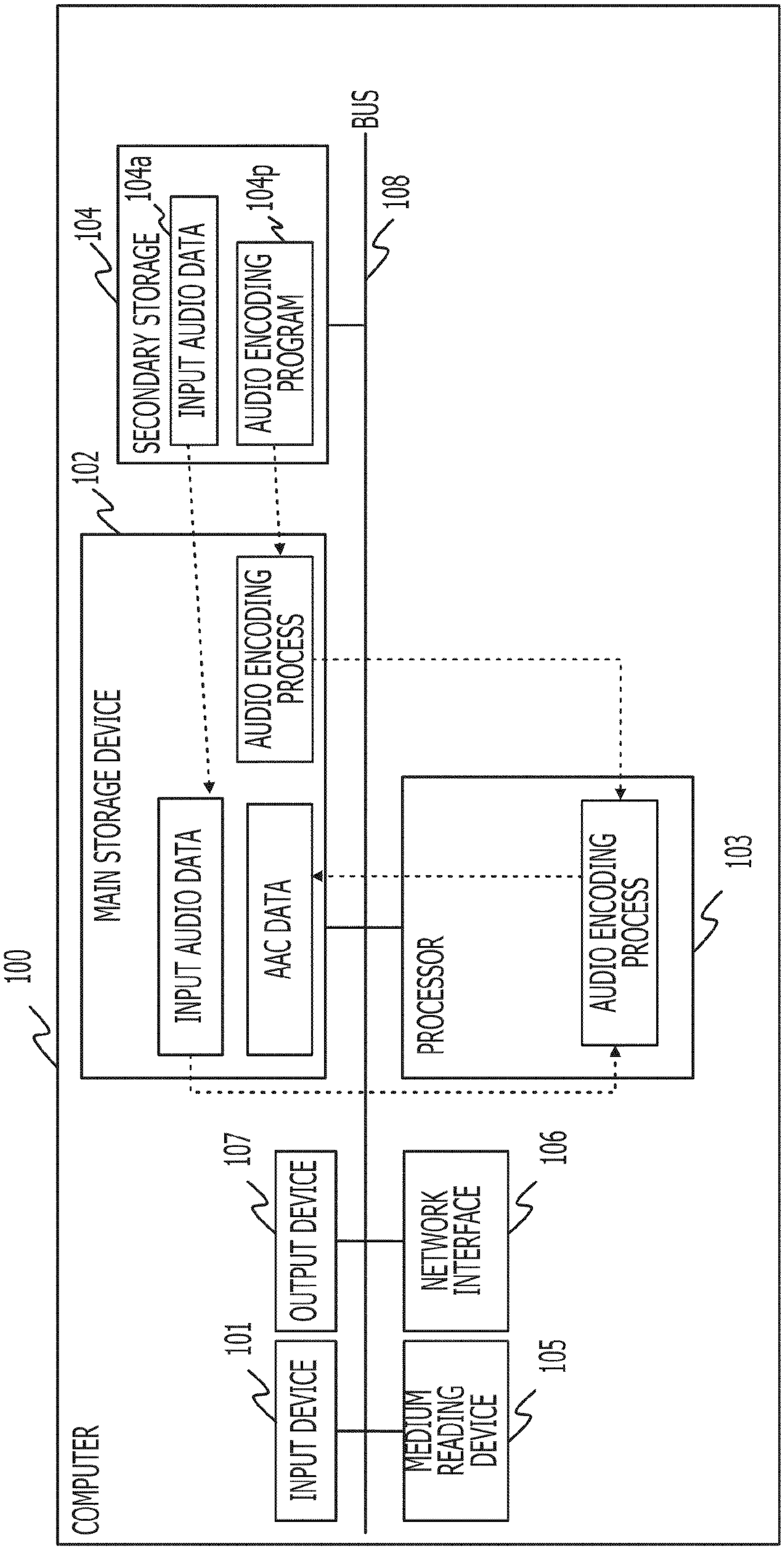
FIG. 16 is a diagram illustrating an example of a hardware configuration of an audio encoding apparatus.

FIG. 16 is a diagram illustrating an example of a hardware configuration of the audio encoding apparatus 1 according to an embodiment. An information processing apparatus (computer) may be employed as the audio encoding apparatus 1 of an embodiment. Examples of the information processing apparatus include a general computer such as a personal computer and a dedicated computer which performs encoding on audio signals. Furthermore, as the audio encoding apparatus 1, an apparatus capable of recording audio signals supplied from a video camera and a music player as digital data is employed.

An audio encoding apparatus 100 serving as the audio encoding apparatus 1 includes an input device 101, a main storage device 102, a processor 103, a secondary storage device 104, a medium reading device 105, a network interface 106 serving as an interface device to be connected to peripherals, and an output device 107. These devices are connected to one another through a bus 108. The main storage device 102 and the secondary storage device 104 are computer readable recording media.

In the audio encoding apparatus 100 the processor 103 loads an audio encoding program 104*p* stored in the secondary storage device 104 to a working area of the main storage device 102 and executes the audio encoding program 104*p*. When the audio encoding program 104*p* is executed, the peripherals are controlled. By this, functions for predetermined usages are realized.

The processor 103 includes a CPU (Central Processing Unit) or a DSP (Digital Signal Processor). The main storage device 102 includes a RAM (Random Access Memory) or a ROM (Read Only Memory).

The secondary storage device 104 includes an EPROM (Erasable Programmable ROM) or a hard disk drive.

Furthermore, the audio encoding apparatus 100 includes the medium reading device 105 and can read data from a removable medium, i.e., a portable recording medium, which is a computer readable recording medium inserted into the medium reading device 105. Examples of the removable medium include a USB (Universal Serial Bus) memory or a disk recording medium such as a CD (Compact Disc) or a DVD (Digital Versatile Disc).

The network interface 106 is connected to a wired network and a wireless network. The network interface 106 corresponds to a LAN (Local Area Network) interface board or a wireless communication circuit used for a wireless communication.

Furthermore, the peripherals include the input device 101 such as a keyboard and a pointing device and the output device 107 such as a display device and a printer. When a user operates the input device 101, the audio encoding program 104*p* is activated. Furthermore, the output device 107 is provided with an operation screen, for example, for the user used to operate the audio encoding program 104*p*.

Furthermore, the input device 101 may include an audio input device such as a microphone. Audio collected by the microphone may be stored in the secondary storage device 104. Furthermore, audio data stored in the secondary storage device 104 may be converted into a digital audio data through analog-to-digital conversion. The audio data which has been collected by the microphone and converted into a digital signal through the analog-to-digital conversion may be encoded by executing the audio encoding program 104*p* so that an MPEG-2 AAC file is obtained. Furthermore, the output device 107 may include an audio output device such as a speaker and may output a reproduced audio of the MPEG-2 AAC file generated in accordance with the audio encoding program 104*p*.

By controlling the peripherals in accordance with an audio encoding process of the audio encoding program 104*p* executed by the processor 103, the computer used as the audio encoding apparatus 100 realizes functions of the frame dividing unit 31, the attack detecting unit 32, the block determining unit 33, the orthogonal transform unit 34, the grouping unit 35, the quantizing unit 36, the bit-stream generating unit 37, and the output unit 38. Furthermore, by performing the audio encoding process of the audio encoding program 104*p* executed by the processor 103, the computer used as the audio encoding apparatus 100 realizes functions of the sub-block dividing unit 322, the block power calculating unit 323, the correcting unit 324, the power change ratio calculating unit 325, the attack determining unit 326, and the grouping determining unit 327. Moreover, by executing the audio encoding program 104*p* included in the computer readable recording medium using the processor 103, the computer used as the audio encoding apparatus 100 realizes functions of the attack candidate determining unit 324*a*, the attack examining unit 324*b*, and the block power correcting unit 324*c*. The memory 324*m* is generated in a storage region of the main storage device 102 or the secondary storage device 104 statically or in the course of the execution of the program.

The attack candidate determining unit 324*a*, the attack examining unit 324*b*, and the block power correcting unit 324*c* according to an embodiment may individually perform processes described below.

Figure 17A:
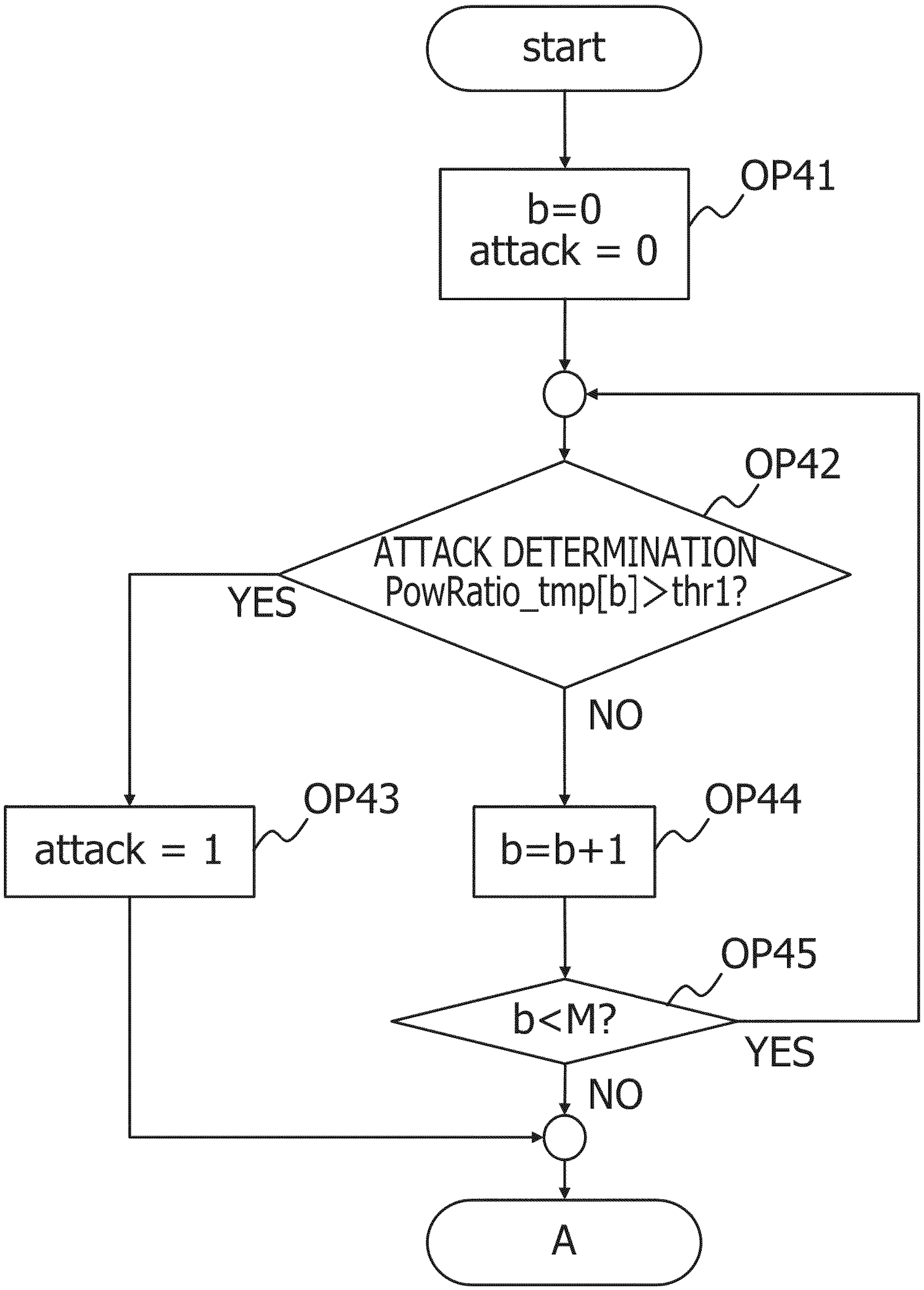
FIGS. 17A and 17B are flowcharts illustrating an attack-candidate detecting process.
Figure 17B:
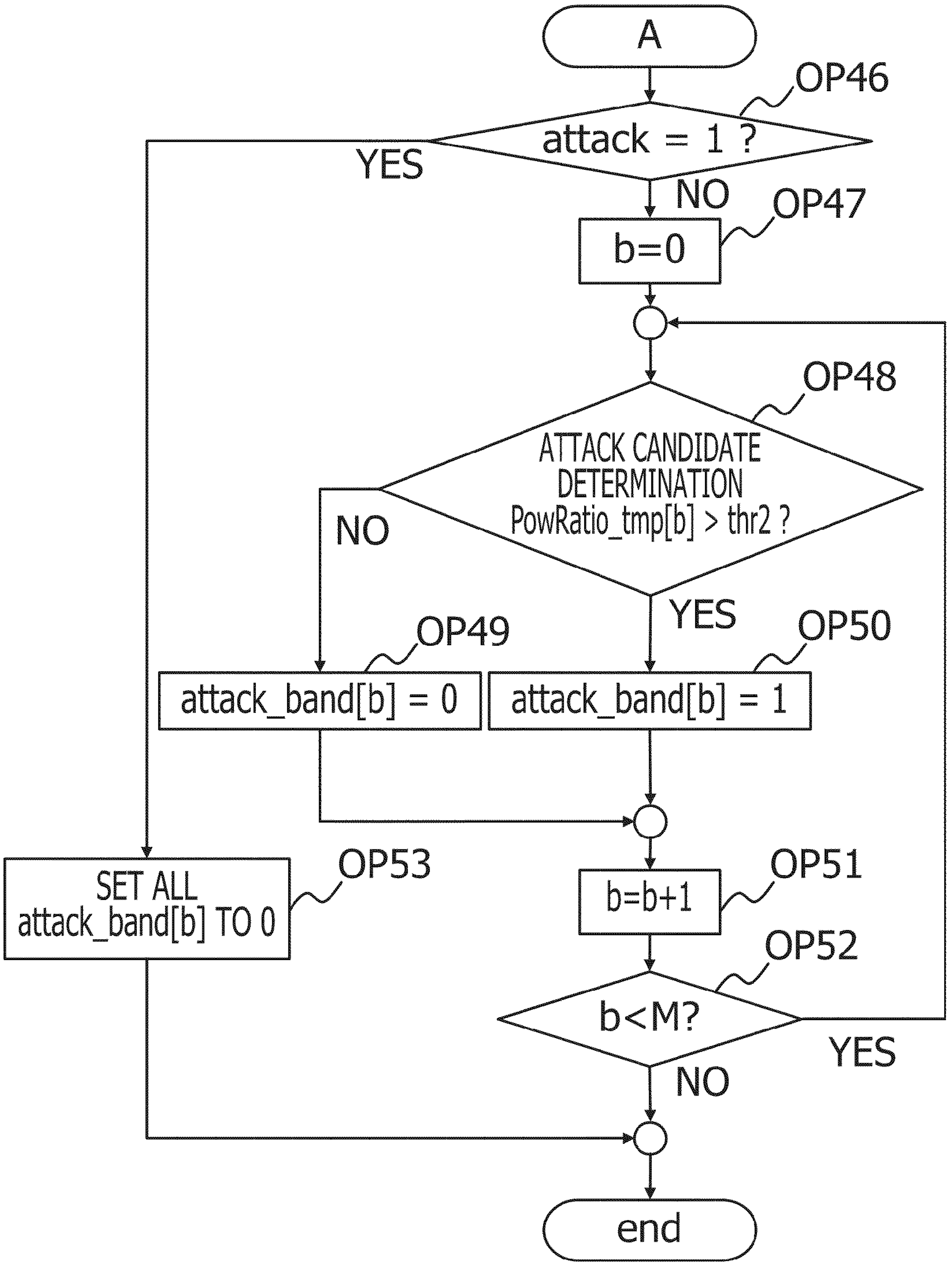

FIGS. 17A and 17B are flowcharts illustrating an attack-candidate detecting process executed by an attack candidate determining unit 324*a* according to a first modification of an embodiment. When obtaining powers of audio signals of sub-blocks included in a frame as inputs, the attack candidate determining unit 324*a* starts the attack candidate detecting process.

In operation OP41, the attack candidate determining unit 324*a* sets a variable b representing a position of a sub-block to 0 as an initial value. When the frame is divided into eight sub-blocks, the variable b is included in a range from 0 to 7. Furthermore, in operation OP41, the attack candidate determining unit 324*a* sets a variable attack representing whether an attack is included in the frame to 0 as an initial value. A variable attack of 0 represents that the frame does not include any attack. A variable attack of 1 represents that the frame includes an attack.

The attack candidate determining unit 324*a* obtains a power change ratio PowRatio_tmp[b] of a sub-block using Expressions 2 and 3, for example. The attack candidate determining unit 324*a* determines whether the power change ratio PowRatio_tmp[b] of a sub-block b is larger than a threshold value 1 (thr1) in operation OP42.

When the determination is affirmative in operation OP42, the sub-block b includes an attack. Since it is determined that the sub-block b includes an attack, that is, the frame includes an attack, the variable attack is updated to 1 in operation OP43. Then, the process proceeds to operation OP46.

When the determination is negative in operation OP42, the attack candidate determining unit 324*a* adds 1 to the variable b in operation OP44. The attack candidate determining unit 324*a* determines whether the variable b is smaller than the number of sub-blocks M included in the frame in operation OP45.

When the determination is affirmative in operation OP45, the attack candidate determining unit 324*a* returns to operation OP42 and the processes in operation OP42 to operation OP45 are performed again on the next sub-block.

When the determination is negative in operation OP45, the process of operation OP42 has been performed on all the sub-blocks included in the frame. The attack candidate determining unit 324*a* proceeds to operation OP46.

In operation OP46, the attack candidate determining unit 324*a* determines whether the variable attack is 1. When the determination is affirmative in operation OP46, the frame includes an attack. Therefore, the attack candidate determining unit 324*a* does not detect an attack candidate sub-block. The attack candidate determining unit 324*a* sets attack_band [b] representing whether a sub-block corresponds to an attack candidate of all the sub-blocks to 0 in operation OP53. The attack candidate determining unit 324*a* outputs attack candidate detecting results attack_band[b] of all the sub-blocks to an attack examining unit 324*b*, and the attack candidate detecting process is terminated. When attack_band[b] is 0, the sub-block b is not an attack candidate. When attack_band [b] is 1, the sub-block b is an attack candidate.

When the determination is negative in operation OP46, the frame does not include an attack. Next, the attack candidate determining unit 324*a* performs a process of detecting an attack candidate. The attack candidate determining unit 324*a* sets the variable b representing a position of a sub-block to 0 in operation OP47.

Next, the attack candidate determining unit 324*a* determines whether the power change ratio PowRatio_tmp[b] of the sub-block b is larger than an attack candidate detecting threshold value 2 (thr2) in operation OP48. That is, the attack candidate determining unit 324*a* determines whether the sub-block b is an attack candidate.

When the determination is negative in operation OP48, the sub-block b is not an attack candidate. The attack candidate determining unit 324*a* records an attack candidate detecting result attack_band[b] of 0 of the sub-block b in operation OP49. Thereafter, the process proceeds to operation OP51.

When the determination is affirmative in operation OP48, the sub-block is an attack candidate. The attack candidate determining unit 324*a* records an attack candidate detecting result attack_band[b] of 1 in operation OP50. Thereafter, the process proceeds to operation OP51.

Then, the attack candidate determining unit 324*a* adds 1 to the variable b representing a position of a sub-block in operation OP51. The attack candidate determining unit 324*a* determines whether the variable b is smaller than the number of sub-blocks M included in the frame in operation OP52. That is, the attack candidate determining unit 324*a* determines whether at least one sub-block has not been subjected to the attack candidate detecting process among the sub-blocks included in the frame. When the frame is divided into the eight sub-blocks, i.e., sub-blocks B0 to B7, the attack candidate determining unit 324*a* determines whether the variable b is smaller than 8.

When the determination is affirmative in operation OP52, at least one of the sub-blocks has not been subjected to the attack candidate detecting process. In this case, the attack candidate determining unit 324*a* returns to operation OP48 and the processes in operation OP48 to operation OP52 are performed again.

When the determination is negative in operation OP52, all the sub-blocks included in the frame have been subjected to the attack candidate detecting process. In this case, the attack candidate determining unit 324*a* outputs attack candidate detecting results attack_band[b] of all the sub-blocks to the attack examining unit 324*b*, and the attack candidate detecting process is terminated.

When receiving the attack candidate detecting results attack_band[b] of all the sub-blocks supplied from the attack candidate determining unit 324*a*, the attack examining unit 324*b* starts an attack specifying process.

Figure 18:
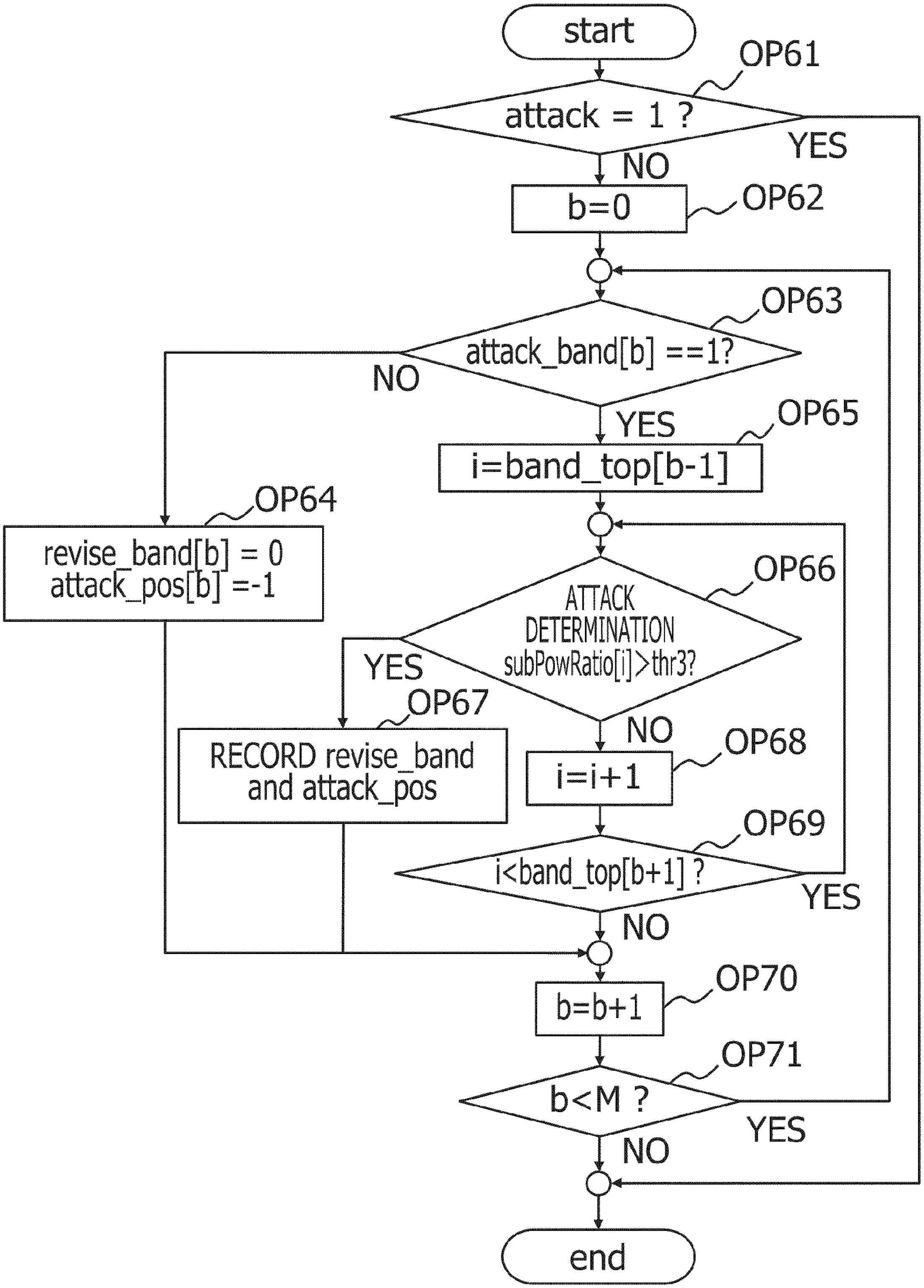
FIG. 18 is a flowchart illustrating an attack specifying process.

FIG. 18 is a flowchart illustrating the attack specifying process performed by the attack examining unit 324*b* according to the first modification.

The attack examining unit 324*b* determines whether a variable attack is 1 in operation OP61. When the determination is affirmative in operation OP61, the frame includes an attack. Therefore, the attack specifying process is not required to be performed by the attack examining unit 324*b*. The attack examining unit 324*b* terminates the attack specifying process.

When the determination is negative in operation OP61, the frame does not include an attack. The attack examining unit 324*b* sets the variable b representing a position of a sub-block to 0 as an initial value in operation OP62.

Next, the attack examining unit 324*b* determines whether an attack candidate detecting result attack_band[b] of the sub-block b is 1 in operation OP63. That is, the attack examining unit 324*b* determines whether the sub-block b is an attack candidate sub-block.

When the determination is negative in operation OP63, the sub-block b is not an attack candidate sub-block. The attack examining unit 324*b* records a power correction determining result revise_band[b] of 0 as a result of a determination as to whether a power correction is required to be performed on the sub-block b in operation OP64. When the power correction is not required to be performed on the sub-block b, the power correction determining result revise_band[b] represents 0. When the power correction is required to be performed on the sub-block b, the power correction determining result revise_band[b] is 1. Furthermore, the attack examining unit 324*b* records a variable attack_pos[b] representing a position of a sample including an attack starting point included in the sub-block b to −1 in operation OP64. The variable attack_pos [b] of −1 represents that the sub-block does not include a sample having an attack starting point. Thereafter, the attack examining unit 324*b* proceeds to operation OP70.

When the determination is affirmative in operation OP63, the sub-block b is an attack candidate sub-block. In this case, it is highly possible that an attack starting point is included in the sub-block b which is an attack candidate or a sub-block b−1 immediately before the sub-block b. The attack examining unit 324*b* examines the attack candidate sub-block b and the sub-block b−1 immediately before the sub-block b on a sample-by-sample basis in order to specify a sample including an attack starting point.

The attack examining unit 324*b* sets a variable i representing a position of a sample in the frame to band_top[b−1] as an initial value in operation OP65. The value band_top[b−1] represents a position of a beginning sample included in the sub-block b−1 immediately before the attack candidate sub-block b.

Next, the attack examining unit 324*b* calculates a power change ratio subPowRatio[i] of an audio signal included in a sample i, and determines whether the power change ratio subPowRatio[i] is larger than an attack starting point specifying threshold value 3 (thr3) in operation OP66. That is, the attack examining unit 324*b* determines whether an attack starting point is included in the sample i.

When the determination is affirmative in operation OP66, the sample i includes an attack starting point. The attack examining unit 324*b* records the power correction determining result revise_band and a variable attack_pos representing a position of the sample including an attack starting point in operation OP67. When the sample i is included in the attack candidate sub-block b, the attack examining unit 324*b* records a power correction determining result revise_band[b] of 1 and a variable attack_pos[b] representing a position of the sample including an attack starting point of i. When the sample i is included in the sub-block b−1 immediately before the attack candidate sub-block, the attack examining unit 324*b* records a power correction determining result revise_band[b−1] of 1 and a variable attack_pos[b−1] representing a position of the sample including an attack starting point of i. Thereafter, the process proceeds to operation OP70.

When the determination is negative in operation OP66, the sample i does not include an attack starting point. The attack examining unit 324*b* terminates the examining process performed in the sample i and adds 1 to the variable i representing a position of a sample in operation OP68 so as to examine the next sample.

The attack examining unit 324*b* determines whether the variable i representing a position of a sample is smaller than a value (band_top[b+1]) representing a position of a beginning sample of the sub-block b+1 following the sub-block which has been currently examined in operation OP69. That is, the attack examining unit 324*b* determines whether all the samples included in the sub-block b and the sub-block b−1 immediately before the sub-block b have been examined.

When the determination is affirmative in operation OP69, the sub-block b still includes at least one unexamined sample. The attack examining unit 324*b* performs the processes in operation OP66 to OP69 again.

When the determination is negative in operation OP69, all the samples included in the sub-block b have been examined. Then, the process proceeds to operation OP70.

When the attack detection of the sub-block b is terminated (after operation OP64 and operation OP67 and when the determination in operation OP 69 is affirmative), the attack examining unit 324*b* adds 1 to the variable b representing a position of a sub-block in operation OP70 in order to perform the attack detection on the next sub-block. The attack examining unit 324*b* determines whether the variable b representing a position of a sub-block is smaller than the number of sub-blocks M included in the frame in operation OP71. That is, the attack examining unit 324*b* determines whether the frame includes at least one sub-block which has not been subjected to the attack specifying process.

When the determination is affirmative in operation OP71, the frame includes at least one sub-block which has not been subjected to the attack specifying process. The attack examining unit 324*b* performs the processes in operation OP63 to operation OP70 again.

When the determination is negative in operation OP71, all the sub-blocks included in the frame have been subjected to the attack specifying process. The attack examining unit 324*b* outputs power correction determining results revise_band[b] and variables attack_pos[b] of all the sub-blocks to the block power correcting unit 324*c*, and the attack specifying process is terminated.

In the attack specifying process shown in FIG. 18, the attack examining unit 324*b* first performs a process of detecting an attack starting point on the sub-block immediately before the attack candidate sub-block. When an attack starting point is not detected in the sub-block immediately before the attack candidate sub-block, the attack examining unit 324*b* performs the process of detecting an attack starting point on the attack candidate sub-block. However, the attack examining unit 324*b* may perform the process of detecting an attack starting point on the attack candidate sub-block first, instead of the sub-block immediately before the attack candidate sub-block.

When receiving the power correction determining results revise_band[b] and the variables attack_pos[b] supplied from the attack examining unit 324*b*, a block power correcting unit 324*c* starts a power correcting process.

Figure 19:
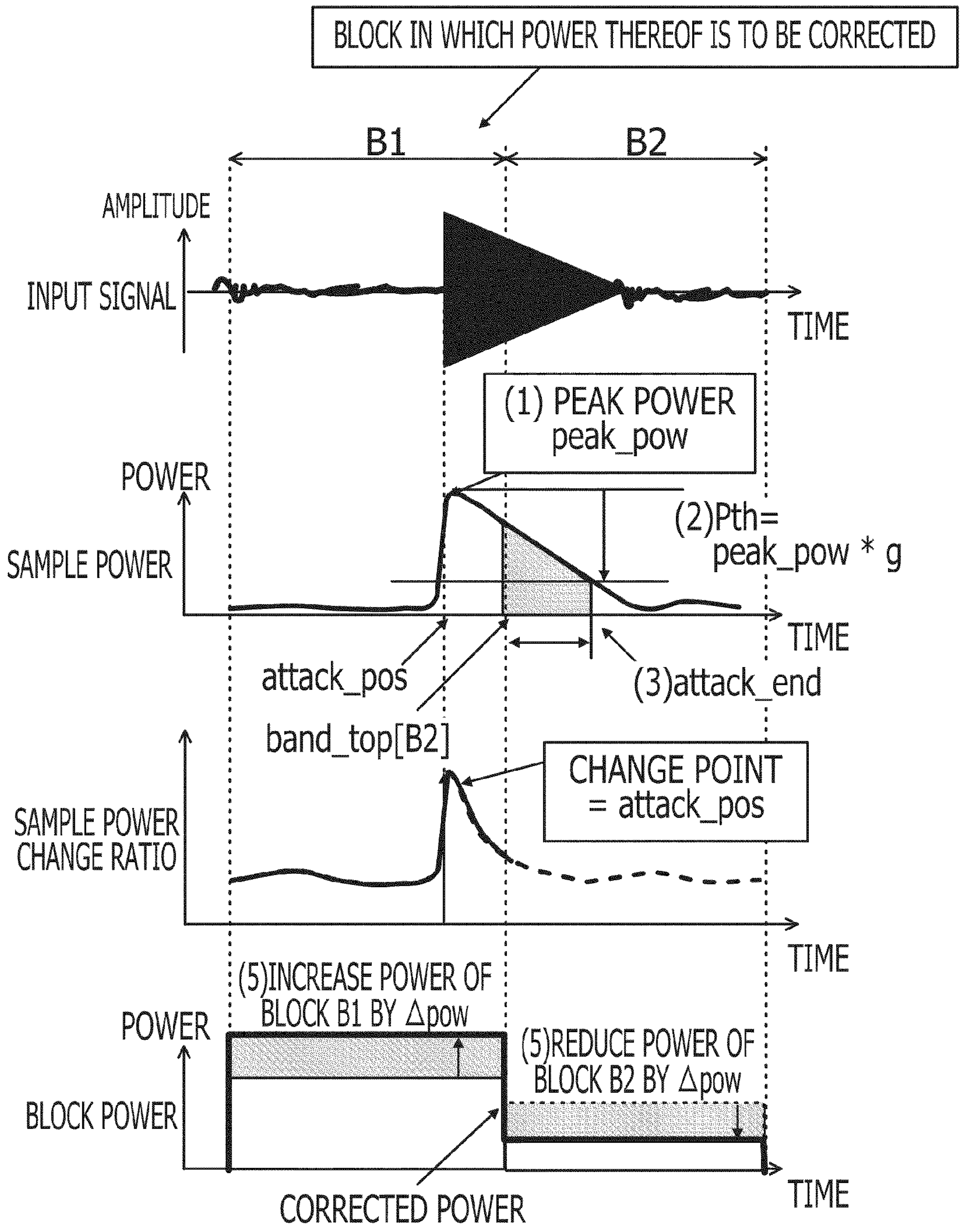
FIG. 19 is a diagram illustrating a power correcting process.

FIG. 19 is a diagram illustrating a power correcting process performed by the block power correcting unit 324*c* according to the first modification. In FIG. 19, the sub-blocks B1 and B2 in the example shown in FIG. 6 are extracted and shown. In an input audio shown in FIG. 19, an attack is included in the consecutive sub-blocks B1 and B2, and a power of the sub-block B1 should be corrected. The block power correcting unit 324*c* extracts only a power of the attack included in the sub-block B2 and performs a power correction on the sub-block B1.

(1) The block power correcting unit 324*c* sets a power of a sample attack_pos[b] including an attack starting point specified by the attack examining unit 324*b* to a peak power peak_pow.

(2) The block power correcting unit 324*c* determines a threshold value Pth of a power which attenuated by g[db] (g<0) from a peak power using Expression 5 below.

$$Pth = \text{peak\_}pow \times 10^{g/20} \qquad \text{Expression 5}$$

(3) The block power correcting unit 324*c* compares each of powers of samples with the threshold value Pth so as to detect a sample position attack_end corresponding to a power of a sample smaller than the threshold value Pth.

(4) The block power correcting unit 324*c* obtains a sum Δpow of powers of samples in a range from a beginning sample band_top[B2] of the sub-block B2 to the sample attack_end having the power smaller than the threshold value Pth using Expression 6 below.

$$\Delta pow = \sum_{i=band\_top[b]}^{attak\_end} \text{sample}(i) \qquad \text{Expression 6}$$

sample (i): a power of an audio signal included in a sample i (5) The block power correcting unit 324*c* adds the sum Δpow to the power of the sub-block B1 and subtracts the sum Δpow from the power of the sub-block B2 whereby correction is performed.

$$pow[B1] = pow[B1] + \Delta pow$$

$$pow[B2] = pow[B2] + \Delta pow \qquad \text{Expression 7}$$

By performing the correction as described above, the attack included in the consecutive sub-blocks B1 and B2 can be seen as if the attack is only included in the sub-block B1.

Figure 20:
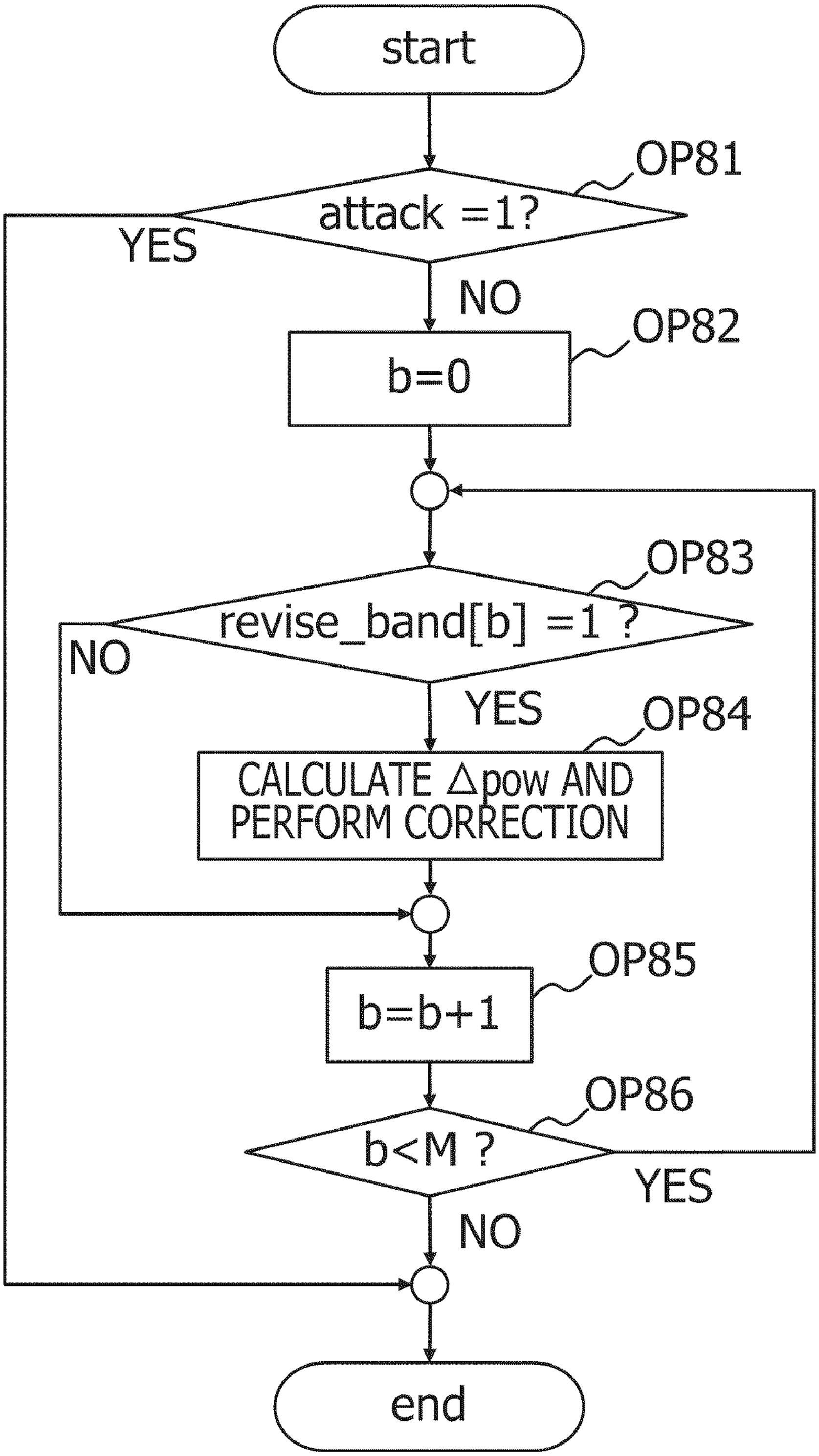
FIG. 20 is a flowchart illustrating a power correcting process.

FIG. 20 is a flowchart illustrating the power correcting process performed by the block power correcting unit 324*c* according to the first modification shown in FIG. 19.

The block power correcting unit 324*c* determines whether the variable attack representing that a frame includes an attack is 1 in operation OP81. When the determination is affirmative in operation OP81, the attack candidate determining unit 324*a* has determined that the frame includes an attack, that is, a sub-block having a power change ratio larger than the attack detecting threshold value 1 is included in the frame. Therefore, the power correcting process is not required to be performed by the block power correcting unit 324*c*. The block power correcting unit 324*c* terminates the power correcting process.

When the determination is negative in operation OP81, the block power correcting unit 324*c* sets the variable b representing a position of a sub-block to 0 as an initial value in operation OP82. The block power correcting unit 324*c* determines whether a power correction determining result revise_band[b] of the sub-block b is 1 in operation OP83. That is, the block power correcting unit 324*c* determines whether the power correcting process is required to be performed on the sub-block b.

When the determination is negative in operation OP83, the power correcting process is not required to be performed on the sub-block b. Then, the process proceeds to operation OP85.

When the determination is affirmative in operation OP83, the power correcting process is required to be performed on the sub-block b. The block power correcting unit 324*c* calculates the sum Δpow and performs the power correcting process on the sub-block b in operation OP84. As described in FIG. 19, the block power correcting unit 324*c* first obtains the threshold value Pth. Then, the block power correcting unit 324*c* obtains the sum Δpow. The block power correcting unit 324*c* adds the sum Δpow to the power of the sub-block b so as to correct the power of the sub-block b. In addition, the block power correcting unit 324*c* subtracts the sum Δpow from the power of the sub-block b+1 so as to correct the power of the sub-block b+1.

After the power correcting process performed on the sub-block b is terminated, the block power correcting unit 324*c* adds 1 to the variable b representing a position of a sub-block in operation OP85. The block power correcting unit 324*c* determines whether the variable b representing a position of a sub-block is smaller than the number of sub-blocks M included in the frame in operation OP86. That is, the block power correcting unit 324*c* determines whether a sub-block which has not been subjected to the power correcting process is included in the frame.

When the determination is affirmative in operation OP86, at least one of the sub-blocks included in the frame has not been subjected to the power correcting process. Then, the block power correcting unit 324*c* performs the processes in operation OP83 to operation OP86 again.

When the determination is negative in operation OP86, all the sub-blocks included in the frame have been subjected to the power correcting process. The block power correcting unit 324*c* outputs the powers of the sub-blocks which have been subjected to the power correcting process to the power change ratio calculating unit 325, and the power correcting process is terminated.

Thereafter, the audio signals are subjected to a grouping and encoding after an attack is detected in accordance with the powers of the sub-blocks which have been corrected.

The attack examining unit 324*b* of an embodiment examines the attack candidate sub-block and the sub-block immediately before the attack candidate sub-block on a sample-by-sample basis so as to perform a detection of an attack starting point. On the other hand, an attack examining unit 324*b* according to a second modification detects an attack starting point in a unit of a sub-block.

The attack examining unit 324*b* obtains an attack candidate detecting result attack_band supplied from an attack candidate determining unit 324*a* as an input. The attack examining unit 324*b* performs a process of detecting an attack starting point on an attack candidate sub-block and a sub-block immediately before the attack candidate sub-block.

First, the attack examining unit 324*b* obtains an average power avepow_short[b] of previous electric powers of the sub-block b. For example, the attack examining unit 324*b* obtains a weighted average shown in Expression 8 below using the average power avepow_short[b] of previous electric powers of the sub-block b.

$$avepow\_short[b]=\alpha\times avepow\_short[b-1]+(1-\alpha)\times pow[b-1] \qquad \text{Expression 8}$$

α: weight coefficient (=0.3)

In an embodiment, when the average power avepow[b] of previous electric powers is to be obtained using Expression 2, the attack candidate determining unit 324*a* sets a weight coefficient α to 0.7 and a weight of an average power avepow [b−1] of the electric powers of the sub-block b−1 immediately before the sub-block b is made large. On the other hand, the attack examining unit 324*b* according to the second modification can detect an abrupt change of a power caused by an attack by the large power weight of the sub-block b−1 immediately before the sub-block b.

Figure 21:
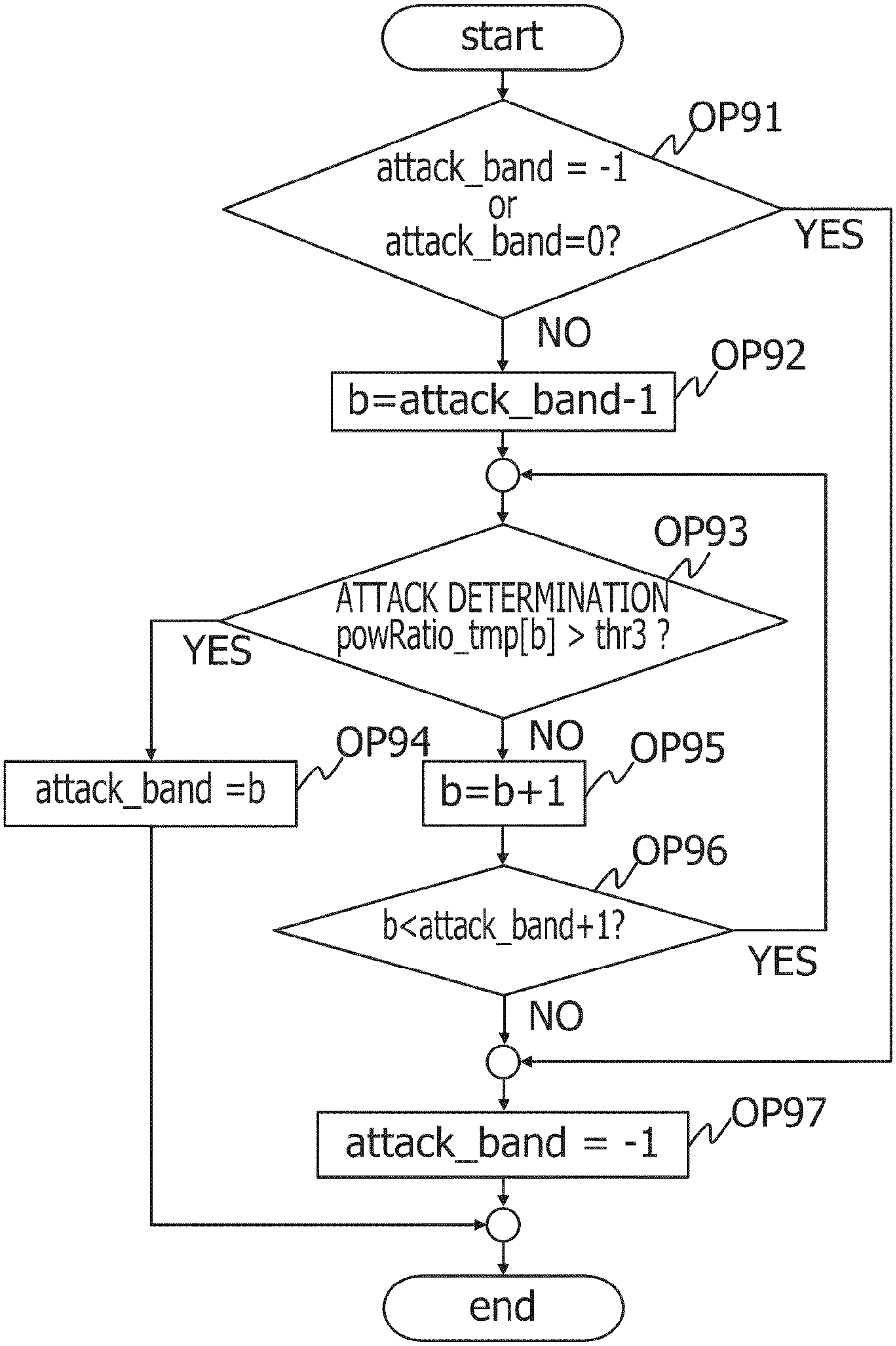
FIG. 21 is a flowchart illustrating an attack specifying process.

The attack examining unit 324*b* obtains a power change ratio powRatio_tmp[b] of the sub-block b using the past average power avepow_short[b] and the power of the sub-block b in accordance with Expression 9 below.

$$\text{powRatio\_tmp}[b]=\frac{pow[b]}{\text{avepow\_short}[b]} \qquad \text{Expression 9}$$

powRatio_tmp[b]: a power change ratio of a sub-block b
pow[b]: a power of an audio signal included in a sub-block b
avepow_short[b]: an average of previous powers of sub-block b FIG. 21 is a flowchart illustrating an attack specifying process performed by the attack examining unit 324*b* according to the second modification. When receiving an attack candidate detecting result attack_band, the attack examining unit 324*b* performs the attack specifying process.

The attack examining unit 324*b* determines whether the attack candidate detecting result attack_band supplied from the attack candidate determining unit 324*a* is one of −1 and 0 in operation OP91. When the attack candidate detecting result attack_band is −1, an attack candidate sub-block has not been detected. When the attack candidate detecting result attack_band is 0, a sub-block B0 is an attack candidate. When an attack candidate sub-block has not been detected, or when the sub-block B0 is the attack candidate, the attack specifying process is not required to be performed by the attack examining unit 324*b*. Therefore, when the determination is affirmative in operation OP91, the attack examining unit 324*b* sets the attack specifying result attack_band to −1 in operation OP97, and the attack specifying process is terminated. When the attack candidate detecting result attack_band is −1, the frame does not include a sub-block having a power of an audio signal to be corrected.

When the determination is negative in operation OP91, that is, when the attack candidate detecting result represents any one of the sub-blocks in the frame, the frame includes an attack candidate sub-block. In this case, it is highly possible that an attack starting point is included in the attack candidate sub-block or a sub-block immediately before the attack candidate sub-block. Therefore, the attack examining unit 324*b* performs an attack detecting process on the attack candidate sub-block and the sub-block immediately before the attack candidate sub-block. First, the attack examining unit 324*b* sets a variable b representing a position of a sub-block so as to represent the sub-block immediately before the attack candidate sub-block in operation OP92 so as to detect an attack in the sub-block immediately before the attack candidate sub-block. That is, the attack examining unit 324*b* sets the variable b to attack_band−1.

Next, the attack examining unit 324*b* obtains a power change ratio of the sub-block b using Expressions 8 and 9, for example. The attack examining unit 324*b* determines whether the power change ratio powRatio_tmp[b] of the sub-block b is larger than an attack starting point detecting threshold value 3 (thr3) in operation OP93. That is, the attack examining unit 324*b* determines whether the sub-block b includes an attack starting point.

When the determination is affirmative in operation OP93, the attack examining unit 324*b* determines that the sub-block b includes an attack starting point. After determining that the sub-block b includes an attack starting point, the attack examining unit 324*b* sets an attack specifying result attack_band to b in operation OP94. Thereafter, the attack examining unit 324*b* outputs the attack specifying result attack_band to a block power correcting unit 324*c*, and the attack specifying process is terminated.

When the determination is negative in operation OP93, the attack examining unit 324*b* adds 1 to the variable b in operation OP95 so as to perform the process of detecting an attack starting point on the next sub-block.

The attack examining unit 324*b* determines whether the variable b to which 1 has been added in operation OP95 is smaller than a value attack_band+1 representing a position of the sub-block immediately after the attack candidate sub-block in operation OP96. This is because, in the second modification, the attack examining unit 324*b* performs the process of detecting an attack starting point only on the attack candidate sub-block and the sub-block immediately before the attack candidate sub-block.

When the determination is affirmative in operation OP96, the attack examining unit 324*b* performs the processes in operation OP93 to operation OP96 again on the next sub-block.

When the determination is negative in operation OP96, the attack candidate sub-block and the sub-block immediately before the attack candidate sub-block have been subjected to the process of detecting an attack starting point and an attack starting point has not been detected. Next, the attack examining unit 324*b* records an attack specifying result attack_band of −1 in operation OP97 since an attack starting point has not been detected in the attack candidate sub-block and the sub-block immediately before the attack candidate sub-block. The attack examining unit 324*b* outputs the attack specifying result attack_band of −1 to the block power correcting unit 324*c*, and the attack specifying process is terminated.

As described above, since the attack examining unit 324*b* performs a process on a sub-block-by-sub-block basis instead of on a sample-by-sample basis when detecting an attack starting point, the number of processes can be reduced.

In the attack specifying process shown in FIG. 21, the attack examining unit 324*b* first performs a process of detecting an attack starting point starting from the sub-block immediately before the attack candidate sub-block. When an attack starting point is not detected in the sub-block immediately before the attack candidate sub-block, the attack examining unit 324*b* performs the process of detecting an attack starting point on the attack candidate sub-block. However, the attack examining unit 324*b* may perform the process of detecting an attack starting point starting from the attack candidate sub-block instead of the sub-block immediately before the attack candidate sub-block.

The grouping determining unit 327 according to an embodiment may perform a process described below.

In a third modification, a grouping determining unit 327 determines a sub-block having a power change ratio which first exceeds a grouping determining threshold value 4 as a grouping boundary even when a plurality of sub-blocks have power change ratios lager than the grouping determining threshold value 4. That is, when a sub-block b corresponding to a grouping determining result of group[1] is detected in a frame, the grouping determining unit 327 determines a boundary between the sub-block b and a sub-block b−1 immediately before the sub-block b as a grouping boundary. The grouping determining unit 327 does not compare each of power change ratios of the other sub-blocks following the sub-block b with the threshold value 4.

Figure 22:
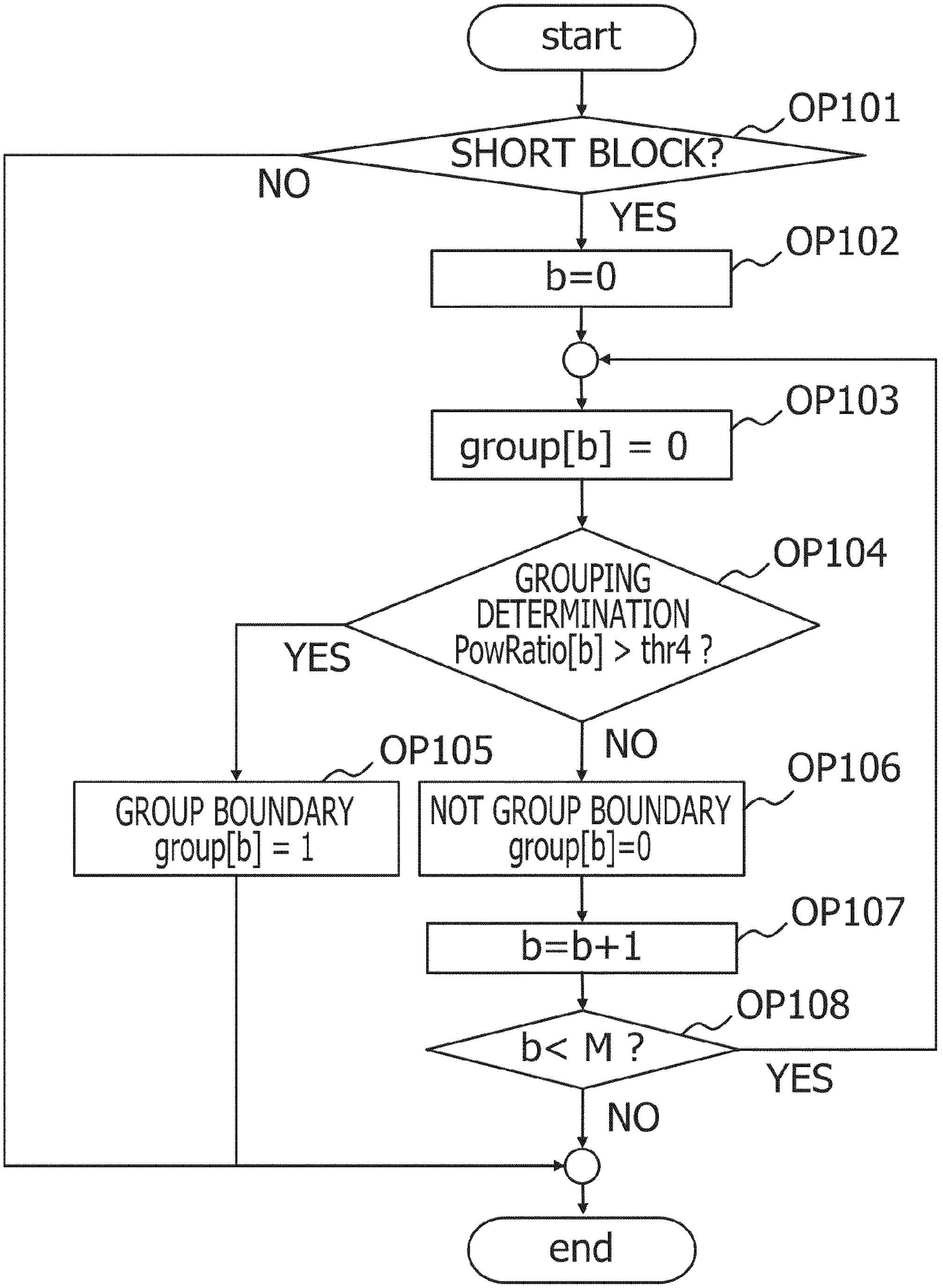
FIG. 22 is a flowchart illustrating a grouping determining process.

FIG. 22 is a flowchart illustrating a grouping determining process performed by the grouping determining unit 327 according to the third modification. When obtaining attack detecting results attack[b] of sub-blocks supplied from a attack determining unit 326 and power change ratios of the sub-blocks supplied from a power change ratio calculating unit 325, the grouping determining unit 327 starts the grouping determining process.

The grouping determining unit 327 determines whether a grouping is to be performed in a unit of a short block or a unit of a long block in operation OP101. Here, the grouping determining unit 327 determines whether an attack is detected in the frame, that is, whether at least one of the sub-blocks corresponds to an attack detecting result attack[b] of 1. When at least one of the sub-blocks corresponds to an attack detecting result attack[b] of 1, that is, the determination is affirmative in operation OP101, the grouping is performed in a unit of a short block.

When any of the sub-blocks does not correspond to an attack detecting result attack[b] of 1, that is, the determination is negative in operation OP101, the grouping is performed in a unit of a long block, that is, the grouping is not performed. Therefore, the grouping determining unit 327 terminates the grouping determining process.

The grouping determining unit 327 sets a variable b representing a position of a sub-block to 0 as an initial value in operation OP102. Subsequently, the grouping determining unit 327 sets a grouping determining result group[b] of the sub-block b to 0 as an initial value in operation OP103.

The grouping determining unit 327 determines whether a power change ratio PowRatio[b] of the sub-block b is larger than the grouping determining threshold value 4 (thr4) in operation OP104. When the determination is affirmative in operation OP104, the grouping determining unit 327 determines that the sub-block b corresponds to a grouping boundary in operation OP105. The grouping determining unit 327 sets the grouping determining result group[b] of the sub-block b to 1 in operation OP105. At this time, a boundary between the sub-block b and the sub-block b−1 immediately before the sub-block b is determined as a grouping boundary. Even when an attack is included in any of the other sub-blocks following the sub-block b, the grouping determining unit 327 does not process the sub-blocks following the sub-block b, and assigns grouping determining results group[b] of 0 to the sub-blocks following the sub-block b. That is, even when an attack is included in any of the sub-blocks following the sub-block b, they are included in a group including the sub-block b. The grouping determining unit 327 outputs the grouping determining results group[b] of the sub-blocks to the grouping unit 35, and the grouping determining process is terminated.

When the determination is negative in operation OP104, the grouping determining unit 327 determines that the sub-block b does not correspond to a grouping boundary in operation OP106. The grouping determining unit 327 sets the grouping determining result group[b] of the sub-block b to 0 in operation OP106. Thereafter, the process proceeds to operation OP107.

The grouping determining unit 327 adds 1 to the variable b representing a position of a sub-block in operation OP107. Then, the grouping determining unit 327 determines whether the variable b is smaller than the number of sub-blocks M included in the frame in operation OP108. That is, the grouping determining unit 327 determines whether the grouping determining results of all the sub-blocks included in the frame have been obtained.

When the determination is affirmative in operation OP108, a grouping determining result of at least one of the sub-blocks has not been obtained. Therefore, the grouping determining unit 327 performs the processes in operation OP103 to operation OP108 again.

When the determination is negative in operation OP108, the grouping determining results of all the sub-blocks included in the frame have been obtained. In this case, the grouping determining results group[b] of all the sub-blocks are 0. The grouping determining unit 327 outputs the grouping determining results group[b] of the sub-blocks to the grouping unit 35, and the grouping determining process is terminated.

Figure 23:
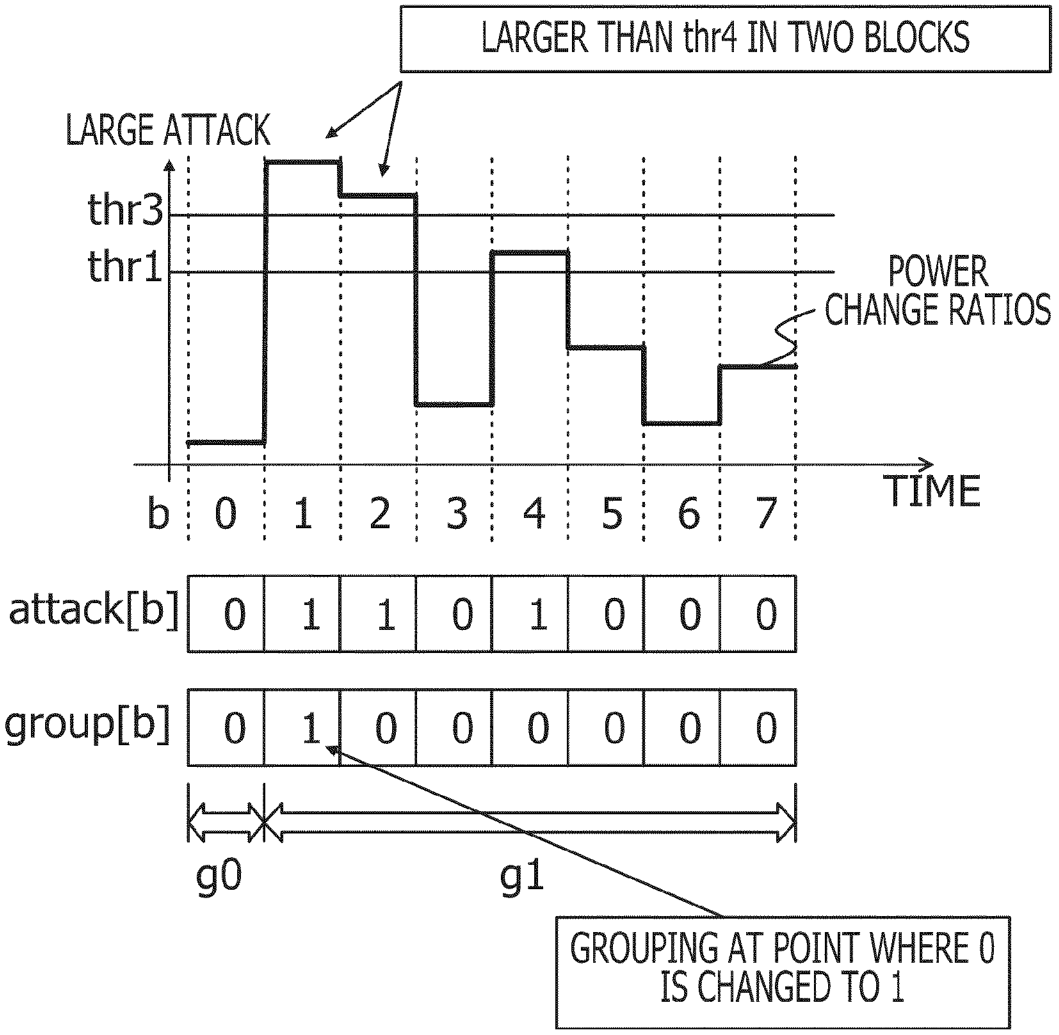
FIG. 23 is a diagram illustrating an example of a result of a grouping determining process.

FIG. 23 is a diagram illustrating an example of a result of the grouping determining process according to the third modification. In the example shown in FIG. 23, one frame is divided into eight sub-blocks B0 to B7 (short blocks w0 to w7). In the example shown in FIG. 23, the sub-blocks B1, B2, and B4 have power change ratios larger than an attack detecting threshold value 1. Among the sub-blocks B1, B2, and B4, the sub-blocks B1 and B2 have the power change ratios larger than the grouping determining threshold value 4.

When the grouping determining process shown in FIG. 22 is executed, a grouping determining result group[B1] of the sub-block B1 which has the power change ratio larger than the threshold value 4 and which is detected first in the frame as a sub-block having a power change ratio larger than the threshold value 4 is 1. The grouping determining results of the other sub-blocks B2 to B7 are 0. Especially, although the sub-block B2 has the power change ratio larger than the grouping determining threshold value 4, the grouping determining result group[b] of the sub-block B2 is 0.

Accordingly, in the example shown in FIG. 23, the grouping unit 35 performs a grouping such that the sub-block B0 is included in a group g0 and the sub-blocks B1 to B7 are included in a group g1.

In the above described embodiment, the audio encoding apparatus 1 is described assuming that a block length and a time length of a sub-block are the same as those of a short block. In an embodiment, an audio encoding apparatus which performs processes using a block length and a time length of a sub-block which are smaller than those of a short block. The block length of a sub-block is equal to one of a predetermined number of portions obtained by equally dividing the block length of the short block, and the time length of a sub-block is equal to one of a predetermined number of portions obtained by equally dividing the time length of the short block.

The audio encoding apparatus according to an embodiment is the same as the audio encoding apparatus 1 according to an embodiment except for a process performed by the grouping determining unit 327. Therefore, in an embodiment, only a grouping determining unit will be described. Other processing units are the same as those of the above described embodiment, and therefore, descriptions thereof are omitted.

Figure 24:
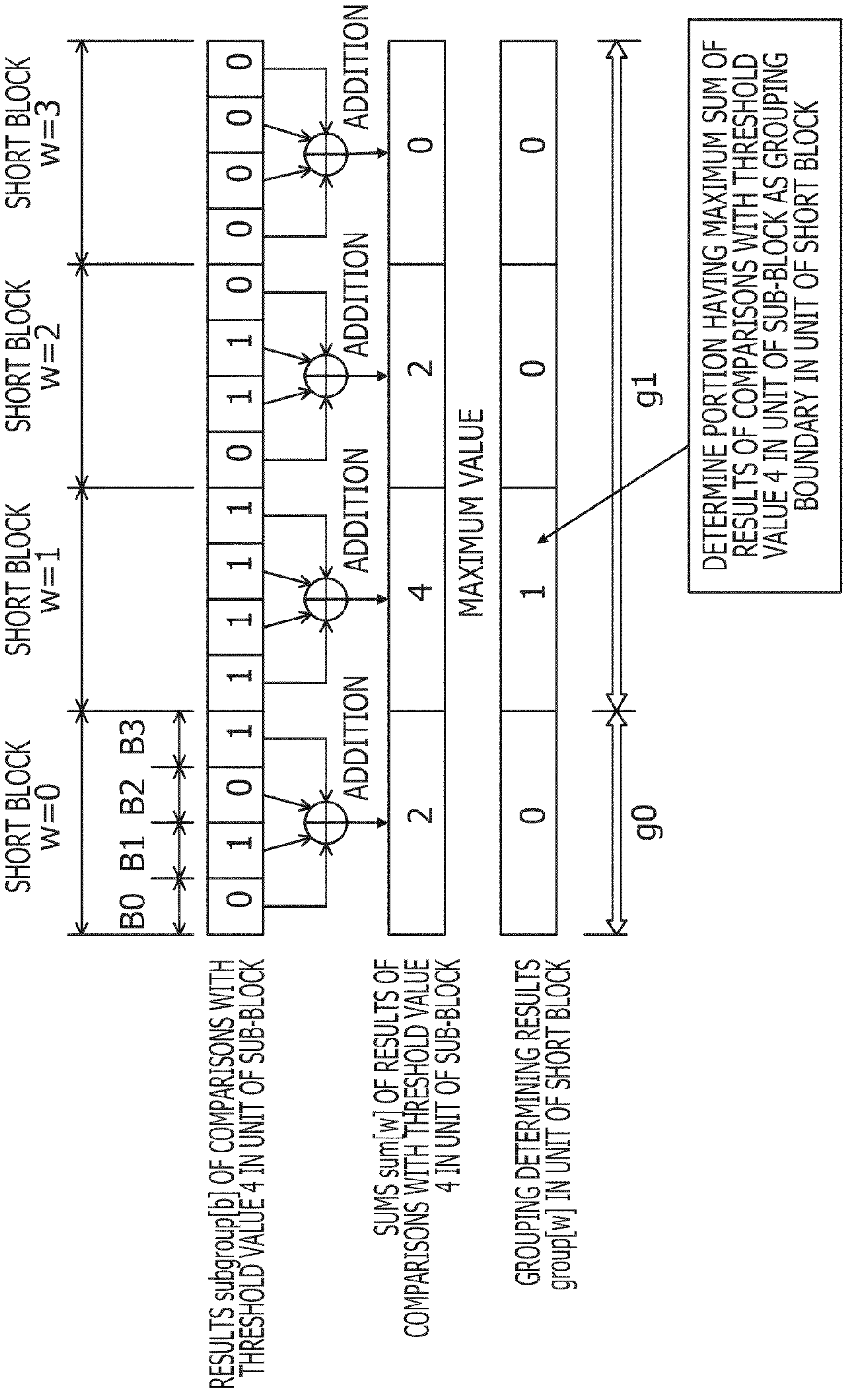
FIG. 24 is a diagram illustrating an example of a grouping determining process.

FIG. 24 is a diagram illustrating an example of a grouping determining process performed by a grouping determining unit 327 according to an embodiment. A frame includes eight short blocks w0 to w7. Among the short blocks w0 to w7, the short blocks w0 to w3 are extracted and shown in FIG. 24. Furthermore, in FIG. 24, a sub-block has a time length corresponding to one of portions obtained by dividing a short block into four. That is, one short block includes four sub-blocks.

The grouping determining unit 327 obtains power change ratios of the sub-blocks included in the frame supplied from the power change ratio calculating unit 325 and attack detecting results attack[b] of the sub-blocks supplied from the attack determining unit 326 as inputs. Note that the power change ratios of the sub-blocks include power change ratios calculated in accordance with corrected powers.

The grouping determining unit 327 compares each of the power change ratios of the sub-blocks with a grouping determining threshold value 4. When the power change ratio of a sub-block of interest is larger than the threshold value 4, the grouping determining unit 327 sets a result subgroup[b] of the comparison of the power change ratio of the sub-block of interest with the threshold value 4 to 1. When the power change ratio of the sub-block of interest is equal to or smaller than the threshold value 4, the grouping determining unit 327 sets the result subgroup[b] of the comparison of the power change ratio of the sub-block of interest with the threshold value 4 to 0. In the example shown in FIG. 24, results subgroup[b] of comparisons of the power change ratios of the sub-blocks with the threshold value 4 are shown.

The grouping determining unit 327 first obtains a sum sum[w] of the results subgroup[b] of the comparisons of the power change ratios of the sub-blocks with the threshold value 4. In the example shown in FIG. 24, such sums sum[w] of the short blocks are shown below results subgroup[b] of comparisons of power change ratios of sub-blocks included in the short blocks with the threshold value.

In the example shown in FIG. 24, the short block w0 includes sub-blocks B0 to B3. Results subgroup[b] of comparisons of power change ratios of the sub-blocks B0 and B2 with the threshold value 4 are 0. Results subgroup[b] of comparisons of power change ratios of the sub-blocks B1 and B3 with the threshold value 4 are 1. Accordingly, a sum sum[w0] of the results of the comparisons of the power change ratios of the sub-blocks included in the short block w0 with the threshold value 4 is 2 (0+1+0+1). The same process is performed on the short blocks w1 to w7. In the example shown in FIG. 24, the sums sum[w] of the short blocks are shown below the results subgroup[b] of the comparisons of the power change ratios of the sub-blocks included in the short blocks with the threshold value 4.

Next, the grouping determining unit 327 extracts one of the short blocks which corresponds to the largest sum sum[w]. In the example shown in FIG. 24, since a sum sum[w1] of the short block w1 is 4, which is the largest sum, the short block w1 is extracted. The grouping determining unit 327 sets a grouping determining result group[w] of the short block which corresponds to the largest sum sum[w] and which has been extracted to 1, and sets grouping determining results group[w] of the other short blocks which have not been extracted to 0. In the example shown in FIG. 24, a grouping determining result group[w1] of the short block w1 is set to 1, and grouping determining results [w0], [w2], and [w3] of the short blocks w0, w2, and w3 are set to 0. In the example shown in FIG. 24, the grouping determining results group[w] of the short blocks are shown below the sums sum[w] corresponding to the short blocks.

The grouping determining unit 327 outputs the grouping determining results group[w] of the short blocks to a grouping unit 35. The grouping unit 35 selects a boundary between one of the short blocks corresponding to a grouping determining result group[w] of 0 and one of the short blocks corresponding to a grouping determining result group[w] of 1 which are consecutively arranged in this order as a grouping boundary.

Accordingly, in the example shown in FIG. 24, a boundary between the short blocks w0 and w1 is determined as a grouping boundary. The grouping determining unit 327 performs a grouping such that a group g0 includes the short block w0 and a group g1 includes the short blocks w1 to w7 (only the short blocks w1 to w3 are shown in FIG. 24).

Figure 25:
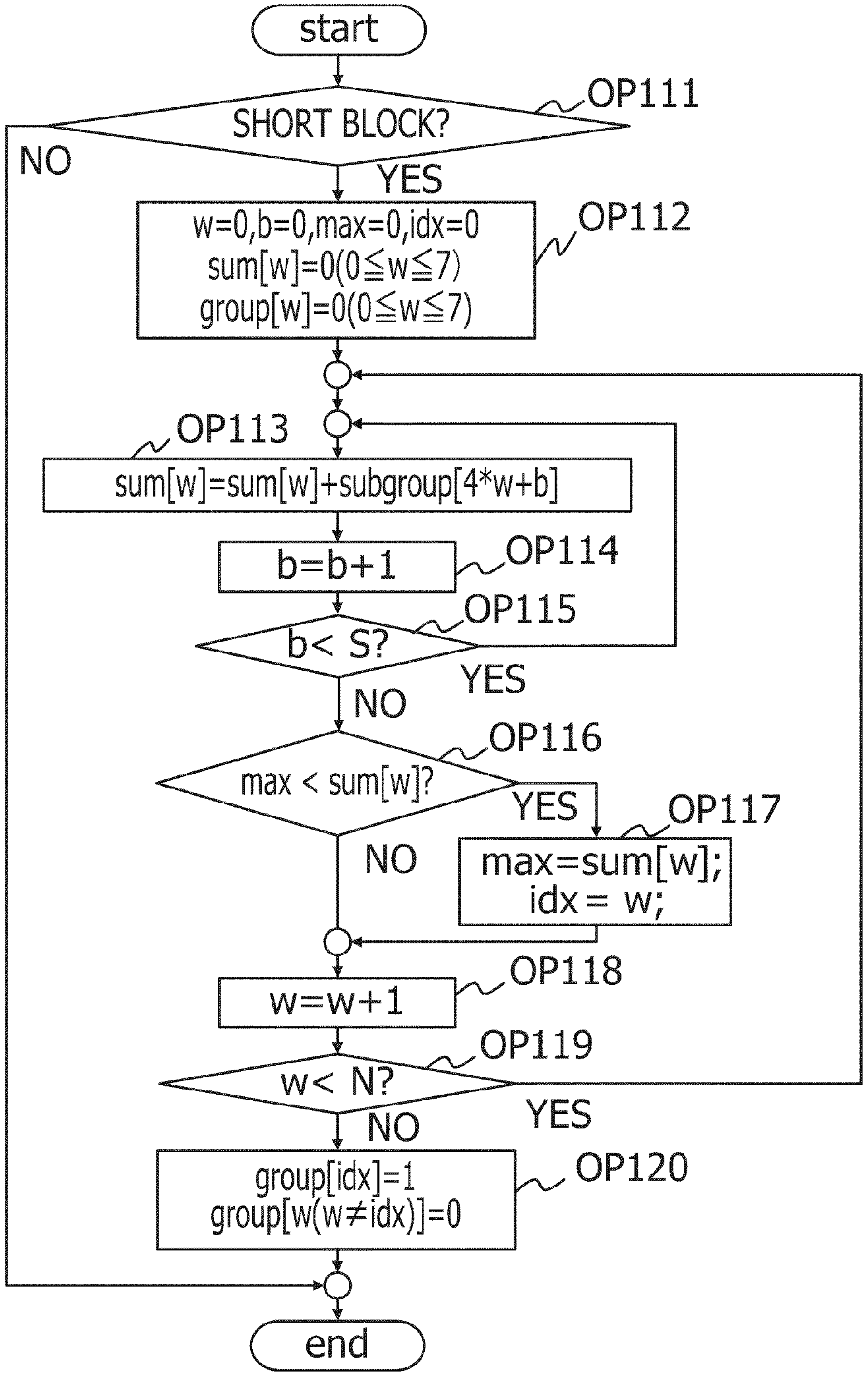
FIG. 25 is a flowchart illustrating another example of grouping determining process.

FIG. 25 is a flowchart illustrating the grouping determining process performed by the grouping determining unit 327. When receiving attack detecting results attack[b] of sub-blocks included in a frame and power change ratios of the sub-blocks, the grouping determining unit 327 starts the grouping determining process.

The grouping determining unit 327 determines whether a grouping is to be performed in a unit of a short block or a unit of a long block in operation OP111. That is, the grouping determining unit 327 determines whether an attack is included in the frame, or whether at least one of the sub-blocks corresponds to an attack detecting result attack[b] of 1. When at least one of the sub-blocks corresponds to an attack detecting result attack[b] of 1, that is, the determination is affirmative in operation OP111, the grouping is performed in a unit of a short block.

When the determination is negative in operation OP111, the grouping is performed in a unit of a long block, that is, the grouping is not performed. Therefore, the grouping determining process is terminated.

The grouping determining unit 327 sets initial values of variables in operation OP112. Examples of the variables include a variable w representing a position of a short block and a variable b representing a position of a sub-block. Examples of the variables further include a sum sum[w] representing a sum of results subgroup[b] of comparisons of power change ratios of sub-blocks included in a short block with the threshold value 4, a variable max representing a maximum value of the sum sum[w], and a variable idx representing a short block having the maximum sum sum[w]. Moreover, examples of the variables include a grouping determining result group[w] of a short block. These variables are set to 0 as initial values. Note that in a case where the frame include eight short blocks and each of the short blocks includes four sub-blocks, the variable w is equal to or larger than 0 and equal to or smaller than 7 and the variable b is equal to or larger than 0 and equal to or smaller than 31.

Next, the grouping determining unit 327 obtains a sum sum[w] representing a sum of results subgroup[b] of comparisons of power change ratios of sub-blocks included in a short block w with the threshold value 4 in operation OP113 to OP115.

First, the grouping determining unit 327 performs a calculation in accordance with Expression 10 below in operation OP113. That is, the grouping determining unit 327 adds a result subgroup[4×w+b] of a result of a comparison of a power change ratio of a sub-block 4×w+b with the threshold value 4 to a sum sum[w] of results of comparisons of power change ratios of sub-blocks with the threshold value 4.

$$sum[w]=sum[w]+sub\ group[4\times w+b] \qquad \text{Expression 10}$$

Next, the grouping determining unit 327 adds 1 to the variable b representing a position of a sub-block in operation OP114. The grouping determining unit 327 determines whether the variable b is smaller than the number of sub-blocks S included in each of the short blocks in operation OP115. That is, the grouping determining unit 327 determines whether results of comparisons of the power change ratios of all the sub-blocks included in the short block w which has been processed with the threshold value 4 have been added to one another. When one short block includes four sub-blocks, a variable S is 4. Accordingly, the grouping determining unit 327 determines whether the variable b is smaller than 4.

When the determination is affirmative in operation OP115, the short block w has a result subgroup[b] of a comparison of a power change ratio of a sub-block with the threshold value 4 which has not been added. The grouping determining unit 327 performs the processes in operation OP113 to operation OP115 again and a sum sum[w] is obtained.

When the determination is negative in operation OP115, all results subgroup[b] of comparisons of the power change ratios of all the sub-blocks included in the short block w with the threshold value 4 have been added to one another. That is, the sum sum[w] of all the results subgroup[b] of comparisons of the power change ratios of the sub-blocks included in the short block w with the threshold value 4 has been obtained.

Next, the grouping determining unit 327 determines whether the sum sum[w] of the results subgroup[b] of comparisons of the power change ratios of the sub-blocks included in the short block w with the threshold value 4 is larger than the maximum value max in operation OP116. When the determination is negative in operation OP116, the process proceeds to operation OP118.

When the determination is affirmative in operation OP116, the grouping determining unit 327 updates the maximum value max to a value of the sum sum[w] and the variable idx to a value of the variable w representing a position of a sub-block obtained when the sum sum[w] corresponds to the maximum value max in operation OP117.

The grouping determining unit 327 adds 1 to the variable w representing a position of a short block in operation OP118. Then, the grouping determining unit 327 determines whether the variable w is smaller than the number of short blocks N included in the frame in operation OP119. Specifically, the grouping determining unit 327 determines whether a process of adding results of comparisons of power change ratios of sub-blocks with the threshold value 4 to one another has been performed on all short blocks included in the frame. Since eight short blocks are included in the frame, i.e., N is equal to 8, the grouping determining unit 327 determines whether the variable w is smaller than 8.

When the determination is affirmative in operation OP119, at least one of the short blocks has not been subjected to the process of adding results of comparisons of power change ratios of sub-blocks with the threshold value 4 to one another. The grouping determining unit 327 performs the processes in operation OP113 to operation OP119 again and obtains a sum sum[w] of the results of the comparisons of the power change ratios of sub-blocks with the threshold value 4.

When the determination is negative in operation OP119, the process of obtaining the sum sum[w] of the results of the comparisons of the power change ratios of sub-blocks with the threshold value 4 has been terminated. The grouping determining unit 327 sets a grouping determining result group[idx] of a short block idx corresponding to the maximum sum sum[w] of the results of the comparisons of the power change ratios of sub-blocks with the threshold value 4 to 1 in operation OP120. Furthermore, the grouping determining unit 327 sets grouping determining results group[w] of short blocks w other than the short block idx to 0 (w is not equal to idx) in operation OP120. The grouping determining unit 327 outputs the grouping determining results group[w] of the short blocks to the grouping unit 35, and the grouping determining process is terminated.

The grouping unit 35 receives the grouping determining results group[w] of the short blocks from the grouping determining unit 327. The grouping unit 35 performs a grouping using a boundary between a sub-block corresponding to a grouping determining result group[w] of 0 and a sub-block corresponding to a grouping determining result group[w] of 1 which are consecutive sub-blocks arranged in this order, as a grouping boundary. Then, as with an embodiment, audio signals which have been subjected to the grouping are quantized by a quantizing unit 36, encoded by a bit-stream generating unit 37, and converted into a bit stream.

As described above, in the case where a sub-block has a time length corresponding to a time length obtained by equally dividing a short block into a predetermined number of blocks, the grouping determining unit 327 adds results of comparisons of power change ratios of sub-blocks with the threshold value 4 to one another and determines a boundary included in a short block corresponding to a maximum value of a sum sum[w] as a grouping boundary. By this, the audio encoding apparatus can set sub-blocks so as to have time length smaller than a short block and encode audio signals.

Furthermore, since the grouping determining unit 327 determines only a boundary included in a short block corresponding to a maximum sum sum[w] of results of comparisons of power change ratios of sub-blocks with the threshold value 4 as a grouping boundary, the number of groups can be reduced, and accordingly, efficient encoding can be performed.

A grouping determining unit 327 obtains a sum[w] by performing a process described below instead of by adding results subgroup[b] of comparisons of power change ratios of sub-blocks included in a short block with a threshold value 4.

Figure 26:
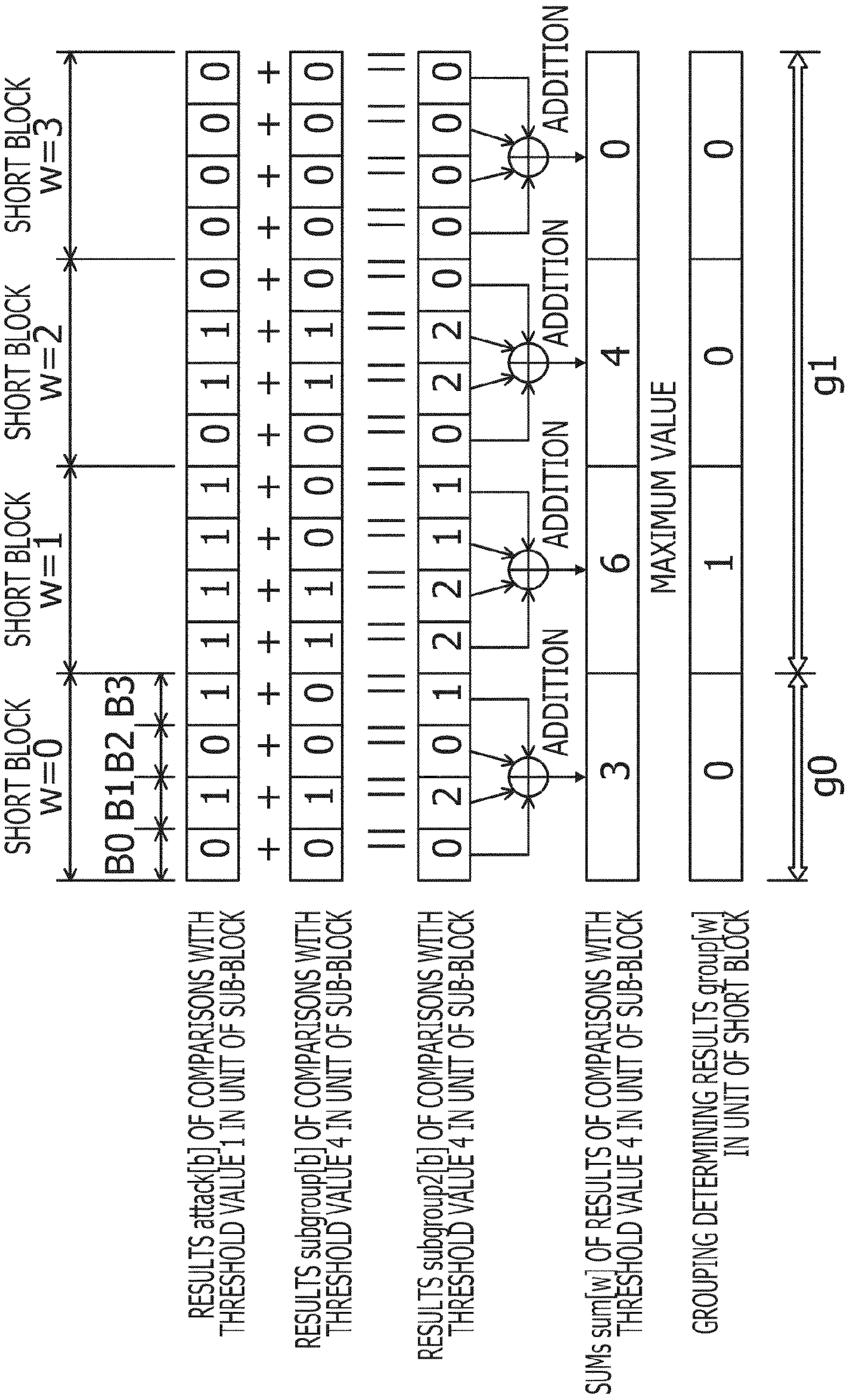
FIG. 26 is a diagram illustrating another grouping determining process.

FIG. 26 is a diagram illustrating a grouping determining process performed by the grouping determining unit 327. In an example shown in FIG. 26, as with FIG. 24, one frame includes eight short blocks w0 to w7, and among the eight short blocks w0 to w7, only the short blocks w0 to w3 are extracted and shown. Furthermore, in the example shown in FIG. 26, each of the short blocks includes four sub-blocks, that is, the frame includes 32 sub-blocks.

In the example shown in FIG. 26, attack detecting results attack[b] of the sub-blocks and results subgroup[b] of comparisons of power change ratios of the sub-blocks with the threshold value 4 are shown.

The grouping determining unit 327 adds the attack detecting results attack[b] of the sub-blocks to the corresponding results subgroup[b] of the comparisons of the power change ratios of the sub-blocks with the threshold value 4 so as to obtain addition values subgroup2[b]. As for a sub-block B1 included in the example shown in FIG. 26, since an attack detecting result [B1] is 1 and a result subgroup[B1] of a comparison of a power change ratio of the sub-block B1 with the threshold value 4 is 1, an adding value subgroup2[B1] is 2 (1+1=2). In the example shown in FIG. 26, adding values of the sub-blocks are shown below the results subgroup[b] of the comparisons of the power change ratios of the sub-blocks with the threshold value 4.

The grouping determining unit 327 obtains a sum[w] of the adding values subgroup2[b] of the sub-blocks included in each of the short blocks. The short block w0 included in the example shown in FIG. 26 has sub-blocks B0 to B3. Adding values subgroup2[B0] and subgroup2[B2] of the sub-blocks B0 and B2 are both 0. An adding value subgroup2[B1] is 2. An adding value subgroup2[B3] is 1. Accordingly, in the example shown in FIG. 26, a sum sum[w0] of the adding values subgroup2[b] of the sub-blocks included in the short block w0 is 3 (sum[w0]=0+2+0+1=3). In the example shown in FIG. 26, sums sum[w] of adding values subgroup2[b] of sub-blocks included the short blocks are shown below the adding values subgroup2[b] of the sub-blocks included in the short blocks for individual short blocks.

Next, the grouping determining unit 327 extracts one of the short blocks corresponding to the maximum sum sum[w]. In the example shown in FIG. 26, the short block w1 has the maximum sum sum[1] of 6, and accordingly, the short block w1 is extracted. The grouping determining unit 327 determines a grouping determining result group[w] of a short block having the extracted maximum sum sum[w] as 1 and grouping determining results group[w] of the other short blocks as 0. In the example shown in FIG. 26, a grouping determining result group[w1] of the short block w1 is determined to 1 and grouping determining results group[w] of the short blocks w0, w2, and w3 are determined to 0. In the example shown in FIG. 26, the grouping determining results group[w] are shown below the sums sum[w] obtained for individual blocks.

The grouping determining unit 327 outputs the grouping determining results group[w] of the short blocks to a grouping unit 35. The grouping unit 35 selects a boundary between a short block corresponding to a group determining result group[w] of 0 and a short block corresponding to a group determining result group[w] of 1 which are consecutively arranged in this order as a grouping boundary.

Accordingly, in the example shown in FIG. 26, a boundary between the short blocks w0 and w1 is determined to be a grouping boundary. A group g0 includes the short block w0 and a group g1 includes the short blocks w1 to to w7 (only the short blocks w1 to w3 are shown in FIG. 26).

Figure 27:
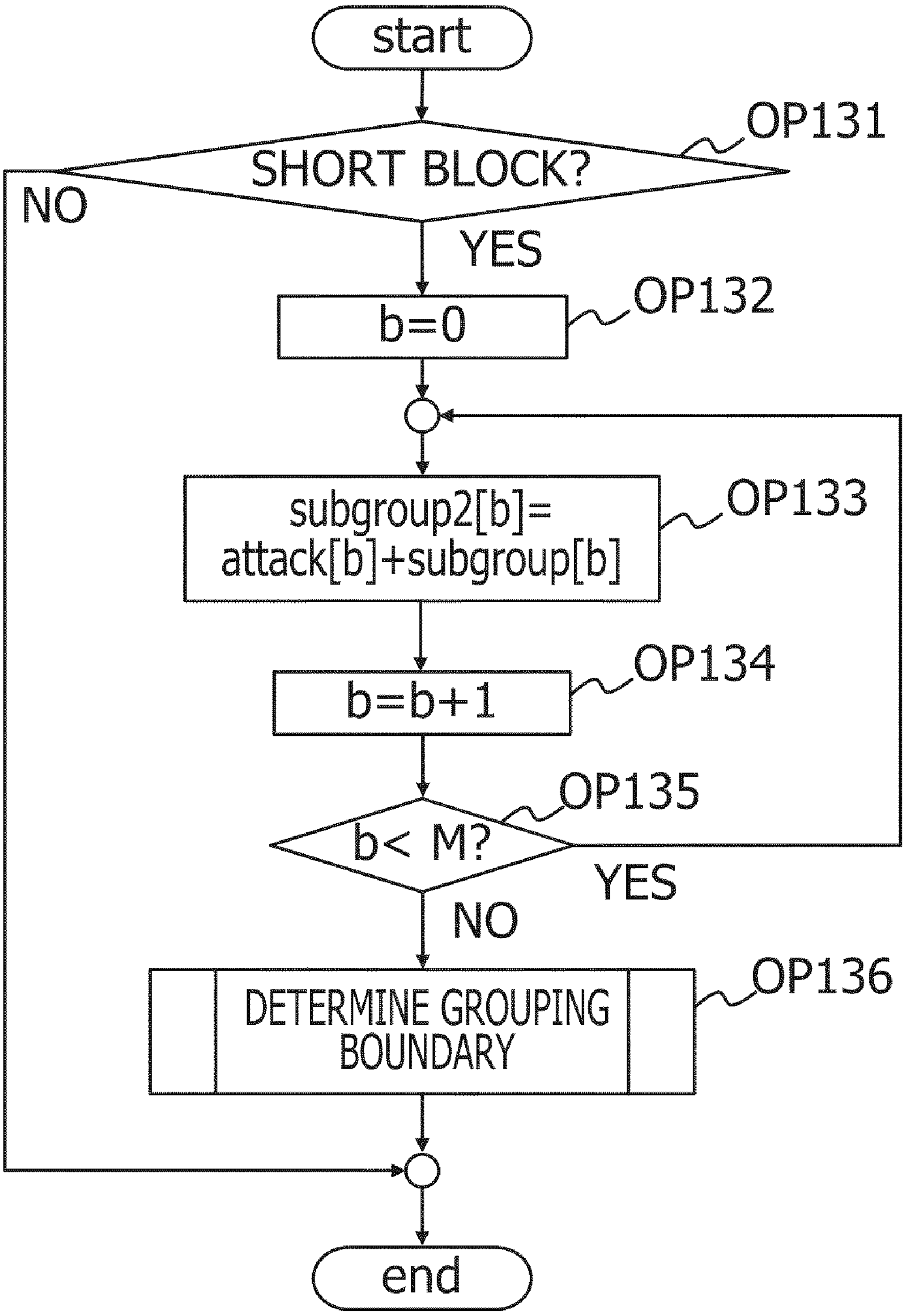
FIG. 27 is a flowchart illustrating a grouping determining process.

FIG. 27 is a flowchart illustrating the grouping determining process shown in FIG. 26 performed by the grouping determining unit 327. When receiving the attack detecting results attack[b] of the sub-blocks included in the frame and the power change ratios of the sub-blocks, the grouping determining unit 327 starts the grouping determining process.

The grouping determining unit 327 determines whether a grouping is to be performed in a unit of a short block or a unit of a long block in operation OP131. That is, the grouping determining unit 327 determines whether an attack is detected in the frame, or whether at least one of the sub-blocks corresponds to an attack detecting result attack[b] of 1. When at least one of the sub-blocks corresponds to an attack detecting result attack[b] of 1, that is, the determination is affirmative in operation OP131, the grouping is performed in a unit of a short block.

When any one of the sub-block corresponds to an attack detecting result attack[b] of 1, that is, the determination is negative in operation OP131, the grouping is performed in a unit of a long block, that is, the grouping is not performed. Therefore, the grouping determining process is terminated.

When the determination is affirmative in operation OP131, the grouping determining unit 327 sets a variable b to 0 as an initial value in operation OP132.

Then, the grouping determining unit 327 obtains an adding value subgroup2[b] of an attack detecting result attack[b] and a result subgroup[b] of a comparison of a power change ratio with the threshold value 4 for each sub-block in operation OP133.

The grouping determining unit 327 adds 1 to the variable b in operation OP134. Then, the grouping determining unit 327 determines whether the variable b is smaller than the number of sub-blocks M included in the frame in operation OP135. That is, the grouping determining unit 327 determines whether adding values subgroup2[b] of all the sub-blocks included in the frame have been obtained. In a case where one frame has eight short blocks and each of the short blocks has four sub-blocks, the frame has 32 sub-blocks, that is, the number of sub-blocks M is 32. The grouping determining unit 327 determines whether the variable b is smaller than 32.

When the determination is affirmative in operation OP135, an adding value subgroup2[b] of at least one of the sub-blocks included in the frame has not been obtained. The grouping determining unit 327 repeatedly performs the processes in operation OP133 to operation OP135 until the adding values subgroup2[b] of all the sub-blocks included in the frame are obtained.

When the determination is negative in operation OP135, the adding values subgroup2[b] of all the sub-blocks included in the frame have been obtained. The grouping determining unit 327 proceeds to operation OP136.

In operation OP136, the processes operation OP112 to operation OP120 described in FIG. 25 are performed. However, the results subgroup[b] of the comparisons of the power change ratios of the sub-blocks included in the short block w with the threshold value 4 are replaced by the adding values subgroup2[b].

The grouping determining unit 327 outputs the grouping determining results group[w] of the short blocks to the grouping unit 35. The grouping unit 35 performs a grouping such that a boundary between a sub-block corresponding to a grouping determining result group[w] of 0 and a sub-block corresponding to a grouping determining result group[w] of 1 which are consecutively arranged in this order is determined as a grouping boundary. Thereafter, audio signals are quantized by a quantizing unit 36, encoded by a bit-stream generating unit 37, and converted into a bit stream.

Figure 28:
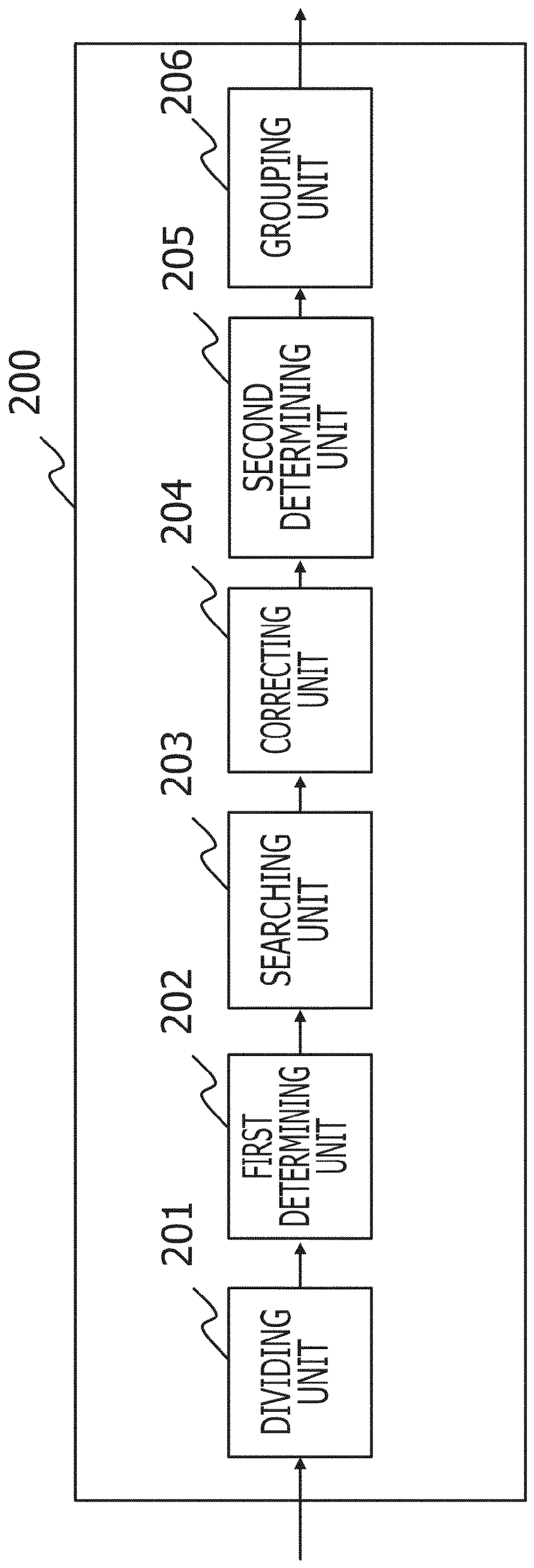
FIG. 28 is a diagram illustrating a configuration of an information processing apparatus.

FIG. 28 is a diagram illustrating a configuration of an information processing apparatus 200 according to an embodiment. The information processing apparatus 200 includes a dividing unit 201, a first determining unit 202, a searching unit 203, a correcting unit 204, a second determining unit 205, and a grouping unit 206.

The dividing unit 201 divides an audio signal included in a unit time into audio signals corresponding to a predetermined number of time periods. The dividing unit 201 outputs the audio signals included in the unit time which has been divided into a predetermined number of time periods to the first determining unit 202.

The first determining unit 202 obtains the audio signals included in the unit time which has been divided into a predetermined number of time periods as inputs. The first determining unit 202 determines, among the time periods, at least one time period having a power change ratio of an audio signal larger than a first threshold value as an attack candidate. The first determining unit 202 outputs the audio signals included in a predetermined number of time periods which are obtained by dividing the time unit and which include the time period having the attack candidate to the searching unit 203.

The searching unit 203 obtains the audio signals included in a predetermined number of time periods which are obtained by dividing the time unit and which include the time period having the attack candidate as inputs. The searching unit 203 searches a time period immediately before the time period including the attack candidate for an attack starting point. The searching unit 203 outputs the audio signal included in one of a number of time periods obtained by dividing the unit time which includes the attack starting point to the correcting unit 204.

The correcting unit 204 obtains the audio signals included in a predetermined number of time periods which are obtained by dividing the time unit and which include the time period having the attack starting point as inputs. The correcting unit 204 corrects a power of the audio signal included in the time period having the attack starting point using a power of an audio signal included in a time period immediately after the time period including the attack starting point. The correcting unit 204 outputs the audio signals included in a predetermined number of time periods which are obtained by dividing the time unit and which include the time period having the attack starting point to the second determining unit 205.

The second determining unit 205 receives the audio signals included in a predetermined number of time periods which are obtained by dividing the time unit and which include the time period which has the attack starting point and in which the power of the audio signal included therein has been corrected as inputs. The second determining unit 205 determines whether a power change ratio of the audio signal included in the time period which has the attack starting point and in which the power of the audio signal has been corrected is larger than a second threshold value which is used for an attack detection and which is larger than the first threshold value. The second determining unit 205 outputs a result of the determination to the grouping unit 206.

The grouping unit 206 performs a grouping such that the time periods obtained by dividing the unit time are divided into a plurality of groups serving as units of audio encoding when an attack is included in one of the audio signals included in the unit time. The grouping unit 206 obtains the result of the determination as to whether the power change ratio of the audio signal included in the time period which includes the attack starting point and in which the power of the audio signal has been corrected is larger than the second threshold value used for the attack detection which is larger than the first threshold value as an input. When the change ratio of the corrected power of the audio signal included in the time period having the attack starting point is larger than the second threshold value, the grouping unit 206 performs a grouping such that the unit time is divided into at least two groups using the time period including the attack starting point as a reference. The grouping unit 206 outputs audio included in the unit time which has been subjected to the grouping.

According to the foregoing embodiments, the information processing apparatus 200 determines a time period corresponding to an attack candidate and searches the time period corresponding to the attack candidate or a time period immediately before the time period corresponding to the attack candidate for an attack starting point. The information processing apparatus 200 corrects a power of an audio signal included in a time period including an attack using a power of an audio signal included in a time period immediately after the time period including the attack. The information processing apparatus 200 further determines whether a change ratio of the power which has been corrected and which corresponds to the audio signal included in the time period including the attack is larger than the second threshold used for attack detection. Even in a time period which includes an attack starting point and in which a power change ratio of an audio signal is smaller than the second threshold value for an attack detection, when a power of the audio signal has been corrected and when a change ratio of the corrected power is larger than the second threshold value, the time period is determined to include an attack. Accordingly, use of the information processing apparatus 200 improves accuracy of attack detection.

Furthermore, the information processing apparatus 200 performs a grouping such that a unit time is divided into at least two groups using a time period including an attack starting point as a reference when a power change ratio of the corrected audio signal included in the time period including the attack starting point is larger than the second threshold value. Therefore, when the accuracy of the attack detection is improved, an appropriate grouping is performed. When the appropriate grouping is performed, a generation of a pre-echo caused by a quantization error is suppressed. Accordingly, audio quality obtained when audio data which has been encoded is reproduced is improved.

Moreover, the correcting unit 204 included in the information processing apparatus 200 may perform a correction by adding the power of the audio signal included in the time period immediately after the time period including the attack starting point to the power of the audio signal included in the time period including the attack starting point. When the correcting unit 204 processes the power of the corrected audio signal included in the time period including the attack starting point, the power becomes similar to a power of an audio signal included in a time period including the entire attack and the attack starting point. Accordingly, it is highly possible that the power change ratio of the audio signal included in the time period including the attack becomes larger than the second threshold value for attack detection, and an accuracy of attack detection is improved.

Furthermore, the second determining unit 205 of the information processing apparatus 200 may determine whether each of power change ratios of audio signals included in all the time period included in the unit time is larger than the second threshold value. In this case, when two or more time periods are included in a block, the grouping unit 206 may perform a grouping such that the unit time is divided into two groups using a block having the maximum number of time periods corresponding to power change ratios larger than the second threshold value as a reference. By this, even when a time period has a time length smaller than a block, the grouping is appropriately performed.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention, the scope of which is defined in the claims and their equivalents.

What is claimed is:

1. An audio information processing apparatus, comprising:

a hardware processor configured to execute:

dividing an audio signal in a unit time into audio signals in a predetermined number of time periods;

determining, among the time periods, a time period having a power change ratio of an audio signal larger than a first threshold value as an attack candidate;

searching the time period of the attack candidate and a time period immediately before the time period of the attack candidate for an attack starting point;

correcting a power of an audio signal included in the time period including the attack starting point resulting from the search using a power of an audio signal included in a time period immediately after the time period including the attack starting point; and determining whether a power change ratio of the audio signal included in the time period which includes the attack starting point and in which the power of the audio signal is corrected is larger than a second threshold value for attack detection which is larger than the first threshold value.

2. The audio information processing apparatus according to claim 1, wherein the processor corrects the power of the audio signal included in the time period including the attach starting point by adding the power of the audio signal included in the time period immediately after the time period including the attack starting point to the power of the audio signal included in the time period including the attack starting point.

3. The audio information processing apparatus according to claim 1, wherein the processor corrects the power of the audio signal included in the time period including the attach starting point by calculating a sum of powers of audio signals included in a predetermined number of samples starting from a leading sample included in the time period immediately after the time period including the attack starting point, subtracting the sum from the power of the audio signal included in the time period immediately after the time period including the attack starting point, and adding the sum to the power of the audio signal included in the time period including the attack starting point.

4. The audio information processing apparatus according to claim 1, wherein the processor classifies a predetermined number of blocks obtained by dividing the unit time is classified into a plurality of groups serving as units of audio encoding when one of the audio signals included in the unit time includes an attack, the predetermined number of blocks being obtained by dividing the unit time, and the processor divides the unit time into at least two groups using the time period including the attack starting point as a reference when the power change ratio of the audio signal of the time period including the attack starting point which has been corrected is larger than the second threshold value.

5. The audio information processing apparatus according to claim 4, wherein the processor determines whether each of power change ratios of the audio signals included in the time periods included in the unit time is larger than the second threshold value, and the processor divides the unit time into two groups using a time period which is included in the unit time, which has a power change ratio larger than the second threshold value, and which comes first in terms of time as a reference when a plurality of time periods have power change ratios larger than the second threshold value.

6. The audio information processing apparatus according to claim 4, wherein the processor determines a boundary between a block including the time period serving as the reference and a block immediately before the block including the time period serving as the reference as a grouping boundary.

7. The audio information processing apparatus according to claim 4, wherein the processor determines whether each of the powers of the audio signals included in the time periods in the unit time are larger than the second threshold value, and the processor divides the unit time into two groups using a block corresponding to the maximum number of time periods having power change ratios larger than the second threshold value as a reference among the blocks included in the unit time, when two or more time periods are included in each of the blocks.

8. The audio information processing apparatus according to claim 7, wherein the processor determines a boundary between the reference block and a block immediately before the reference block as a grouping boundary.

9. The audio information processing apparatus according to claim 7, wherein the processor divides the unit time into at least two group using the block corresponding to the maximum number of time periods having the power change ratios larger than a third threshold value which is larger than the second threshold value as a reference.

10. An audio information processing method, comprising:

dividing, using a computer, an audio signal in a unit time into audio signals in a predetermined number of time periods;

determining, among the time periods, a time period having a power change ratio of an audio signal larger than a first threshold value as an attack candidate;

searching the time period of the attack candidate and a time period immediately before the time period of the attack candidate for an attack starting point;

correcting a power of the audio signal included in the time period including the attack starting point using a power of an audio signal included in a time period immediately after the time period including the attack starting point; and determining whether a power change ratio of the audio signal included in the time period which includes the attack starting point and in which the power of the audio signal is corrected is larger than a second threshold value for attack detection which is larger than the first threshold value.

11. The audio information processing method according to claim 10, comprising:

classifying a predetermined number of blocks into a plurality of groups serving as units of audio encoding when one of the audio signals included in the unit time includes an attack, the predetermined number of blocks being obtained by dividing the unit time, and wherein, in the classifying, the unit time is divided into at least two groups using the time period including the attack starting point as a reference when the power change ratio of the audio signal of the time period including the attack starting point which has been corrected is larger than the second threshold value.

12. A non-transitory computer readable recording medium which stores a program which causes a computer to execute an audio information process, the audio information process comprising:

dividing an audio signal in a unit time into audio signals in a predetermined number of time periods;

determining, among the time periods, a time period having a power change ratio of an audio signal larger than a first threshold value as an attack candidate;

searching the time period of the attack candidate and a time period immediately before the time period of the attack candidate for an attack starting point;

correcting a power of the audio signal included in the time period including the attack starting point using a power of an audio signal included in a time period immediately after the time period including the attack starting point; and determining whether a power change ratio of the audio signal included in the time period which includes the attack starting point and in which the power of the audio signal is corrected is larger than a second threshold value for attack detection which is larger than the first threshold value.

13. The non-transitory computer readable recording medium according to claim 12, the audio information process comprising:

classifying a predetermined number of blocks into a plurality of groups serving as units of audio encoding when one of the audio signals included in the unit time includes an attack, the predetermined number of blocks being obtained by dividing the unit time, and wherein, in the classifying, the unit time is divided into at least two groups using the time period including the attack starting point as a reference when the power change ratio of the audio signal of the time period including the attack starting point which has been corrected is larger than the second threshold value.

* * * * *

UNITED STATES PATENT AND TRADEMARK OFFICE

CERTIFICATE OF CORRECTION

PATENT NO. : 8,295,499 B2
APPLICATION NO. : 12/823616
DATED : October 23, 2012
INVENTOR(S) : Miyuki Shirakawa et al.

It is certified that error appears in the above-identified patent and that said Letters Patent is hereby corrected as shown below:

In the Claims

Column 43, Line 2, In Claim 4, delete "obtained by dividing the unit time is classified into" and insert --into--, therefor.

Signed and Sealed this
Twenty-eighth Day of May, 2013

Teresa Stanek Rea
*Acting Director of the United States Patent and Trademark Office*